United States Patent
Sheats

(10) Patent No.: US 8,387,238 B2
(45) Date of Patent: Mar. 5, 2013

(54) PROCESSES AND STRUCTURES FOR IC FABRICATION

(76) Inventor: Jayna Sheats, Palo Alto, CA (US)

( * ) Notice: Subject to any disclaimer, the term of this patent is extended or adjusted under 35 U.S.C. 154(b) by 59 days.

(21) Appl. No.: 12/484,230

(22) Filed: Jun. 14, 2009

(65) Prior Publication Data

US 2010/0314719 A1 Dec. 16, 2010

(51) Int. Cl.
*H01R 43/00* (2006.01)
*H01L 21/44* (2006.01)

(52) U.S. Cl. .......................................... 29/825; 438/617

(58) Field of Classification Search .................. 438/617, 438/107, 607; 29/825, 831, 832
See application file for complete search history.

(56) References Cited

U.S. PATENT DOCUMENTS

| 5,731,244 A * | 3/1998 | Evers .............................. 438/617 |
| 6,946,178 B2 | 9/2005 | Sheats et al. |
| 7,141,348 B2 | 11/2006 | Sheats et al. |
| 2003/0156402 A1 * | 8/2003 | Ding et al. .................... 361/820 |

* cited by examiner

*Primary Examiner* — Jenny L Wagner
(74) *Attorney, Agent, or Firm* — Tue Nguyen

(57) ABSTRACT

The present invention discloses methods and apparatuses for the separations of IC fabrication and assembling of separated IC components to form complete IC structures. In an embodiment, the present fabrication separation of an IC structure into multiple discrete components can take advantages of dedicated IC fabrication facilities and achieve more cost effective products. In another embodiment, the present chip assembling provides high density interconnect wires between bond pads, enabling cost-effective assembling of small chip components. In an aspect, the present process provides multiple interconnect wires in the form of a ribbon between the bond pads, and then subsequently separates the ribbon into multiple individual interconnect wires.

30 Claims, 39 Drawing Sheets

Separating an integrated circuit design into a digital portion and an analog portion with the analog portion comprising components having critical dimension greater than the critical dimension of a digital fabrication facility
31A Fabricating the analog and digital portions in different fabrication facilities
32

Assembling the analog and digital portions from different facilities into a complete circuit
33

Fig. 3A

Separating an integrated circuit design into a digital portion and an analog portion with the digital portion comprising components common to a digital fabrication facility and the analog portion comprising components not common to a digital fabrication facility
31B

Fabricating the analog and digital portions in different fabrication facilities
32

Assembling the analog and digital portions from different facilities into a complete circuit
33

Fig. 3B

Separating an integrated circuit design into a digital portion and an analog portion with the analog portion comprising passive components having dielectric different than silicon dioxide and/or active components constructed in a non-CMOS process
31C Fabricating the analog and digital portions in different fabrication facilities
32

Assembling the analog and digital portions from different facilities into a complete circuit
33

Fig. 3C

Extruding correct lengths of interconnect wires over desired locations of bond pads
230
Laser cutting the interconnect wires
231
Laser welding the ends of the interconnect wires to the bond pads
232
Fig. 14

```
┌─────────────────────────────────────────────┐
│   Forming interconnect wires on a thermal   │
│ decomposable adhesive on a printhead substrate │
│                    220                      │
└─────────────────────────────────────────────┘
                      │
                      ▼
┌─────────────────────────────────────────────┐
│ Laser cutting the interconnect wires to correct length │
│                    221                      │
└─────────────────────────────────────────────┘
```

Fig. 20A

```
┌─────────────────────────────────────────────┐
│  Depositing a metal film on a thermal decomposable │
│       adhesive on a printhead substrate     │
│                    225                      │
└─────────────────────────────────────────────┘
                      │
                      ▼
┌─────────────────────────────────────────────┐
│   Patterning the metal film into interconnect wires │
│                    226                      │
└─────────────────────────────────────────────┘
```

Fig. 20B

```
┌─────────────────────────────────────────────┐
│   Extruding an interconnect wire on a thermal │
│  decomposable layer on a printhead substrate │
│                    228                      │
└─────────────────────────────────────────────┘
                      │
                      ▼
┌─────────────────────────────────────────────┐
│ Laser cutting the interconnect wire to correct length │
│     before laid down on the printhead substrate │
│                    229                      │
└─────────────────────────────────────────────┘
```

Fig. 20C

```
┌─────────────────────────────────────────┐
│ Positioning a ribbon interconnect on a  │
│        plurality of bond pads           │
│                  270                    │
└─────────────────────────────────────────┘
                    │
                    ▼
┌─────────────────────────────────────────┐
│  Laser cutting along the length of the  │
│  ribbon interconnect between adjacent   │
│   bond pads to separate the connections │
│                  271                    │
└─────────────────────────────────────────┘
```

Fig. 24

Treating the surface of at least one die, except the surface of the bond pads, so that a liquid metal will not wet or stick to it
310
Coating the surface of a bond pad with a liquid metal
311
Contacting the surfaces of the two dies together, wherein the liquid metal makes electrical contact between the two surfaces
312
Fig. 27

```
┌─────────────────────────────────────────────┐
│ Preparing capsules of liquid metal which are│
│ surrounded by a polymer shell having an     │
│ affinity for the contact pads               │
│                   330                       │
└─────────────────────────────────────────────┘
                      │
                      ▼
┌─────────────────────────────────────────────┐
│ Coating the contact pads with the polymer   │
│ shells having liquid metal inside           │
│                   331                       │
└─────────────────────────────────────────────┘
                      │
                      ▼
┌─────────────────────────────────────────────┐
│ Placing a complementary component against   │
│ the polymer shells surface                  │
│                   332                       │
└─────────────────────────────────────────────┘
                      │
                      ▼
┌─────────────────────────────────────────────┐
│ Squeezing the two components to break the   │
│ polymer shells and allow the metal to react │
│                   333                       │
└─────────────────────────────────────────────┘
```

Fig. 29

PROCESSES AND STRUCTURES FOR IC FABRICATION

The present invention relates to co-pending applications "Processes and structures for IC fabrication" of the same inventor.

BACKGROUND

RFID tags are a class of integrated circuits which intercept modulated RF signals from a transmitter (which is normally called a "reader"), demodulate the signal and apply the encoded information to a digital portion of the circuit, and radiate a modulated signal to the reader. The signal typically contains only a small amount of information such as the identification number of the device, although more information may be stored in the tag's memory and may be used either to determine whether the tag responds, or to influence the string of bits which are applied to the modulator. The modulator alters the Q of the antenna and thus its normally re-radiated signal, so no active power is applied to the transmission.

Such tags are intended to be applied to a very large number of objects, for example to shipping boxes or even to the individual items in a store (this application is called "item level tagging"). In order not to unacceptably increase the cost of the objects, the tags have to be very cheap: for item level tagging, for example, the cost to the user is desired to be under 5¢.

In order to minimize the total tag cost, each component should be carefully controlled, including the integrated circuit (chip), the antenna, the packaging (substrate and encapsulation), and the process. A typical cost of IC manufacturing for many years has been approximately \$4/cm$^2$, or 4 ¢/mm$^2$. Clearly if the IC is 1 mm$^2$ in area, it will not be possible to meet this target. Yet, the RFID chips available, from companies such as Texas Instruments, NXP Semiconductors, Impinj, etc. are typically between about 0.5 and 1 mm$^2$, with most on the high side (or even higher), and actual chip costs (even in high volume) are currently somewhat higher than 4¢. Clearly there is a need for smaller, and hence less expensive, chips.

SUMMARY

The present invention relates to processes and structures of integrated circuits (IC), particularly to radio frequency identification (RFID) tags, and more specifically to passive (non-powered) RFID tags. In an embodiment, the present invention discloses methods and apparatuses for the separations of IC fabrication and assembling of separated IC components to form complete IC structures. In the fabrication of IC devices, various fabrication processes and materials are not compatible, and many fabrication facilities are not equipped to handle all needed processes and materials. The present fabrication separation of an IC structure into multiple discrete components can take advantages of dedicated IC fabrication facilities and achieve more cost effective products.

In an embodiment, the present fabrication separation separates the fabrication of analog portions from the fabrication of digital portions of an IC device. Digital fabrication processes have been advanced significantly and digital fabrication facilities can produce submicron device IC with very high device density. In many cases, digital fabrication cost is thus directly related to the chip size. In contrast, analog fabrication processes provide lower device density with larger chip size. However, the cost per chip area for analog fabrication can be significantly lower than a same chip area for digital fabrication. Thus the present fabrication separation can optimize the cost of an IC that includes both analog and digital portions, separating the digital portion and the analog portion to achieve a small chip area for the digital portion and a higher chip area for analog portion. In addition, the present separation process can take advantages of dedicated digital facilities, which might not be equipped for routine processing of analog devices.

In an embodiment, the present separation brings to digital fabrication all processes and device structures that are common to MOS or CMOS processes, such as planar transistor devices that have substrate single crystal silicon channel. Other processes related to common MOS or CMOS processes include silicon dioxide gate dielectric, silicon oxide or silicon nitride spacer or passivation layer, impurity ion implantation for doping source/drain regions and gate electrode, polysilicon gate electrode, silicidation and aluminum metallization. The present separation can bring to analog fabrication all analog processes and structures, such as power devices, RF devices, thin film devices, or passive components. For example, the analog portion can comprise passive components constructed with dielectric other than silicon dioxide and/or silicon nitride, or with materials not common to MOS or CMOS processes. The analog fabrication portion can comprise capacitor structures that employ materials different than silicon dioxide, or materials with high dielectric constant (dielectric constant higher than that of silicon dioxide). Analog fabrication portion can comprise resistor structures that employ materials different than doped polysilicon. Analog fabrication can also comprise active components constructed with non-MOS or non-CMOS process, for example, devices with non-single crystal silicon channel, such as polysilicon channel or III-V or II-VI channel.

In an embodiment, the present separation removes the portions of the integrated circuit that are not common to a digital processing facility. Thus the portions of the IC that can be fabricated in a digital processing facility can be arranged to achieve optimum cost effectiveness for the whole IC structure. For example, devices that employ new materials, such as capacitors with high dielectric constant (BST, for example) can be removed from the digital fabrication facility, and processed in an analog facility.

In an embodiment, the present separation removes the portions of the integrated circuit that have critical dimensions greater, or 2× to 5× greater, than that of a digital processing facility. In an aspect, the present separation removes the portions of the integrated circuit that can affect the chip area of the digital portion to achieve the smallest digital chip size, and thus smallest cost for digital processing. For example, for a 0.25 µm digital fabrication facility, active devices are fabricated with 0.25 µm processes, and smallest chip area can be achieved for devices using 0.25 µm critical dimension. Thus other devices with larger dimension, for example, capacitors, resistors, power transistors or polysilicon/deposited or printed single crystal silicon/amorphous transistors, can be removed from the digital fabrication facility, and processed in an analog facility.

In an embodiment, the present fabrication separation separates the IC into separate functional components, such as memory, multiple digital logic portions, power devices, RF devices and passive devices. The components are preferably small, for example, 1 mm or less, and thin, for example, 100 µm or less. The components are also preferably assembled close to each other, for example, less than 100 µm, or preferably less than 10 µm. In an aspect, the components do not require any packaging before assembling, for example, assembling in wafer form. In an aspect, the components are assembled with a thin film transfer process, which can handle small and thin components. In an aspect, the present invention discloses an assembling process, stacking the components in stacked configuration, partially stacked configuration, coplanar configuration, partially coplanar configuration, or any combination thereof. In an aspect, the small sizes of the functional components provide better flatness and uniformity of the contact pads, thus the connection technology for these small functional components is greatly simplified. For example, flip chip connection can be used with smaller spacing.

In an embodiment, the present fabrication separation separates the RFID tags, forming separate digital portions from analog portions. In an aspect, the analog portions of the RFID tag comprise active devices constructed in non-MOS or non-CMOS process. The analog portions can comprise active devices having non-substrate single crystal silicon channel, such as polysilicon channel, deposited or printed single crystal silicon channel, or GaAs channel. The analog portions can comprise thin film transistors, such as transistor having deposited channel regions. In an aspect, the analog portions of the RFID tag comprise passive components constructed in non-MOS or non-CMOS process. The analog portions can comprise passive components constructed with dielectric other than silicon dioxide or silicon nitride, for example, capacitor devices with dielectric material having high dielectric constant, or resistor devices with conductive material different than doped polysilicon. In an aspect, the RFID tag is separated into memory component, digital logic component and RF components, which are then connected to form the RFID tag.

The present invention further discloses processes and structures for interconnection assembling of the separate components to form a complete integrated circuit. In an embodiment, the present invention discloses gradual slope edge of the top component, for example, formed by a laser ablation process. When a top component is assembled on top of a bottom component, the sharp edge of the top component might cause difficulty with the interconnect wires connecting the top component to the bottom component. With a gradual slope, interconnect wires can be easily bonded, and the bonding reliability can be improved. The gradual slope can be formed along the edge of the component, or can be form along the interconnect wire, in the direction from a bond pad of the top component to the bond pad of the bottom component.

In an embodiment, the present invention discloses simultaneous bonding of multiple bonding pads to the interconnect wires. For example, a component typically has multiple bonding pads arranged next to each other at the edge. These bond pads can be prepared to simultaneously bond to multiple interconnect wires. In an aspect, conducting adhesive can be applied continuously to these bond pads, with the adjacent bond pads electrically connected to each other by the adhesive. Multiple interconnect wires then can be applied to these bond pads at the same time, forming multiple bonds from the multiple interconnect wires to the corresponding multiple bond pads. A bond pad separation process such as a laser cut can be applied to separate the adjacent bond pads. In another aspect, multiple interconnect wires can be positioned on these adjacent bond pads, and a laser welding can travel along these bond pads, welding all these interconnect wires to the corresponding bond pads, together with some connection between adjacent bond pads. A separation process, such as a laser cut, can be applied to separate the connection between the adjacent bond pads.

In an embodiment, the present invention discloses laser cutting and/or laser welding to bond the interconnection wires to the bond pads, which can provide high density wire bonding due to the small size of the laser beam. In an embodiment, the present invention discloses interconnection printing using thermally decomposable adhesive. The present interconnection printing process comprises forming interconnect wires with correct lengths on a thermally decomposable adhesive on a printhead substrate, placing the interconnect wires on proper bond pads by releasing the thermally decomposable adhesive, and then laser welding the interconnect wires to the bond pads. An optional force element can be used to push one or more interconnect wires down into contact with the bond pads to facilitate the laser welding process. In certain cases, the laser welding process forms a liquid at the bond pad and/or softens the metal wire, which then facilitates the contact by surface tension and gravity. For contacts between stacked chips, the top chip can form a slope to avoid a sharp chip edge and facilitate interconnect wire alignment.

In an aspect, narrow wires are formed on the thermally decomposable adhesive, and laser cuts can be performed to prepare the wires to the correct length. In another aspect, a metal film is deposited on the thermally decomposable adhesive, and then be patterned into metal wires. The patterned metal wires can be patterned to the correct length, or an additional laser cut can be performed to cut the patterned wires. In another aspect, a conventional wire bonder system can provide interconnect wires to the thermally decomposable adhesive. The wire bonder can feed, cut and place wires with correct length on the thermally decomposable adhesive, utilizing the capabilities of the wire bonder. Alternatively, laser cutting can be used to cut the wires.

In an aspect, multiple wires can be released simultaneously to the corresponding bond pads. For example, the multiple bond pads are prepared to accept bonding to multiple wires, such as by applying a continuous strip of conductive adhesive along the adjacent bond pads. Alternatively, after the multiple wires are positioned on the corresponding bond pads, laser welding can be applied to continuously weld the multiple wires to the corresponding multiple bond pads. The laser can jump from one bond pad to the next bond pad. Alternatively, the laser can weld continuously from one bond pad to the next bond pad. In this case, there might be some electrical connection between adjacent bond pads. A laser cut might then be applied to separate the potential connection of adjacent bond pads. After the connection of one end of the multiple wires, the other end can be bonded to the corresponding bond pads.

In an embodiment, a conventional wire bonder can be utilized together with laser welding and/or laser cutting. In an aspect, the laser welding replaces the typical ultrasonic welding of the wire bonder, providing the capability to bond much smaller wires. The wire bonder can provide the capillary, feeding mechanics and positioning technology, all of which can be performed on much smaller wires than those currently available. The wire bonder can be used to extrude a desired length of the wire over a desired location, where a laser cut allows the wire to fall into position. The laser, or another laser, is used to weld the ends of the wires.

In an embodiment, the present invention discloses simultaneous formation of multiple interconnect wires in the form of a ribbon. A ribbon interconnect is bonded to multiple bond pads at both ends of the ribbon. A separation process, such as a laser cut, along the length of the ribbon and between the adjacent bond pads is performed to separate the ribbon into multiple interconnect wires, connecting the corresponding bond pads. A beveled slope can be applied to the top component to facilitate the formation of the ribbon interconnect. The present ribbon interconnect can be applied to stacked components, partial stacked components, or side-by-side components.

In an aspect, a conductive adhesive is applied to the bond pads, either to the multiple bond pads at one end or both ends of the ribbon interconnect, before placing the ribbon interconnect on the bond pads. The conductive adhesive can be applied (e.g., printing) continuously, along a direction substantially perpendicular to the length of the ribbon, bridging the bond pads from one end (or each end) of the ribbon interconnect. Both the ribbon and the conductive adhesive line connect the bond pads together. A laser then may be used to form cuts along the length of the ribbon, separating the ribbon into substantially parallel individual wires. The resulting wires may be encapsulated for protection and stability, for example, by applying a droplet of curable adhesive.

In an aspect, a welding process is performed to bond the ribbon to the bond pads, after placing the ribbon interconnect on the bond pads. All the bonds may be formed in a single ultrasonic welding operation, or the bonds may be formed by a laser welding. The laser welding process can address each pad in sequence, continuously or jumping between pads. The movement of the laser welding process along the bond pads can be performed by a mechanical motion moving the laser beam, or from a moving mirror mechanism. A separation process, such as a laser cut, is then performed to separate the ribbon into multiple individual wires. An encapsulation process can also be applied.

In an embodiment, the present invention discloses a surface preparation process to facilitate the bonding process between stacked components (such as dies), wherein the surface of at least one of the components is treated in such as a way so that a liquid metal will not wet or stick to it. This surface treatment process is applied to the whole surface, excluding the bond pad areas. This surface treatment can prevent shorting between bond pads, helping to confine the bonding to the bond pad areas. When the two components are pressed with the bond pads facing each other, the liquid metal can make a thin and uniform electrical contact between the two bond pads. In an aspect, the liquid metal can be mixed with suitable particles which alloy to form a higher melting point metal, which then forms a bond as the alloy reaction proceeds.

In an embodiment, the present invention discloses encapsulated liquid metal for bonding surfaces, wherein capsules or vesicles of a liquid metal are surrounded by a polymer shell. The polymer shells can be formed from an emulsion process, or by self-assembly of polymer chains as surfactant. In an aspect, the polymer has a specific affinity for the contact pads, which facilitates the coating of the polymer shells onto the surface of the components. After forming a layer (such as a monolayer) of these capsules on the contact pads of a component, another component is placed against these capsules, matching the contact pads of the top component to the contact pads of the bottom component. The two components are then squeezed together, breaking the capsules and allowing the metal to react, forming the electrical connection bond between the bond pads.

BRIEF DESCRIPTION OF THE DRAWINGS

FIGS. 3A-3C illustrate various exemplary process flows for the present separation fabrication process.

FIG. 14 illustrates an exemplary process flow for the combination of wirebonder and laser cutting/welding.

FIGS. 20A-20C illustrate various exemplary processes of forming wires with correct lengths on the thermal decomposable layer on the printhead.

FIG. 24 illustrates an exemplary flowchart for the present ribbon interconnect.

FIG. 27 illustrates an exemplary flowchart of the present surface treatment.

FIG. 29 illustrates an exemplary flowchart of the present capsule contact bonding.

DETAILED DESCRIPTION OF THE PREFERRED EMBODIMENTS

The present invention discloses processes and structures of integrated circuits (IC) fabrication. The following description relates to radio frequency identification (RFID) tags, but the present invention is not limited to RFID.

Figure 1:
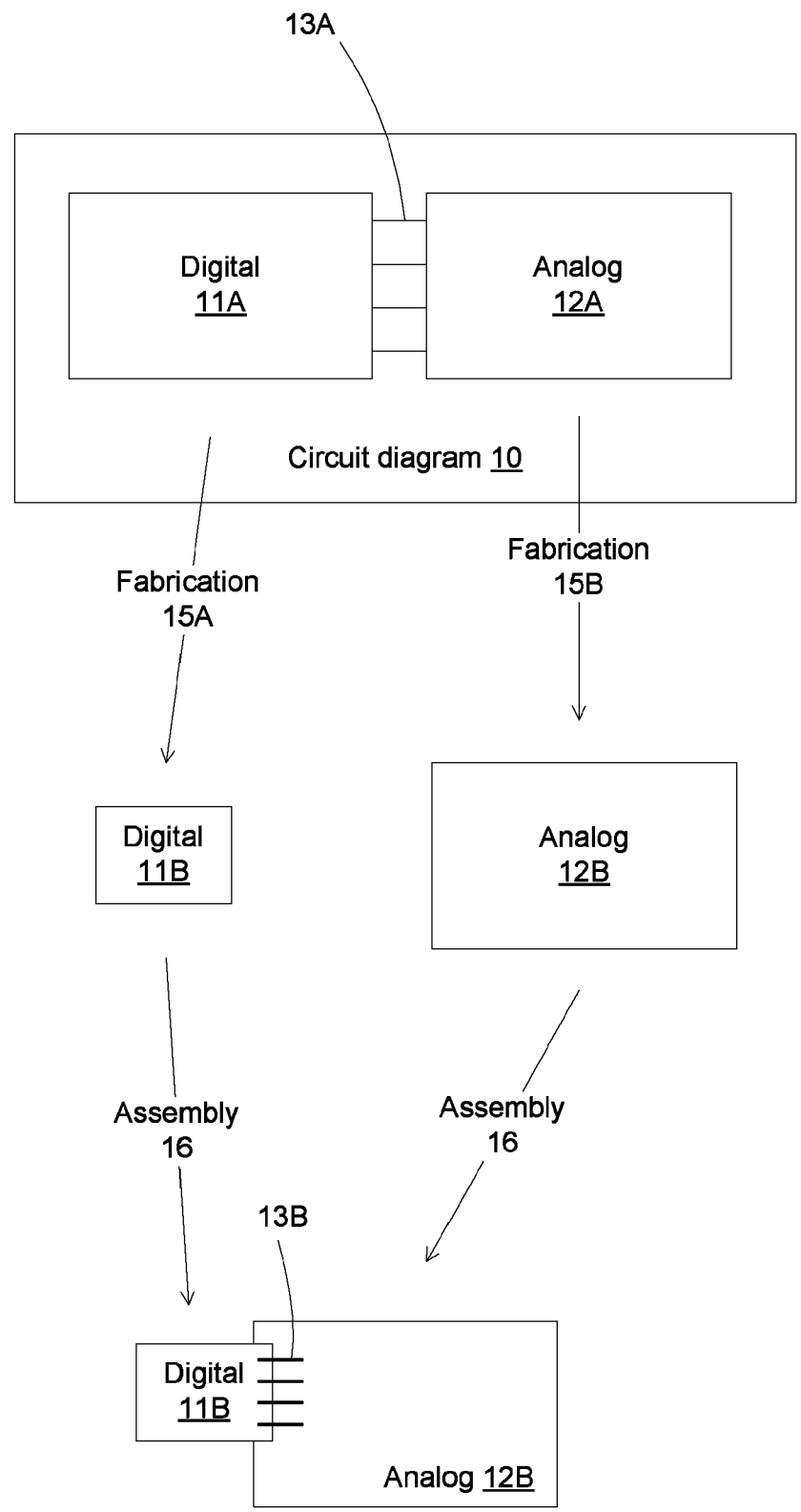
FIG. 1 illustrates an exemplary process and structure for separating a circuit diagram into separate components before assembling together to form a complete IC chip.

In an embodiment, the present invention separates the analog portion from the digital portion of an IC circuit for fabrication. FIG. 1 illustrates an exemplary process and structure for separating a circuit diagram 10 into separate digital component 11B and analog component 12B before assembling together to form a complete IC chip. A circuit design 10 can have a digital portion 11A and an analog portion 12A, connected through interconnection 13A. A separation process separates the portions of the circuit design, according to predetermined criteria, for example, to achieve a low cost of final product. The digital 11A and analog 12A are fabricated separately in different fabrication facilities 15A and 15B, to produce a digital component 11B and an analog component 12B. The digital and analog components then undergo an assembly process, including connecting the two portions through interconnect wirings 13B to produce a final product.

Figure 2:
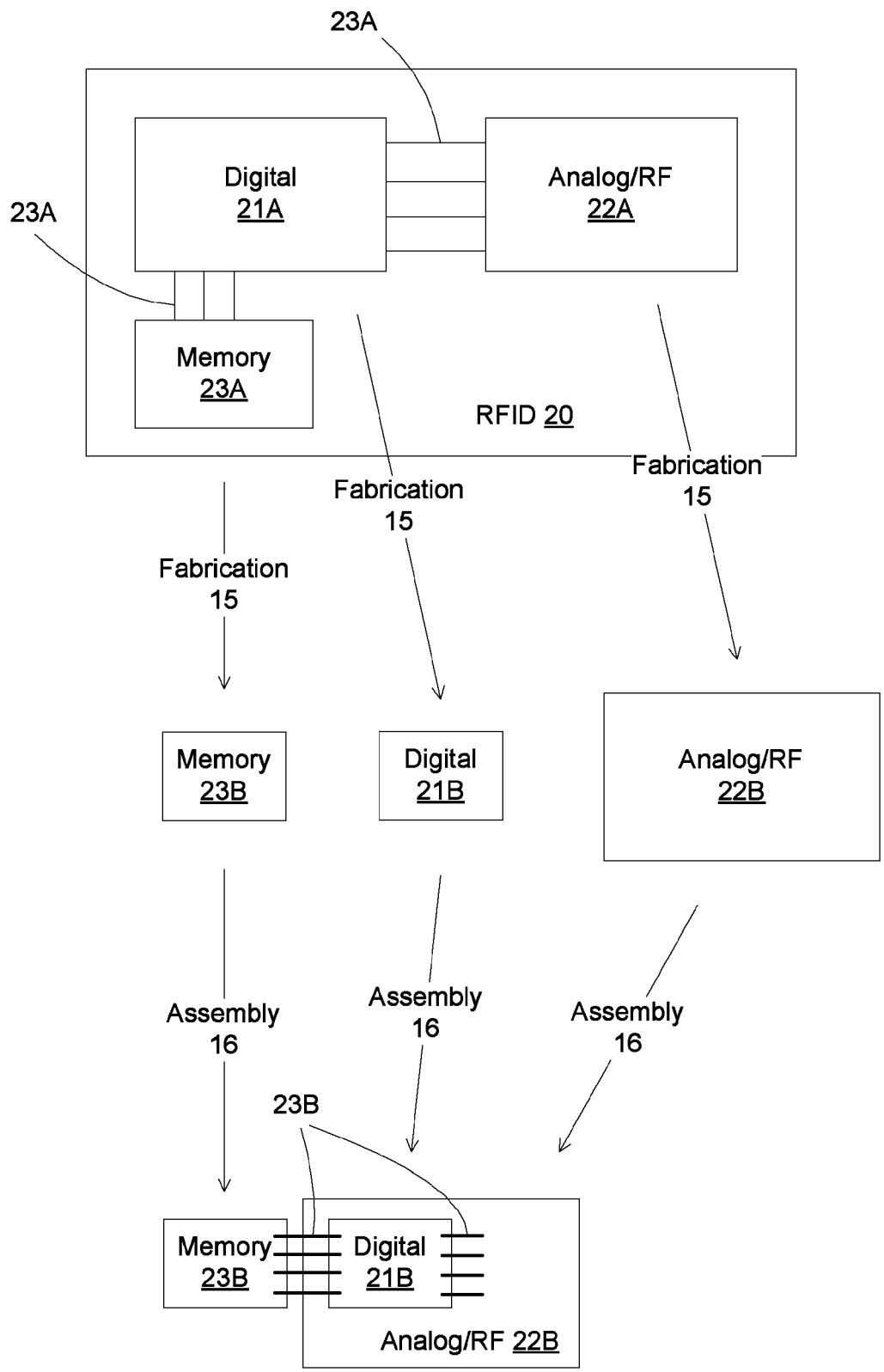
FIG. 2 illustrates an exemplary process and structure for a RDIF tag.

FIG. 2 illustrates an exemplary process and structure for a RDIF tag 20, starting by separating the RFID design 20 into a digital portion 21A, an analog and/or RF portion 22A and a memory portion 23A with interconnect 23A. The three portions are fabricated separately 15 to produce separate components, a memory component 23B, a digital component 21B and an analog/RF component 22B. The three components are then assembled 16, including providing interconnect 23B, to produce a final RFID tag.

Digital ICs can be made smaller by shrinking the features, and hence fitting the same number of transistors into a smaller area. This type of shrinking is common in the industry, and is generally referred to as "Moore's Law". The critical dimension of the digital transistors, i.e., the dimension of the smallest geometrical features (for example, the width of transistor channel, interconnect line, contacts, trenches, etc.) which can be formed during the fabrication of semiconductor devices using a given technology, is smaller and smaller, and the size of simple circuitry, e.g., ICs with thousands of transistors, is limited at the lower end only by the IC handling technology, e.g., pick and place machine.

However, analog integrated circuits are not subject to the same simple scaling process, because they depend heavily on so-called passive components, which are primarily capacitors, resistors, and inductors. Each of those components has values which depend on fundamental materials physics. For example, the capacitance of a parallel plate capacitor is given by the area of the plates, divided by their separation, and multiplied by the dielectric constant. Thus, for a given set of materials (dielectric), larger capacitances can only be obtained by making larger area capacitors (thickness reductions are limited by dielectric breakdown). Related constraints apply to the other components. In addition, the semiconductor components used for analog functions must carry certain amounts of current (or provide certain voltages) which are specified by the circuit power and voltage demands, and this places limits on their physical size which results in different sizes from digital transistors, which only need to provide enough current to drive the next few transistors, and voltages to switch following gates.

In an embodiment, the present invention discloses a design separation wherein the devices having a critical dimension compatible with the critical dimension of a digital fabrication facility are fabricated in the digital fabrication facility. Devices with critical dimension much greater than the digital critical dimension are separated and fabricated in a separate fabrication facility. In an aspect, the present separation process separates the digital portion with similar critical dimension from the analog portion with much greater critical dimension to be fabricated in different production lines. A criterion for separating the portions of an IC design would be cost saving. For example, by separating the IC portions based on critical dimension, minimum cost can be achieved from having components fabricated as densely as possible on a given substrate.

In an aspect, the present invention employs an innovative process of placing and connecting two or more different chips in an IC (such as a RFID tag) to achieve lower cost assembly after making them separately. In addition, the present invention provides an incentive to make components as small as possible, because innovative assembly equipment, such as transfer printing with decomposable adhesive, allows picking up and moving smaller components with adequate throughput.

In an aspect, the present invention overcomes some of the shortcomings of the prior art by making it possible to assemble components of almost any size, down to the micrometer scale. The digital and analog sections of an RFID tag can be made separately, on optimized process lines, and cost-effectively combined to make a single, very compact and thin, chip for assembly into a tag. U.S. Pat. No. 6,946,178 and No. 7,141,348 by Sheats, et al., hereby incorporated by reference, describe a method and materials for transfer printing by use of a photosensitive thermally decomposable polymer, which allows the placement of very thin and laterally small components onto a wide variety of substrates with high precision. Thus, for example, an integrated circuit chip, which might have a thickness of the order of twenty or thirty micrometers (or less), for example, and a width of a few tens to a few hundreds of micrometers, may be placed on top of another integrated circuit chip with sufficient accuracy that contact pads on one chip will line up effectively with contact pads on the other. Various methods known in the art, including conventional flip chip packaging, may be used to form electrical contact between the two, as well as methods disclosed herein. Alternatively, the upper chip may be placed face up and interconnection made through vias or over the edge.

The advantage of the invention is that the digital portion of the circuit may be shrunk according to the scaling process common in the industry, and thereby reducing the cost according to the area. At the same time, the analog portion can be fabricated with materials that are optimized for passive components, which reduces the area occupied (and hence the cost) as well as reducing the cost by using optimized equipment, simpler processes, and less expensive materials.

FIG. 3A illustrates an exemplary process flow for the present fabrication separation process. Operation 31A separates an IC design into different portions, for example, a digital portion and an analog portion, with the analog portion comprising components having critical dimension greater than the critical dimension of a digital fabrication facility. The analog critical dimension can be greater, and preferably 2-5× greater than the digital critical dimension. The digital critical dimension is specific to a digital fabrication facility, and thus can be different for different digital facilities. In an aspect, the separation process separates devices having critical dimension greater/smaller than a predetermined value, for example, to be fabricated in different fabrication facilities. For example, devices within the digital critical dimension tolerance are separated to be fabricated in the digital facility. Alternatively, devices having critical dimension outside the tolerance of a digital facility are separated to be fabricated in a separate facility. Operation 32 fabricates the separated digital and analog portions in different fabrication facilities. Operation 33 assembles the separately fabricated portions into a complete circuit. In an aspect, the assembly utilizes a transfer printing process with photosensitive thermally decomposable adhesive to handle small digital components.

FIG. 3B illustrates an alternative process flow for the present fabrication separation process. Operation 31B separates an IC design into different portions, for example, a digital portion and an analog portion, with the digital portion comprising components common to a digital fabrication facility and the analog portion comprising components not common to the digital fabrication facility. One of the characteristics of a digital facility is the ability to fabricate a chip routinely, effectively and with low cost. Thus by separating the components not common to the digital facility, the fabrication cost for the digital portion can be minimized. After the design separation, operations 32 and 33 fabricate the portions in different fabrication facilities before assembling into a complete circuit.

In an embodiment, the present separation process is based on the digital fabrication facility. For example, the fabrication processes required for making passive components are significantly different from those needed for semiconductors. A MOS or CMOS (complementary metal oxide semiconductor) transistor consists of electrodes (conductors), semiconductors (silicon with or without dopant), and insulators (almost exclusively silicon oxide), all patterned at very small sizes. Passive components such as capacitors consist of conductors and insulators, but often without small scale patterning, and ideally using insulators which have the highest possible dielectric constants and are not suitable for transistors. Thus the fabrication processes are not easily meshed in a single production line, and increased expense results. Even such a seemingly simple change as the addition of a Schottky diode (a metal on a semiconductor) is often not available in a CMOS foundry (because the desired metal, for example, or perhaps the required doping level, is not part of the CMOS process). In general, CMOS-based digital logic is comprised of a very standardized, repetitive set of components (and hence fabrication processes), while analog circuitry may vary a great deal in its composition, size and arrangement according to the design.

FIG. 3C illustrates another alternative process flow for the present separation fabrication process. Operation 31B separates an IC design into different portions, for example, a digital portion and an analog portion, with the analog portion comprising passive components having dielectric different from silicon dioxide and/or silicon nitride, and/or active components constructed in a non-MOS or non-CMOS process. Alternatively, the separation process brings to a separate facility all components constructed in a non-MOS or non-CMOS process. Examples of non-CMOS process include analog devices, polysilicon/deposited or printed single crystal silicon/amorphous silicon channel transistors, and/or power devices. After the design separation, operations 32 and 33 fabricate the portions in different fabrication facilities before assembling into a complete circuit.

In an embodiment, the present invention discloses methods and integrated circuits for fabricating a separated analog portion comprising passive components utilizing dielectric materials different than silicon dioxide, and active components utilizing channel materials different than single crystal silicon. The analog portion is then fabricated in a separate analog fabrication facility, preferably different from a digital fabrication facility. In an aspect, the analog portion further comprises components not commonly processed in a digital fabrication facility, components having materials not available in a digital fabrication facility, components having critical dimensions greater or 5× greater than the critical dimension of a digital fabrication facility, or any combination thereof. In an aspect, the analog portion further comprises active components constructed in non-CMOS processes, or components to minimize the chip area of the digital portion. Also, the passive components of the analog portion can comprise capacitor structures, or the dielectric material utilized in the passive components has a dielectric constant greater than that of silicon dioxide. The active components of the analog portion can comprise thin film transistors, or the channel material utilized in the active components comprises one of polysilicon, amorphous silicon, and deposited or printed single crystal silicon. In an aspect, single crystal silicon channel devices can be put in either digital or analog portions. For example, substrate single crystal silicon channel devices, such as channels fabricated from single crystal silicon wafer or SOI (silicon-on-insulator) wafer, are typically fabricated in a digital fabrication facility. Polysilicon or amorphous silicon channel devices can be separated into analog portions and fabricated in an analog facility. Deposited or printed single crystal silicon channel (such as an area of ultrathin single crystal silicon is printed or deposited on a substrate, and being used for a channel area) can be fabricated in either digital or analog facility. In an aspect of the present invention, deposited or printed single crystal silicon channels are separated into analog portions, and fabricated in an analog facility.

In an aspect, the analog and digital portions comprise bond pads for I/O connections between the portions for assembling to form the complete integrated circuit. The assembling can comprise bonding corresponding bond pads between the analog and digital portions, wherein the portions are placed in an at least partially stacked configuration, or in an at least partially coplanar configuration.

Figure 4A:
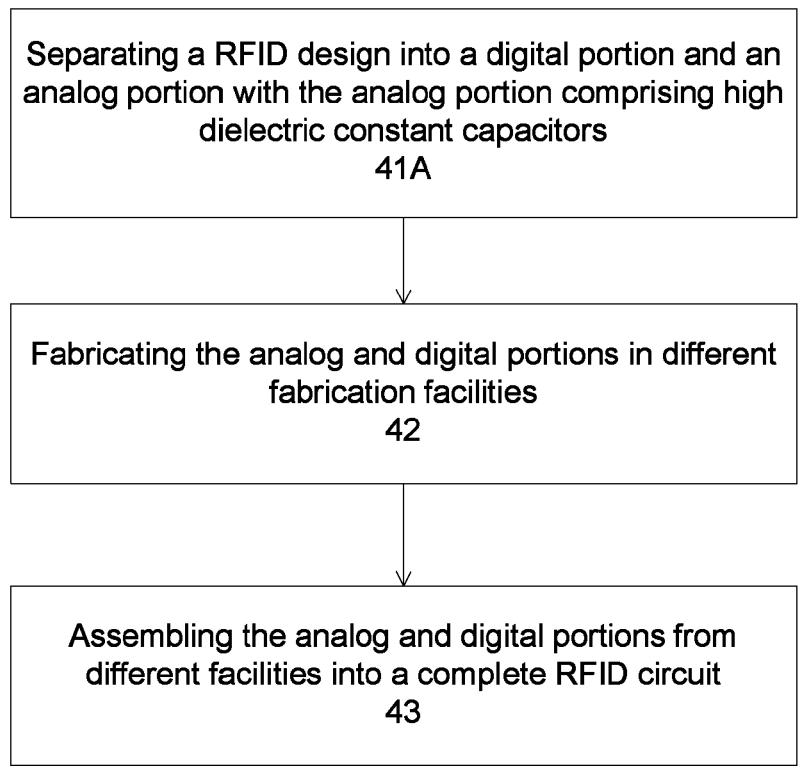
FIG. 4A illustrates an exemplary separation process for RFID tag based on capacitor with high dielectric constant.

In an embodiment, the present separation process and IC is applied to RFID tags. FIG. 4A illustrates an exemplary separation process for RFID tag based on capacitors with high dielectric constant (i.e., dielectric constant greater than that of silicon dioxide). Operation 41A separates a RFID design into multiple portions, for example, a digital portion and an analog portion, with the analog portion comprising high dielectric constant capacitors. After the design separation, operations 42 and 43 fabricate the portions in different fabrication facilities before assembling into a complete circuit.

In a passive RFID tag, power must be supplied to the tag from the incident RF electromagnetic field. The field generates a high frequency AC signal in the antenna, while the circuit must be powered by a DC constant voltage source at the value which turns transistors on. Conversion is commonly accomplished by a diode-based rectifier circuit, which may be comprised of semiconductor diodes and capacitors. At least one of these capacitors, and more generally more than one, is required to have a relatively high value in order to supply the required power to the circuit. For example, in a simple diode rectifier a capacitance value of around 300 picofarads might be required to supply a power of 30 microwatts to a circuit, starting from a 100 microwatt signal at 935 MHz received by the antenna from the reader. If the dielectric is silicon oxide (as commonly found in IC processes), and the thickness is 100 nm (which with 1V across it is subject to a field of 0.1 MV/cm, which is a reasonable margin of safety to avoid dielectric breakdown which could occur at field strengths of the order of 1 MV/cm or more), the area required would be 1 mm$^2$. Various circuit design strategies may be employed to reduce this capacitance requirement, but areas which are a substantial fraction of an mm$^2$ are still required.

Capacitor area can be reduced by increasing the dielectric constant of the insulator. Certain complex oxides, for example, are known to have far higher dielectric constants. BaSrTiO2 has a value of about 500; other perovskites may attain values of several thousand. These materials are not part of standard CMOS processing lines and cannot be provided integrated with CMOS transistors. However, devices using them can be readily made in thin film form by sputtering and evaporation processes which are well known in the art, so they can be made in a second component and integrated with silicon diodes. In a typical UHF RFID circuit, as described, for example, by Rob Glidden, et al., in the IEEE Communications Magazine, pp. 140-151, August 2004 (which refers to a chip sold by Impinj, Inc., of Seattle, Wash.), hereby incorporated by reference, the total number of capacitors is 2533 (with about 39,000 transistors). Many of these capacitors are small (associated with solid state memory cells, for example), but many are not. Glidden, et al., show a photograph of their chip in which there is a block of "Storage capacitors" which occupies roughly 7% of the area. The "Rectifier" blocks (of which there are two) occupy a similar area.

According to the present invention, at least a block of storage capacitors, as well as the capacitors in the rectifier section, would be formed on a separate substrate, whose processing cost would be far less than that of CMOS. The exact cost of any thin film process depends of course on the details, but a rough estimate can be obtained by noting that the cost of making thin film amorphous silicon transistors is in the vicinity of 4 ¢/cm$^2$. Since such transistors are comprised of 4 deposition and masking layers, with lithography in the 1-2 μm range, the cost may be of the same order. Clearly there are major savings (on a per unit area basis) to be obtained from forming such components as capacitors and diodes in a separate layer which does not experience the complexity of high resolution CMOS processing. It is to be understood that these savings result in part because lower resolution lithography is used, in part because there are fewer and less demanding process steps, and in part because a less expensive substrate is used. Only when the characteristics of the product are not impaired by these aspects (e.g., lower patterning resolution, less precise control of small impurity concentrations, etc.) and the resulting area is still acceptably small can one avail oneself of the lower area cost process. This is very strongly the case for capacitors, and to a lesser but significant case for diodes.

In an embodiment, the present invention discloses RFID circuits and methods for fabricating an RFID circuit with a separate analog portion comprising a capacitor utilizing dielectric material having dielectric constant greater than that of silicon dioxide. The analog portion is then fabricated in a separate analog fabrication facility before assembling to form a complete RFID circuit with the digital portion. In an aspect, the analog and digital portions comprise bond pads for I/O connections between the portions for assembling to form the complete RFID circuit. The assembling can comprise bonding corresponding bond pads between the analog and digital portions, wherein the portions are placed in an at least partially stacked configuration, or in an at least partially coplanar configuration.

Figure 4B:
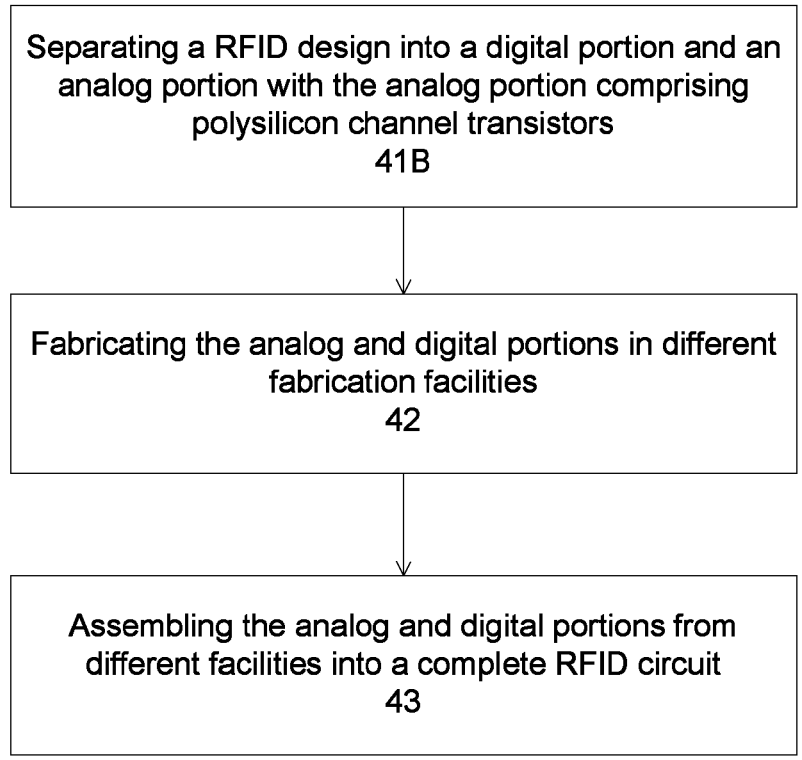
FIG. 4B illustrates an exemplary separation process for RFID tag based on single crystal silicon or polysilicon fabrication process.

In an embodiment, the present separation process is applied to single crystal silicon or polysilicon in RFID tags, or to substrate or deposited/printed single crystal silicon channel in RFID tags. FIG. 4B illustrates an exemplary separation process for RFID tag based on single crystal silicon or polysilicon fabrication process. Operation 41B separates a RFID design into multiple portions, for example, a digital portion and an analog portion, with the analog portion comprising polysilicon channel transistors or any active devices having channel different than single crystal silicon. Alternatively, the digital portion comprises devices having single crystal silicon channel. After the design separation, operations 42 and 43 fabricate the portions in different fabrication facilities before assembling into a complete circuit. The separation between substrate single crystal silicon and deposited/printed single crystal silicon can be similarly constructed.

The RFID analog circuitry also requires transistors, as noted above, and these transistors, if made using conventional CMOS processes, cannot be shrunk according to Moore's Law due to the requirements to handle certain values of current, voltage or power. However, when the transistors are already so large, for example with gates of several micrometers width and length, they may be advantageously made using other processes. In particular, they may be fabricated from polycrystalline silicon (generally abbreviated "polysilicon"), which is typically formed by depositing amorphous silicon (by chemical vapor deposition, for example) and then re-crystallizing the amorphous layer using thermal or laser heating sources. This process may be carried out on glass substrates which are quite large (several square meters) at high throughput, and is currently used to make drive electronics for flat panel displays. The cost of the transistors is somewhat higher than for amorphous silicon transistors, due to the recrystallization step, but not by a large factor, while the electrical performance is far better. The electron mobility, for example, is often reported to be in the range of about 120-300 cm2/Vsec, which is within a factor of 2-5 of that found in crystalline silicon. For example, Sharp Corporation reports a mobility 600× larger than that in amorphous silicon, which is known to be generally around 1 cm$^2$/Vsec.

The lateral size of the analog circuit transistors in RFID tags is relatively large, yet the number of them is quite small compared to digital logic (in many designs less than about 100 total, and in some cases less than 50). Thus these devices may be advantageously made using a polysilicon process even though they may need to be still larger (since the series resistance of the device, or its current carrying capacity, is related to the mobility). The cost may be, for example, more than the cost of amorphous silicon transistors, but not so much more that the resulting circuits are not competitive for use in flat panel displays for televisions or consumer electronics. Thus, even if (as an illustrative example) the cost is ⅕₀ of that of CMOS per unit area instead of ¹⁄₁₀₀ (as for amorphous silicon), while the area required is 2-5 times as much, the savings are about 10× to 25×. The area process cost of CMOS is not decreasing substantially (if at all) with time, while the area process cost of polysilicon thin film transistors has been decreasing (due to the introduction of larger area process equipment and larger volumes in the flat panel display industry, as well as improvements in the technology of laser annealing); hence this advantage is a robust one and will if anything improve with time.

In addition to polysilicon channel devices, other channel material technologies may be used in the scope of the invention. For example, GaAs or other III-V transistors (i.e., made using elements from Groups III and V of the periodic table) may be attractive for certain aspects of the analog function of an RFID chip. These devices could not previously be used because it has not been possible to combine III-V materials of device quality with silicon on a single substrate, and it is not generally cost-effective to place different chips on a single RFID tag substrate and connect them. However, with the present invention the two types of device technology may be combined effectively. Other transistor technologies which might be used include GaN and related materials, ZnO, and SiGe. This list is not exclusive and does not exhaust the scope of the invention.

In an embodiment, the present invention discloses RFID circuits and methods for fabricating an RFID circuit with a separate analog portion comprising a transistor having polysilicon, amorphous silicon, deposited or printed single crystal silicon channel. The analog portion is then fabricated in a separate analog fabrication facility before assembling to form a complete RFID circuit with the digital portion. In an aspect, the analog portion further comprises thin film transistors, or III-V or II-VI channel devices. In an aspect, the analog and digital portions comprise bond pads for I/O connections between the portions for assembling to form the complete RFID circuit. The assembling can comprise bonding corresponding bond pads between the analog and digital portions, wherein the portions are placed in an at least partially stacked configuration, or in an at least partially coplanar configuration.

The area that may be put into the second substrate depends on the design details of the RFID tag. Frequently, however, in the prior art, the digital portion of the circuit may comprise about 40-60% of the total area, and the analog portion 40-60%. Thus, a superior device may be fabricated by shrinking the digital portion according to the available CMOS technology, and shifting the analog portion to alternative substrates and technology. Depending on which alternative technology is used, and what the component sizes are, one or the other of these may be the larger. If, for example, the digital portion is 50% of the area of a chip which is 700 micrometers square, using 0.25 micrometer technology, implementation in 90 nm technology would result in a shrink from 0.00245 cm$^2$ to 13% of that value, leading to a nominal cost of slightly over 0.1¢ instead of 1¢. For the analog portion, a CMOS chip area of 0.00245 cm$^2$ costing nominally 1¢ may be replaced by a polysilicon area of less than 2-5× greater (less because of the reduction in capacitor area), or less than (700 μm)$^2$ to (1100 μm)$^2$. Since the cost of this processing is expected to be not more than 8 ¢/cm$^2$, the cost of the analog portion is reduced to about 0.04¢ to 0.1¢, which is similar to the digital cost and represents a 10-fold reduction in overall chip cost. It is to be understood that these numbers are for illustration only and do not limit the scope of the invention, but serve to illustrate its value.

In an embodiment, the present invention discloses integrated circuits, such as RFID devices, and methods to form complete integrated circuits, by separating the IC design into multiple common-utilized components before assembling them into the complete circuit. In an aspect, the separation process is based on minimum area of the components, meaning the components are fabricated as small as possible. In an aspect, the lateral size of the components is 1 mm or less, and preferably 0.1-0.5 mm or less. The thickness of the components is 100 um or less, and preferably 50 um or less. Also the components are placed less than 100 um, and preferably within a few microns or tens of microns, of each other. In an aspect, the size of the present separation components are limited by the bond pads and the assembling of interconnect wires. Conventional bond pads provide 50-100 micrometer lateral size. The present invention also offers bond pads size of a few micrometers, or less than 10-15 micrometers.

The small size of the present separation components requires innovative assembly processes, such as a transfer printing process, since conventional pick and place machinery does not have adequate resolution to handle this size. Such small circuits can save money, are flexible and can fit into unique spaces.

The present components are preferably completed in wafer form without any packaging before assembling. Eliminating the packaging step of the individual components allows smaller component size with lower cost. In an aspect, the packaging process can be performed after the completion of component assembling.

Figure 5A:
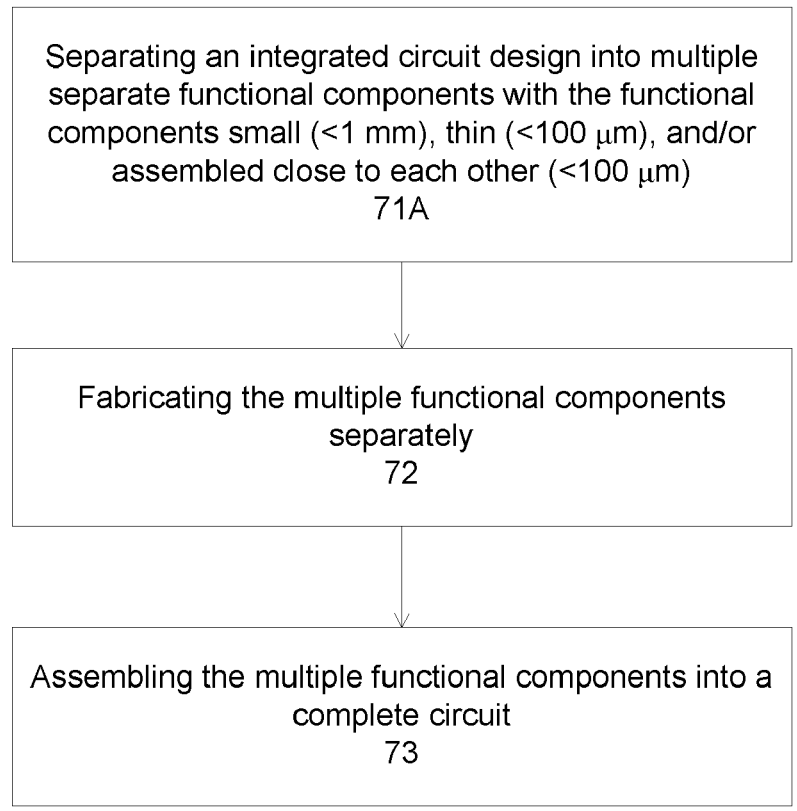
FIG. 5A illustrates an exemplary process of separating an IC design into small components, and the process of assembling small components to form a complete circuit.

FIG. 5A illustrates an exemplary process of separating an IC design into small components, and the process of assembling small components to form a complete circuit. Operation 71A separates an IC design into multiple separate functional components with the functional components being small (<1 mm, preferably <0.1-0.5 mm), thin (<100 um, preferably <50 um), and/or assembled closed to each other (<100 um, preferably <10-15 um). Operation 72 fabricates the multiple components separately. Operation 73 assembles the multiple components into a complete circuit. In an aspect, the present invention discloses the process of assembling small functional components into complete circuit, preferably by a transfer printing process utilizing photosensitive thermally decomposable adhesive. In an aspect, the multiple functional components are assembled to form a complete integrated circuit, with the assembling process comprising a thermal adhesion transfer process, or bonding corresponding bond pads between the multiple functional components. The multiple functional components can be assembled in an at least partially stacked configuration or an at least partially coplanar configuration.

Figure 5B:
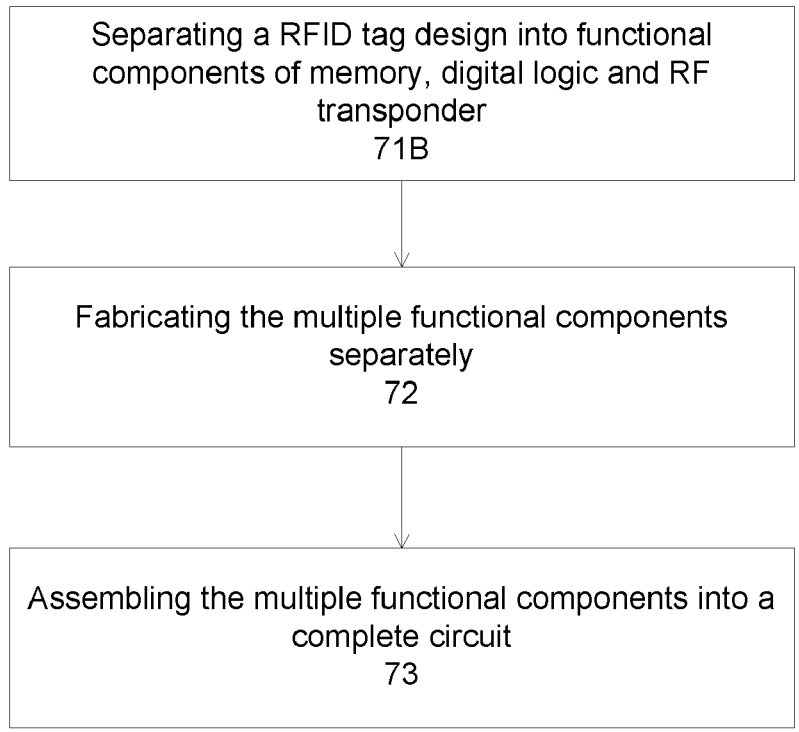
FIG. 5B illustrates an exemplary process of separating a RFID tag design.

FIG. 5B illustrates an exemplary process of separating a RFID tag design. Operation 71B separates the RFID tag design into multiple functional components: a memory component, a digital logic component, and a RF transponder component. Operations 72 and 73 fabricate and assemble the multiple functional components into a complete RFID tag.

The multiple functional components can be assembled in a stacked configuration, in an at least partially stacked configuration, in a coplanar configuration, or in an at least partially coplanar configuration. The invention is not limited to placing only one chip on top of the larger bottom one: two or more may be placed in this manner. In general they will not overlap each other; however it is possible for there to be more than two layers. If there are only two layers, connection may conveniently be made between the two (or more) chips by such means as metal to metal bonding, as is marketed, for example, by Datacon Technology GmbH, Radfeld, Austria, under the name of Advanced Chip-to-Wafer-Technology. Alternatively, anisotropic conductive adhesives which are well known in the electronic packaging art may be used. Isotropic conductive adhesives may be used effectively by printing them on at least one chip of the pair over the connector pads. Yet another alternative uses non-conductive adhesives which contract on curing, exerting a force which pulls the chips together and makes electrical contact between pads on the two chips due to mechanical force. Conventional flip chip techniques using solider bumps may also be used, although this results in wider spacing between the upper and lower components, and may require underfill adhesives. Underfill adhesives may be required even if the spacing is smaller (as with isotropic conductive adhesives, for example). In all of these cases, the process is facilitated by the fact that typically only a few conducting connections between the pair of chips are required; for example in the case of a separate power supply chip (e.g. rectifier), only two connections are needed.

In an embodiment, the present invention discloses RFID devices and methods for fabricating an RFID circuit, comprising separating the RFID circuit into a digital logic component, a memory component and an RF component, and then fabricating the multiple components separately. The components have bond pads for connection with each other, and the components, when ready for assembling into the complete RFID circuit, have a lateral dimension less than 1 mm and a thickness less than 100 microns. In an aspect, the components do not require packaging, and can be assembled in wafer form through bond pad connections. In an aspect, the present invention discloses the process of assembling small functional components into a complete circuit, preferably by a transfer printing process utilizing photosensitive thermally decomposable adhesive. In an aspect, the multiple functional components are assembled to form a complete integrated circuit, with the assembling process comprising a thermal adhesion transfer process, or bonding corresponding bond pads between the multiple functional components. The multiple functional components can be assembled in an at least partially stacked configuration or an at least partially coplanar configuration.

One of the problems faced by conventional flip chip processes is the lack of complete planarity and flatness of the two surfaces which are being connected, especially since the lateral size of the chip is often of the order of centimeters (for example, 0.5 to 3 cm), and when such a chip is placed on a conventional printed wiring board (made of various polymer and polymer composite laminates), some parts of the chip will be touching the board, while other parts may be many μms or tens of μms away. The connection process must nevertheless make uniform connections across the entire chip. In addition, there is no mechanical access to the bonding region after the package has been assembled and made ready for bonding.

In the present invention, the use of dice which are much smaller than the prior art is enabled. When the lateral dimension is only a few hundred micrometers or less, the uniformity of contact of two dice face to face is much greater. When both surfaces are on silicon dice coming from a processed wafer, the flatness and uniformity of contact is still greater. Thus, flip chip connection technologies can be used which require smaller spacing than could otherwise be used. Likewise, face-up assembly and connection technologies results in more mechanically stable, flexible assemblies.

In an embodiment, the present invention discloses assembly structures and processes to place chips with their faces upward. The present invention further addresses the bond pad requirements for future products. Conventional flip chip bond pad periodicity is usually at least 50 μm or more. Printing techniques, such as inkjet printing, which may be used for depositing dots of conductive adhesive or molten solder, cannot easily reach resolutions below about 20 μm. If there are only two I/O connections in a chip 100 μm on a side, this is an acceptable bond pad size. However, if there are several I/O pads, they would soon occupy all the available area and more, and a flip-chip process would not be feasible. Thus, in an embodiment, the present invention discloses chip to chip interconnect techniques for stacked chips which use less area; preferably these techniques can make use of pads as small as 5 μm or even less, preferably down to 2-3 μm.

In an embodiment, through-silicon via (TSV) technology is rapidly being developed and is now commercially available. It generally involves drilling vias by some means (mechanical or laser, for example), and then plating the via with Cu. These vias may be relatively narrow, but are constrained by aspect ratio. For example, if the thickness of the substrate is 25 μm, a 5 μm diameter represents a 5:1 aspect ratio, which is not easy to fill with uniform metal deposits by electrodeposition. In addition, electrodeposition is time-consuming and not well suited to high-speed roll-to-roll processing.

When one has a small number of connections through a thin die, the conducting paths may advantageously be formed by filling the vias with various printable conductive materials, for example sinterable metal particles, decomposable conductor precursor inks, or metal mixtures which, when fully alloyed, have a melting point (and mechanical strength) which is greater than that of the lower-melting component. Examples of the last class of materials are mixtures of Sn (m.p. 232 C) or Ga (m.p. 30 C) with higher melting point metals such as Cu. These mixtures may be sintered by a focused laser beam to minimize heating of the rest of the chips, or they may be sintered by purely thermal sources if the components can withstand this temperature for a short time as would be used in a typical soldering process. Liquid metal with a melting point up to about 230 C may also be dispensed from heated inkjet printheads such as are sold by Microfab, of Plano, Tex. The via diameter must be large enough to match the minimum droplet size from inkjet printers, which is about 20 micrometers. For chips with small numbers of I/O connections, this condition will be met.

In an embodiment, the present invention discloses assembly structures and processes for higher density I/O pads. One preferred approach deposits conductor lines which pass over the edge of the upper chip and make contact to pads on the lower chip. In conventional packaging, wirebonding is used in this manner. Wirebonds may be used in the present invention as long as there are not too many of them, since they are time-consuming and comparatively expensive to form. For example, a commercially available wirebonder sold by Kulicke & Soffa, of Willow Grove, Pa., can make about 12-16 connections per second. Wirebonders can handle wires with diameters of 25 μm or less.

Figure 6A:
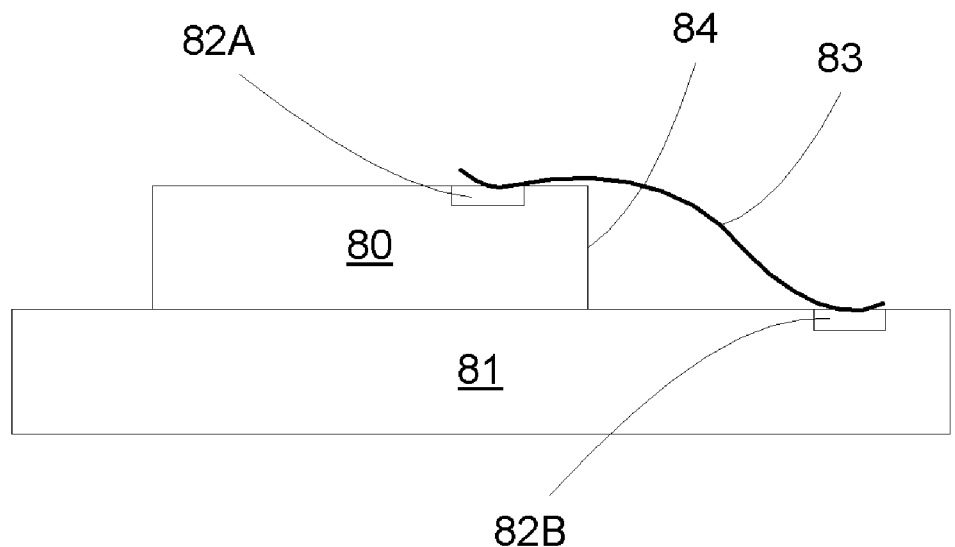
FIGS. 6A and 6B illustrate cross section and top views of an embodiment of conduction lines connecting a top chip to a bottom chip.
Figure 6B:
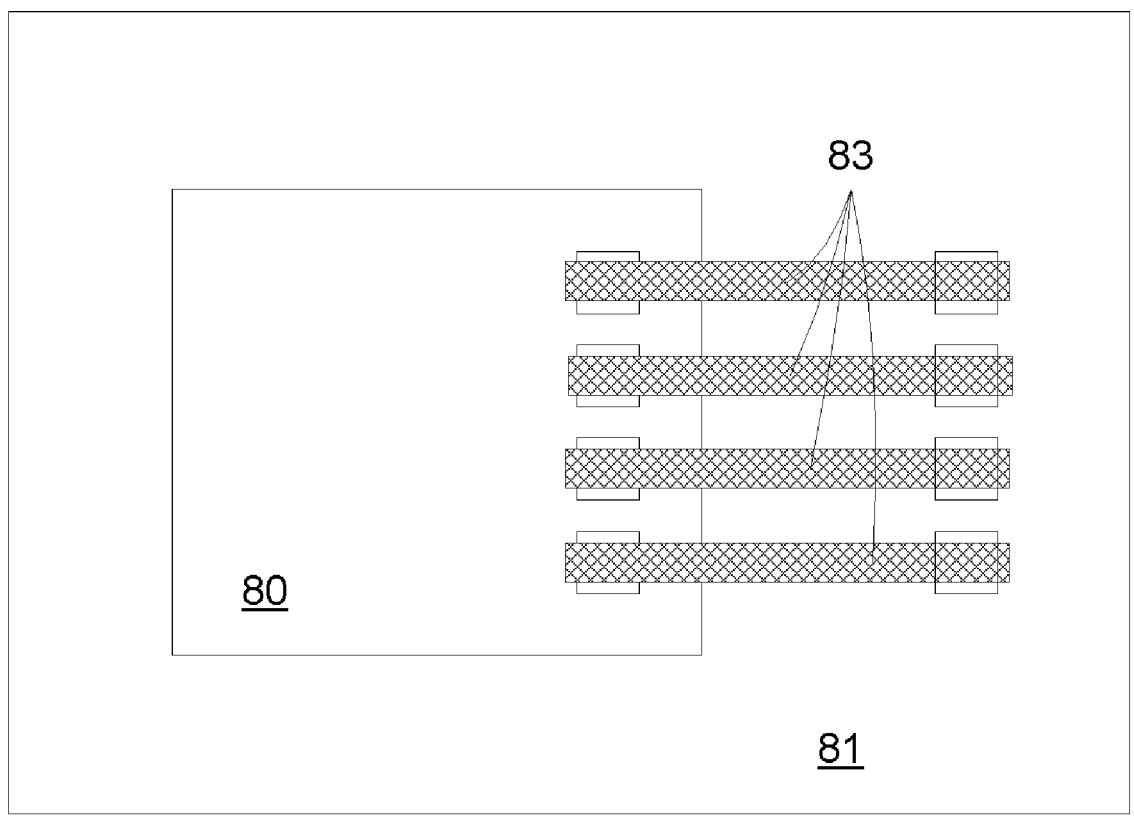

FIGS. 6A and 6B illustrate cross section and top views of an embodiment of conduction lines 83 connecting a top chip 80 to a bottom chip 81. Both chips have their face upward, showing bond pads 82A and 82B on the upper surfaces of the chips. Lines of only a few μm in width can be conveniently formed by aerosol printing, using for example a printer sold by Optomec, Inc., of Albuquerque, N. Mex. They may also be formed by laser processing, as disclosed, for example, in co-pending applications assigned to Terepac Corp. If such lines are written from small pads (of a few micrometer lateral extent) to corresponding pads on the lower chip, many I/O connections can be formed even in a 100 μm chip.

One problem with writing such lines over the edge of a chip is that electrical discontinuity may be caused by the sharp chip edge 84, and the sidewall may be incompletely covered. In an embodiment, the present invention discloses some angle forming a gradual transition at the sidewall of the chips. One way to achieve such an angle is to use laser ablation, forming a gradual slope or ramp (over at least a few μms) from the surface of the top chip to that of the bottom. Such a laser ablation process is facilitated by making the top chip relatively thin, for example a few tens of μms or less. After the formation of gradual slopes, electrical connection can be formed by a transfer printing process, such as that of U.S. Pat. No. 6,946,178 and U.S. Pat. No. 7,141,348.

Figure 7A:
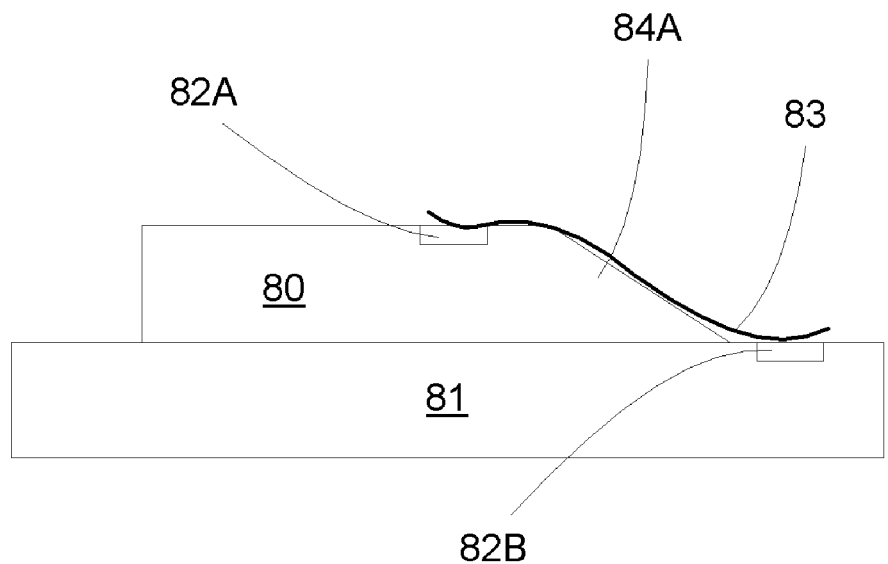
FIGS. 7A and 7B illustrate exemplary configurations of gradual slopes on a top chip.
Figure 7B:
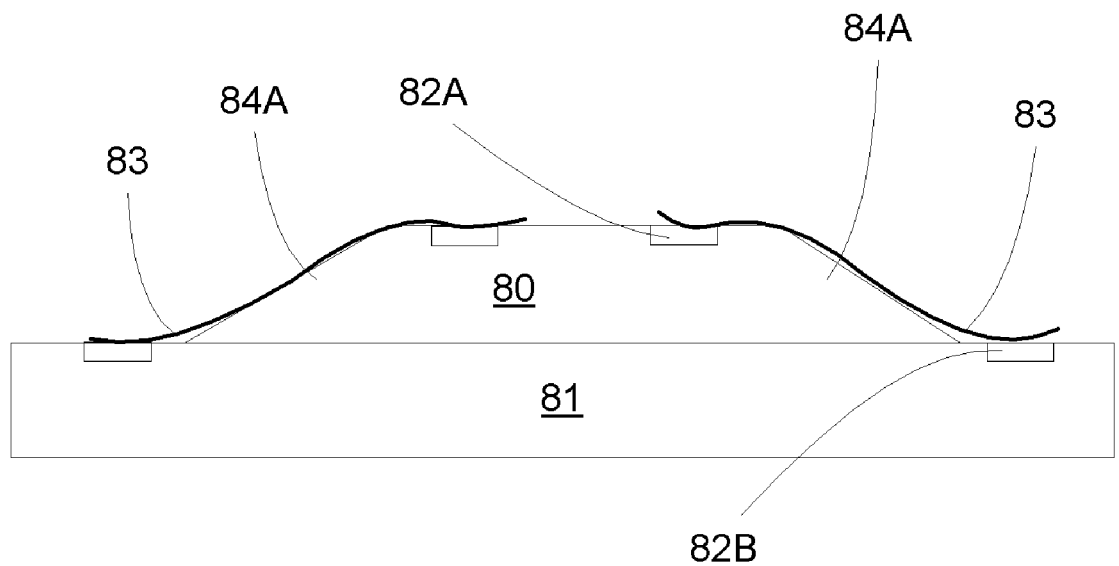

FIGS. 7A and 7B illustrate exemplary configurations of gradual slopes 84A on the top chip 80. In FIG. 7A, one slope 84A is formed on the top chip 80, allowing a gradual support for the electrical connection 83 between the bond pad 82A of the top chip 80 to the bond pad 82B of the bottom chip 81.

FIG. 7B illustrates chip 80 with two gradual slopes 84A, supporting multiple sides of electrical interconnects 83.

Figure 8A:
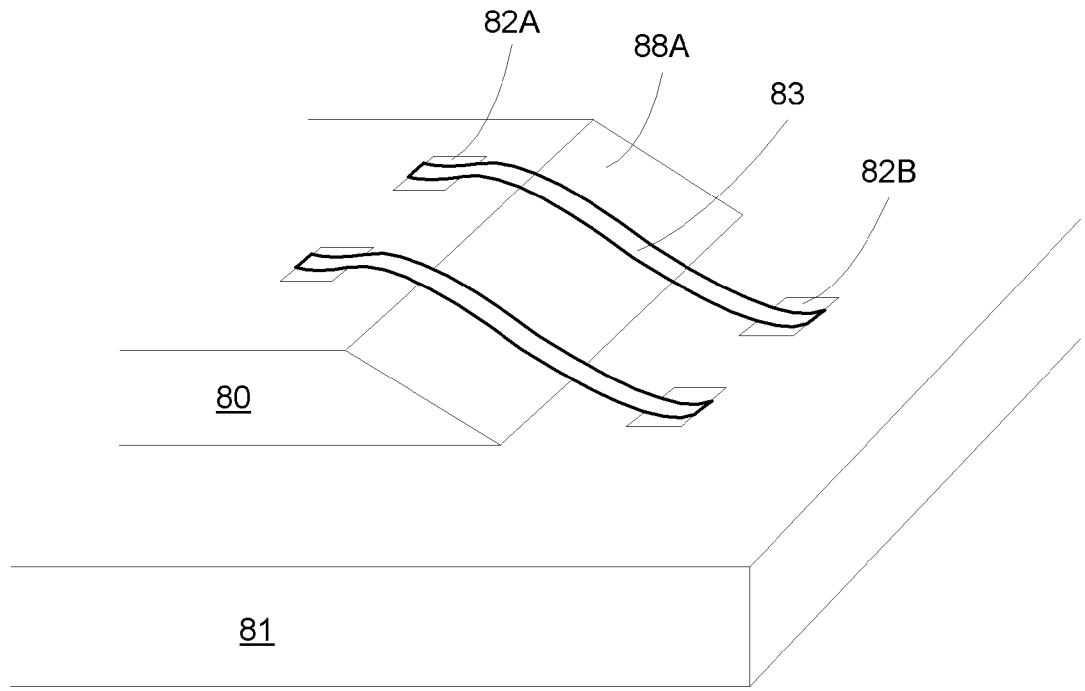
FIGS. 8A-8B illustrates various exemplary structures and processes of forming the gradual slope on a top chip.

FIG. 8A illustrates an exemplary structure and process of forming the gradual slope 88A on top chip 80. One side edge of the chip 80 is cut along the edge to allow the gradual transition for a plurality of interconnects 83 connecting the bond pads of the top chip to the bottom chip. Other edges can also be cut (not shown). A laser beam can pass along the edge of the top chip 80 to ablate the material to form the sloped edge 88A.

Figure 8B:
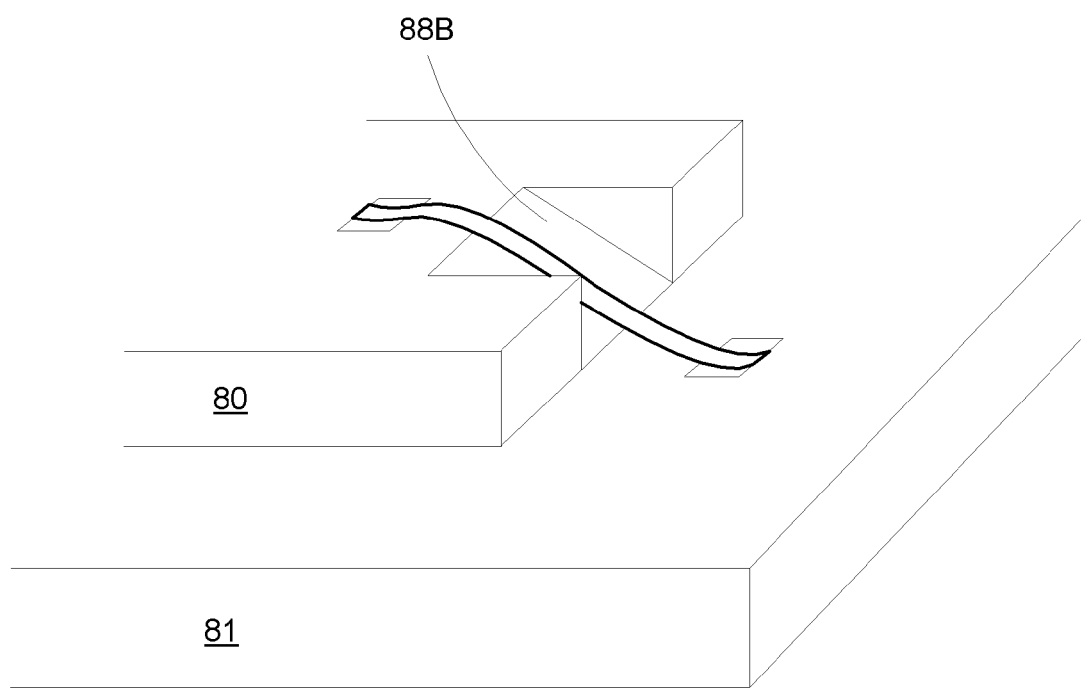

FIG. 8B illustrates another exemplary structure and process of forming the gradual slope 88B on top chip 80. The side edge of the chip 80 is cut along the direction of the interconnect 83 to provide a gradual slope for the interconnect. One or more interconnects 83 can be provided. A laser beam can pass along the direction of the bond pad connection, typically perpendicular to the chip edge, ablating the material to form the gradual slope.

Figure 9A:
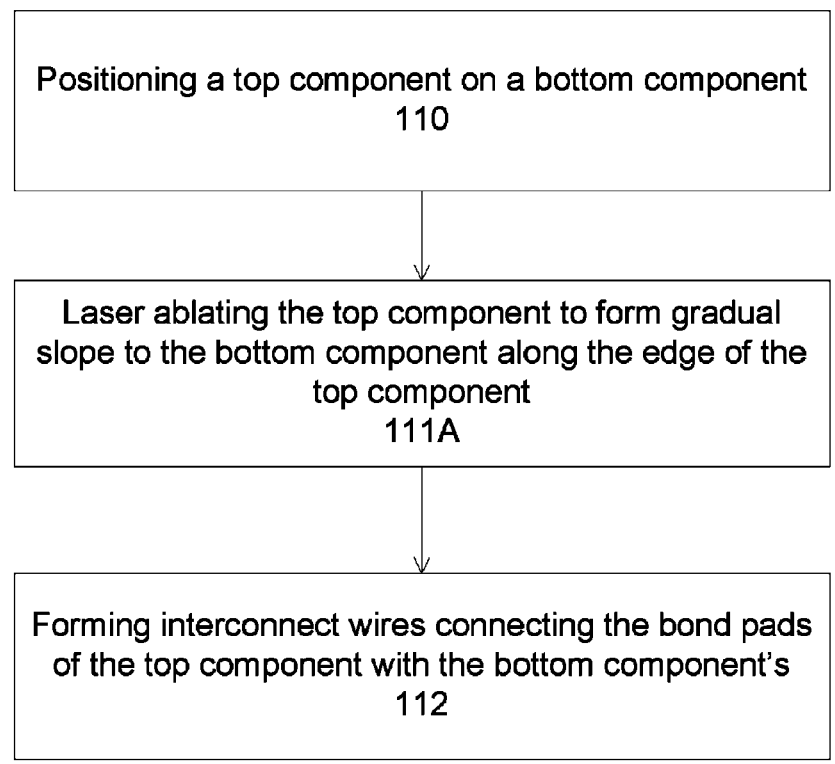
FIGS. 9A-9B illustrates various exemplary flowcharts for a formation of the slope to facilitate the connection between the chips.

FIG. 9A illustrates an exemplary flowchart for a formation of the slope to facilitate the connection between the chips. Operation 110 positions a top component (or chip) on top another component (or chip). The components have bond pads on the top surface, to be connected by interconnect wires. The top component is preferably positioned to align the bond pads between the top and bottom components, for example, the bond pads of the top component are arranged to be parallel to the corresponding bond pads of the bottom component. Operation 111A forms gradual slope along an edge of the top component, preferably along an edge that is closest to the bond pads. In an aspect, the slope formation is accomplished by a laser ablation process, running a laser along the edge of the top component. Operation 112 forms interconnect wires connecting the bond pads of the top component to the bond pads of the bottom component.

Figure 9B:
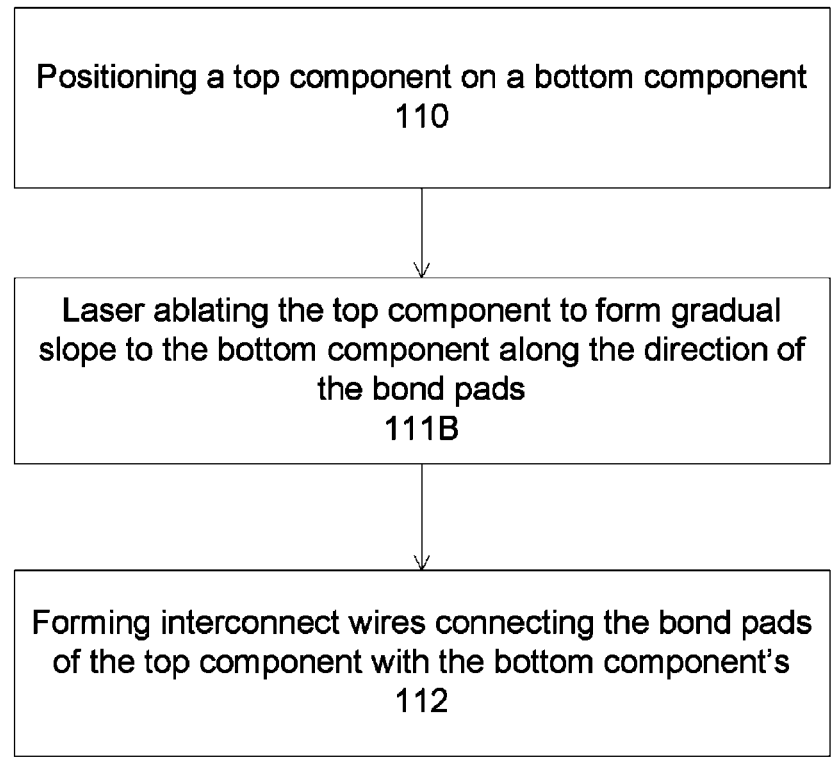
Figure 10A:
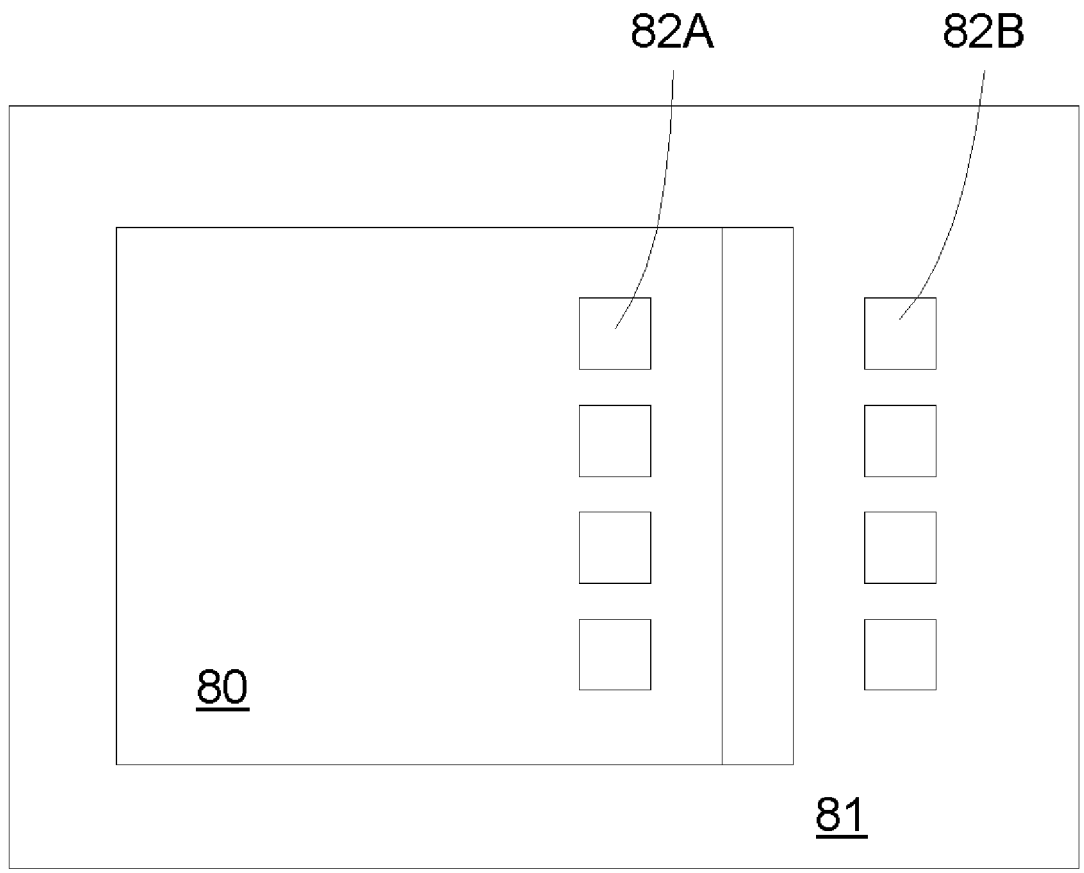
FIGS. 10A-10D illustrate an exemplary process for simultaneously forming a plurality of interconnect wires.
Figure 10B:
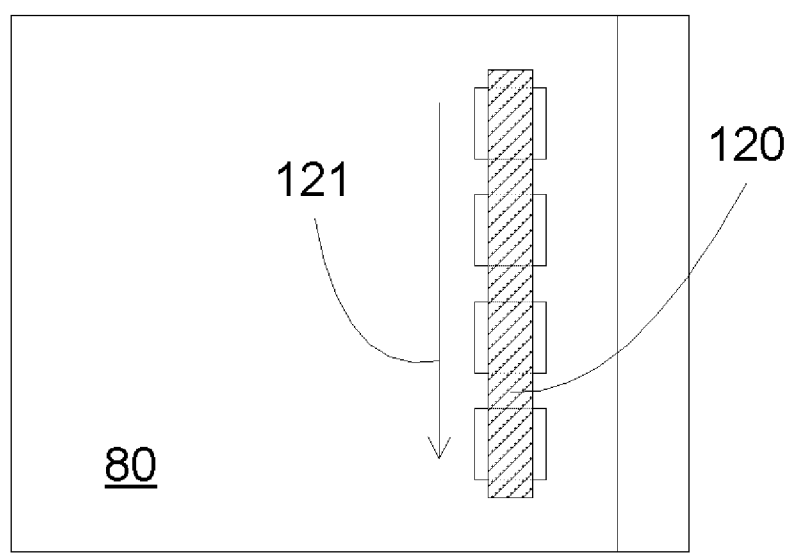
Figure 10C:
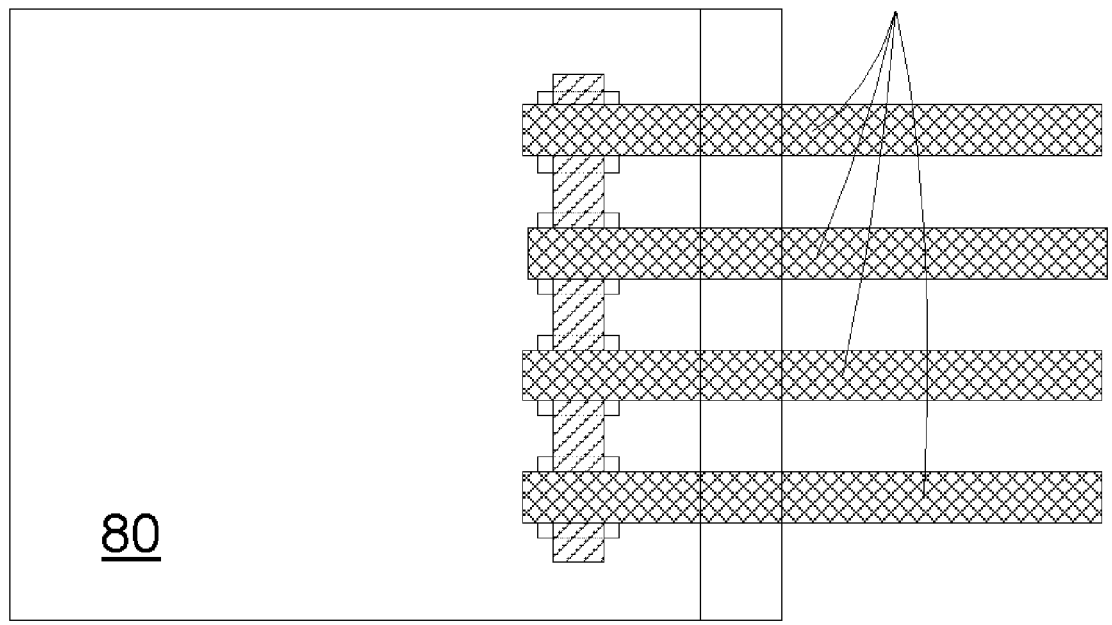
Figure 10D:
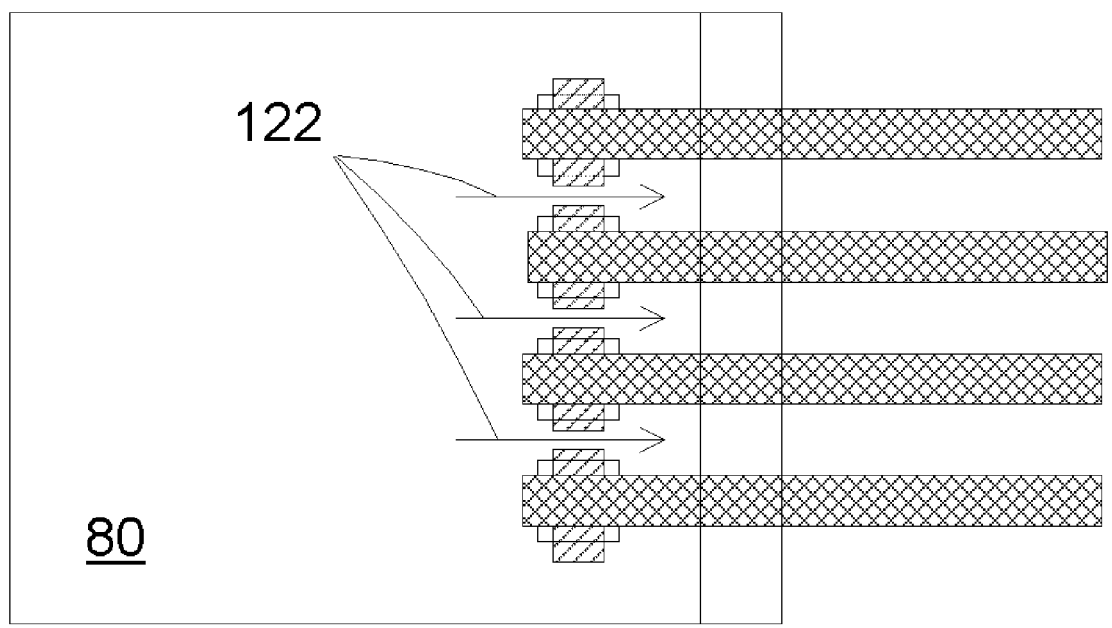
Figure 11A:
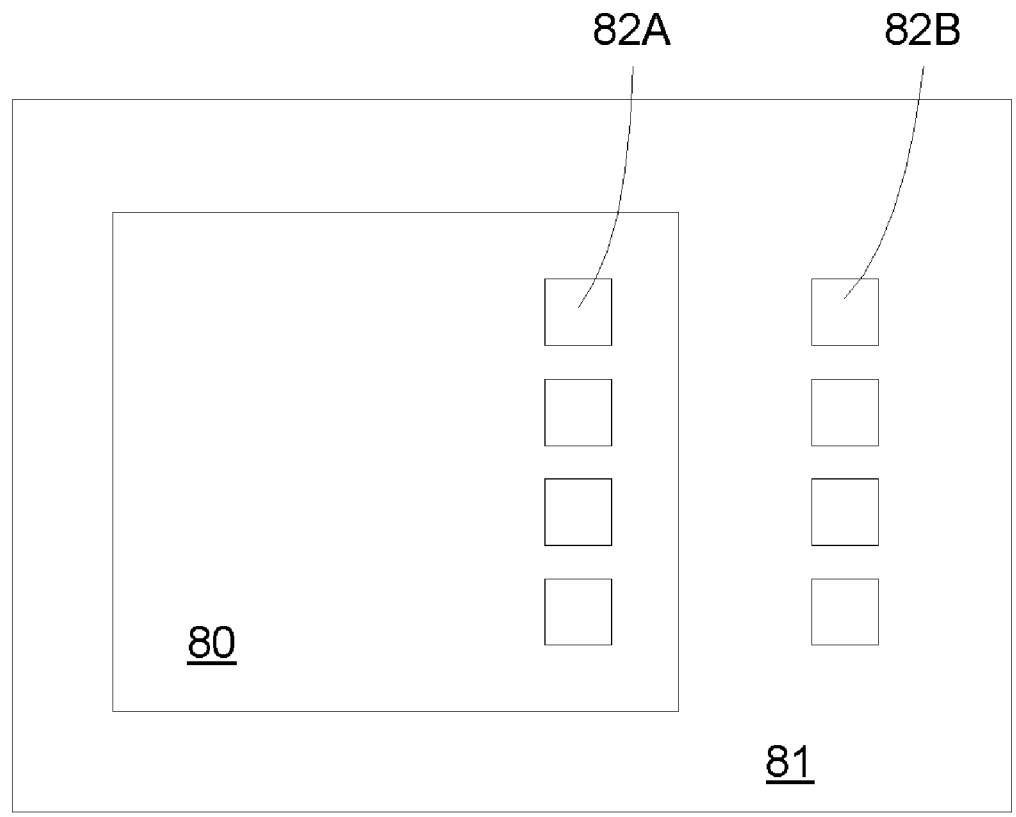
FIGS. 11A-11D illustrate another exemplary process for simultaneously forming a plurality of interconnect wires.
Figure 11B:
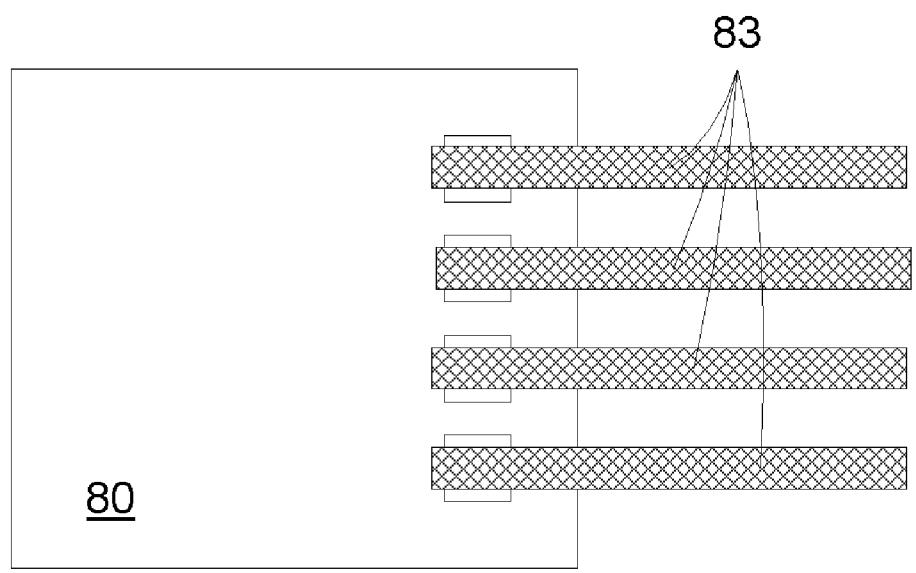
Figure 11C:
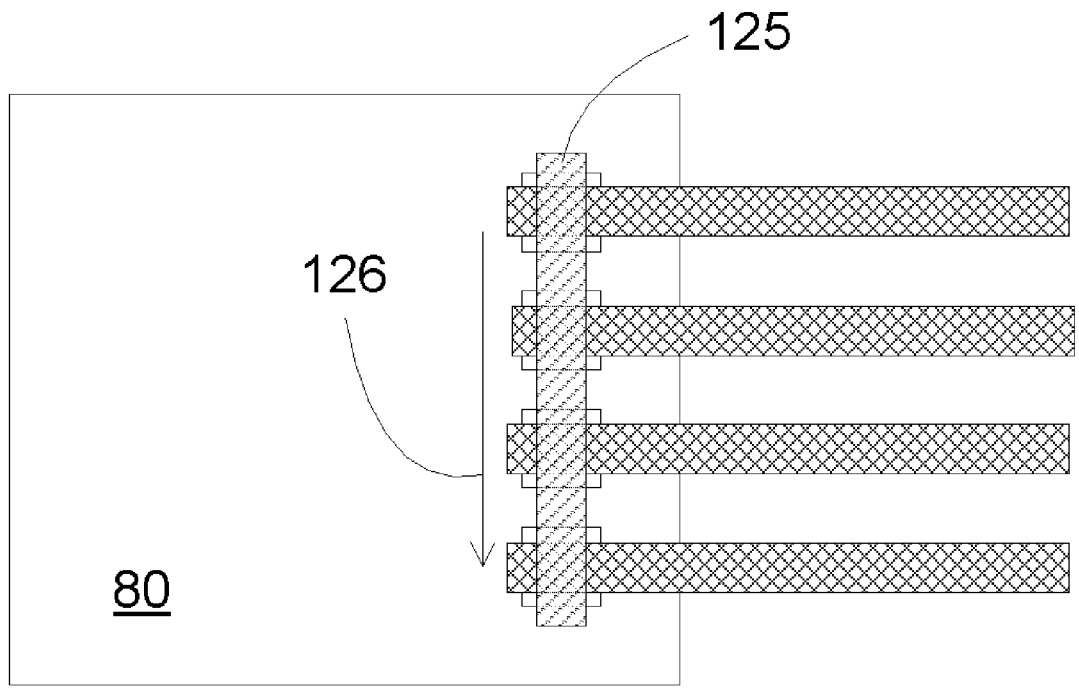
Figure 11D:
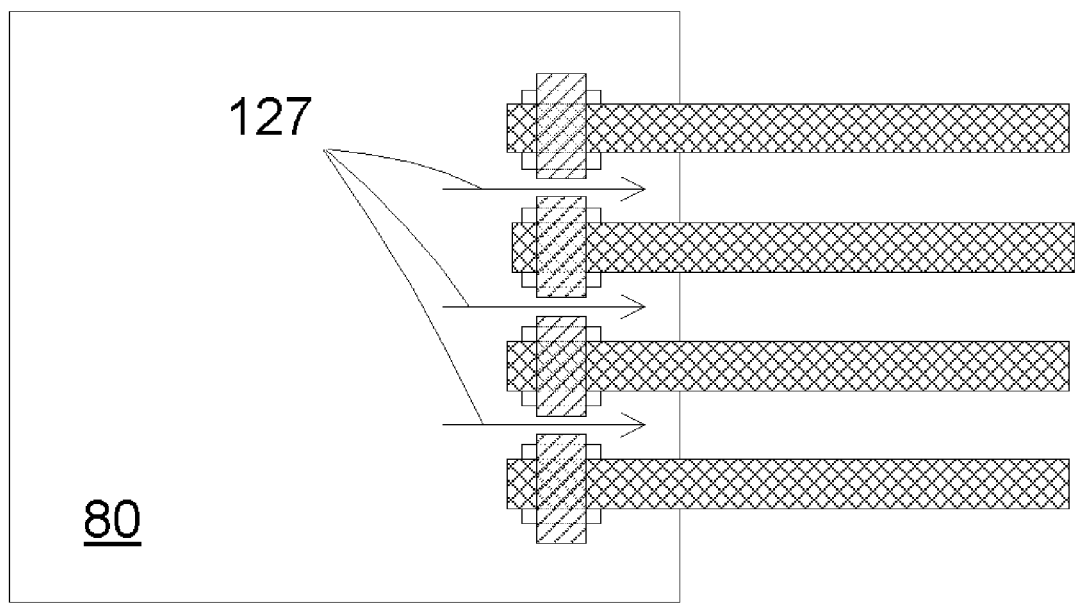

FIG. 9B illustrates an exemplary flowchart for a formation of the slope to facilitate the connection between the chips. After positioning a top component on top of a bottom component (operation 110), operation 111B forms a gradual slope along the direction connecting the bond pads, from the bond pad on the top component to the corresponding bond pad on the bottom component. The slope line is typically perpendicular to the edge of the top component, since the bond pads of the top component are normally arranged along the edge. The width of the slope line is wide enough to accommodate a predetermined number of interconnect wires. In an aspect, the slope formation is accomplished by a laser ablation process, for example, running a laser along the direction of the interconnect wires, perpendicular to the edge of the top component. Multiple laser passes can be performed to achieve a proper width, for example, to allow positioning a number of interconnect wires. After the formation of the gradual slope, interconnect wires are formed to connect the bond pads (operation 112).

In an embodiment, the present invention discloses methods and structures for interconnecting bond pads between integrated components, comprising forming a beveled slope of a top integrated component on a bottom integrated component. An interconnect wire is placed over the beveled slope, linking a top bond pad of the top integrated component to a bottom bond pad of the integrated component. The interconnect wire is then welded to the bond pads. The component can have one or more beveled slopes. In an aspect, the top integrated component is positioned on the bottom integrated component before forming the beveled slope. In another aspect, the top integrated component is positioned on the bottom integrated component after forming the beveled slope. The beveled slope can be formed by laser ablating the edge of the top integrated component, along the edge of the top integrated component. The beveled slope can formed by laser ablating from the top bond pad to the bottom bond pad, running from the top bond pad to the bottom bond pad. The present beveled slope can facilitate placing interconnect wires over the edge of the top integrated component. The laser ablation process typically comprises a laser providing concentrated energy to shape the integrated components, for example, by evaporating and/or bombarding the material under the laser focus points. Other methods for beveling can be utilized, such as water-jet guide laser.

In an aspect, placing interconnect wires comprises printing interconnect lines, where the beveled slope allows printing of interconnect lines over the edge of the top integrated component. In another aspect, multiple interconnect wires are placed over the beveled slope simultaneously. Also multiple interconnect wires are welded to the bond pads of an integrated component simultaneously.

In an embodiment, the present invention discloses a beveled slope integrated component for facilitating forming interconnect wires between integrated components comprising a beveled slope edge of the integrated component in the vicinity of the bond pads, the beveled slope running from the surface having the bond pad to the other surface of the integrated component. The beveled slope edge can have a rounded corner. In an embodiment, the present invention discloses a chip assembly comprising a bottom integrated component located under the beveled slope integrated component with one or more interconnect wires over the beveled slope, linking the bond pad of the beveled slope integrated component to the bottom bond pad.

The bonding process of the interconnect wires onto the bond pads can be either ultrasonic or laser welding. In an embodiment, the present invention discloses a bonding process for dense interconnection, bonding a plurality of interconnect wires to a plurality of bond pads at a same time. An optional separation process can be performed to separate the wires, to prevent any cross connection. For example, a line of conductive adhesive can be formed along the bond pads before positioning the interconnect wires to the bond pads. Alternatively, after the wires are positioned on the bond pads, a laser beam may be run along the direction of the bond pads, bonding the wires onto the bond pads.

FIG. 10 illustrate an exemplary process for simultaneously forming a plurality of interconnect wires. FIG. 10A shows a top chip 80 positioned on a bottom chip 81, with the bond pads 82A of the top chip aligned with the bond pads 82B of the bottom chip. Gradual slope can be used to facilitate the wiring connections. Alternatively, the bond pads between the two chips can be positioned according to an assembly process, which might or might not be parallel as shown in this figure. After positioning the two chips, a line of isotropic conductive adhesive 120 may be printed at the ends of the wires, in a direction 121 perpendicular to the long direction of the wires (FIG. 10B). This adhesive is designed to electrically connect the wire ends to the underlying pads, but it also connects the pads to each other. In addition to isotropic conductive adhesive (e.g., commercially available Ag-filled epoxies or the like), any other form of printed conductor may be used, such as printable nanoparticulate Ag or other metal precursor inks. The laser may be used to cure the ink. A plurality of wires 83 are positioned on the corresponding bond pads, on the conductive adhesive (FIG. 10C). The connections between the bond pads are then separated (FIG. 10D), for example, along the direction 122 of the interconnect wires. In an aspect, a laser may be used to form cuts between the pads, thereby isolating them and leaving the desired connections only. The same laser used to cure the ink can be used to ablate the cuts (using different conditions between curing and cutting, for example, lower power for curing and higher power for ablating). This configuration illustrates the bonding process for a chip stacked configuration, but other configurations are possible, for example, side-by-side, partially stacked, or partially co-planar. The process can be repeated for the other end of the connection wires, bonding one end after the completion of one end, or bonding two ends simultaneously. For example, the conductive adhesive can be applied to the bond pads of both chips, forming two adhesive lines, one for each chip. The wires can be placed, and both ends of the wires can be pushed to the adhesive to form contact. Laser or ultrasonic bonding can be applied to both ends of the wires.

FIG. 11 illustrate another exemplary process for simultaneously forming a plurality of interconnect wires. FIG. 11A shows the positions of the top chip 80 on the bottom chip 81. In FIG. 11B, a plurality of interconnect wires 83 are positioned on the corresponding bond pads before a bonding process, such as ultrasonic, bonds the plurality of wires onto the bond pads, preferably simultaneously. For example, a laser beam can travels in the direction 126 along the bond pads, forming a bonding line 125, bonding the multiple interconnect wires 83 to the bond pads 82A (FIG. 11C). A separation process, such as a laser ablation cutting, can cut the connection 127 between the adjacent bond pads (FIG. 11D). In an aspect, the laser beam might skip the spaces between the bond pads, for example, by a mirror reflection assembly, so that the adjacent bond pads are not electrically connected, and a separation process might not be needed. Other alternatives and options can be applied.

Figure 12A:
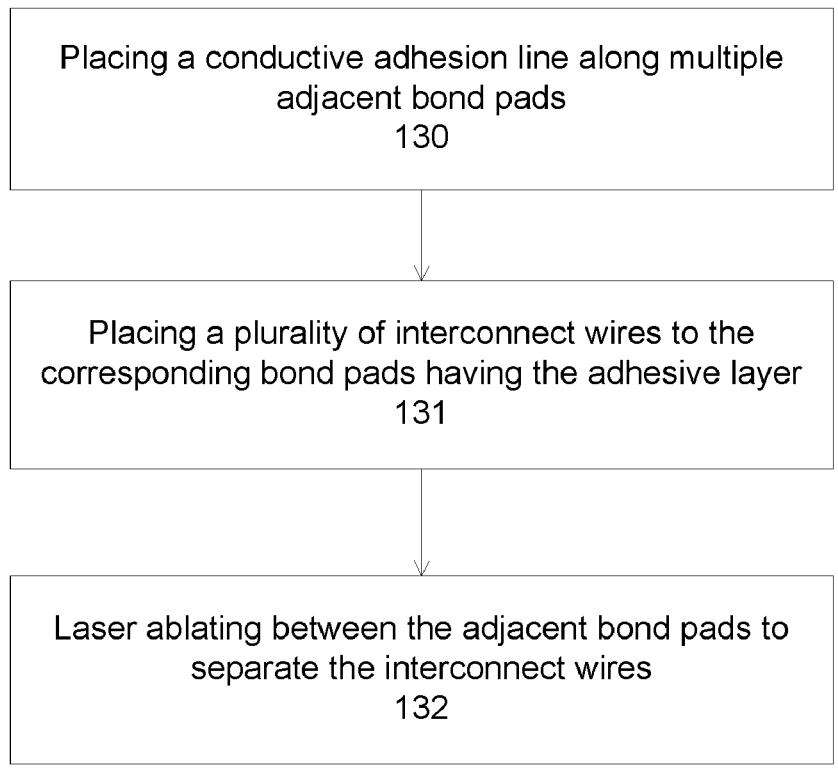
FIGS. 12A-12B illustrate various exemplary flowcharts for the bonding of multiple interconnect wires to the corresponding bond pads.

FIG. 12A illustrates an exemplary flowchart for the bonding of multiple interconnect wires to the corresponding bond pads. Operation 130 places a conductive adhesive line along the multiple adjacent bond pads, for example by a printing process. Optional laser curing process can be performed for curing the printed ink. The conductive adhesive is typically continuous, connecting the adjacent bond pads along an edge of the chip. The conductive adhesive can be applied to the bond pads at one or both ends of the interconnect wires. Operation 131 places a plurality of interconnect wires onto the corresponding bond pads that already have the conductive adhesive. An optional forcing element can be used to push the wires down into contact with the bond pads. Suitable forcing elements include rollers, pins and compressed air. One, more or all of the contacts along one side of a die can be pushed into place by the same forcing element at once. The interconnect wires can make contact with one row of bond pads at one end of the interconnect wires. Alternatively, the interconnect wires can make contact with both rows of bond pads at both ends of the interconnect wires. Also, after the interconnect wires make contact with one row of bond pads, the process can go back to operation 130 to place another conductive adhesive line onto the other row of bond pads on the other chip. The process can continue with operation 131 for placing the other end of the interconnect wires onto this bond pads with adhesive. Operation 132 separates the connected bond pads, for example, by laser ablating the spaces between the adjacent bond pads.

In an embodiment, the present process bonds the rows of bond pads in sequence, meaning bonding one row of bond pads to one end of the interconnect wires before starting on another row of bond pads to bond the other end of the interconnect wires. For example, a line of conductive adhesive is printed on a row of bond pads, then the interconnect wires are placed on the adhesive at one end to bond the interconnect wires to the corresponding bond pads. After separating the adjacent bond pads, for example, by a laser ablation process, another line of conductive adhesive is applied on another row of bond pads, and the process is repeated for the other end of the interconnect wires.

In another embodiment, the present process bonds the rows of bond pads in parallel, meaning two rows of bond pads are processed together to bond both ends of the interconnect wires simultaneously. For example, two lines of conductive adhesive are printed on two opposite rows of bond pads, then the interconnect wires are placed on the adhesive lines at both ends to bond the interconnect wires to the corresponding bond pads. A laser ablation process then separates the adjacent bond pads in both rows. Other variations of the present process can be used, such as bonding one end of the interconnect wires to one row of bond pads, repeating the bonding process with the other end of the interconnect wires before laser ablation separating the adjacent bond pads on both ends of the interconnect wires.

Figure 12B:
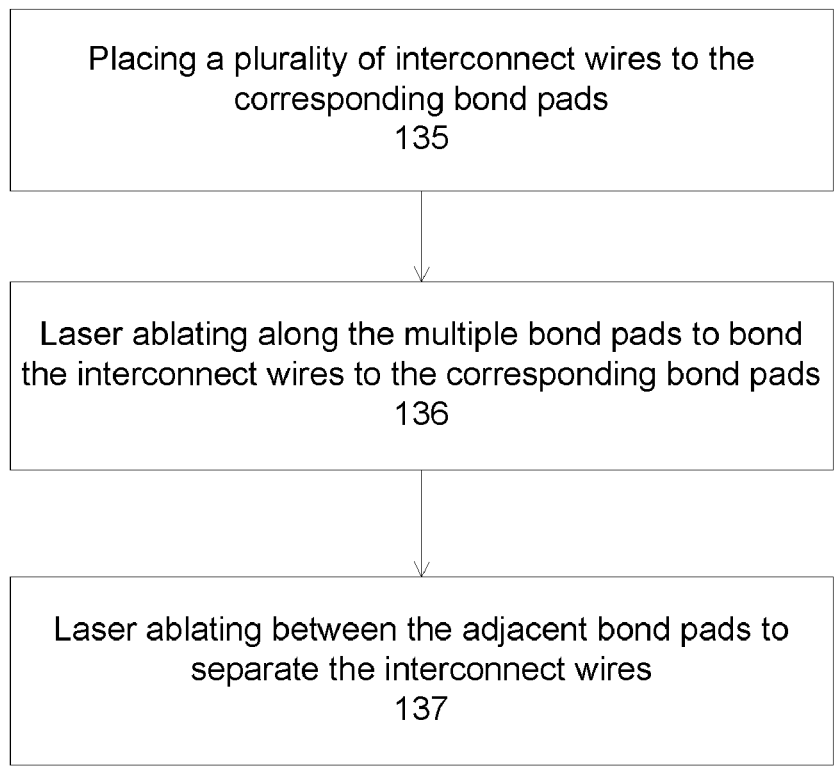
Figure 13A:
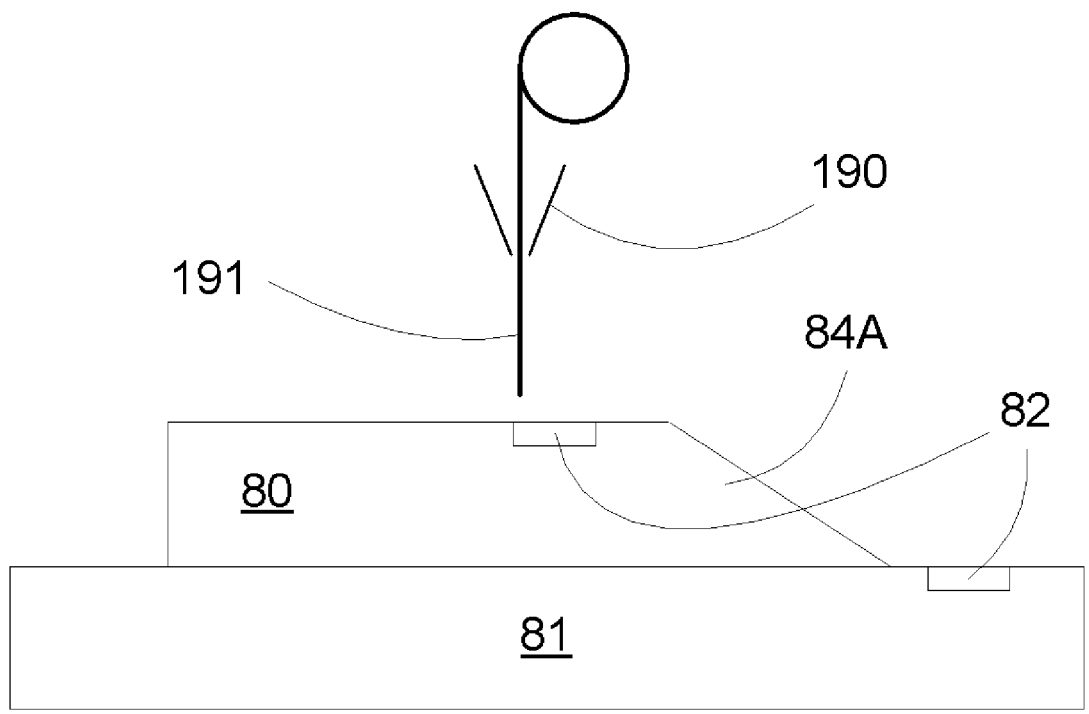
FIGS. 13A-13E illustrate an exemplary process flow for the combination of wirebonder and laser cutting/welding.
Figure 13B:
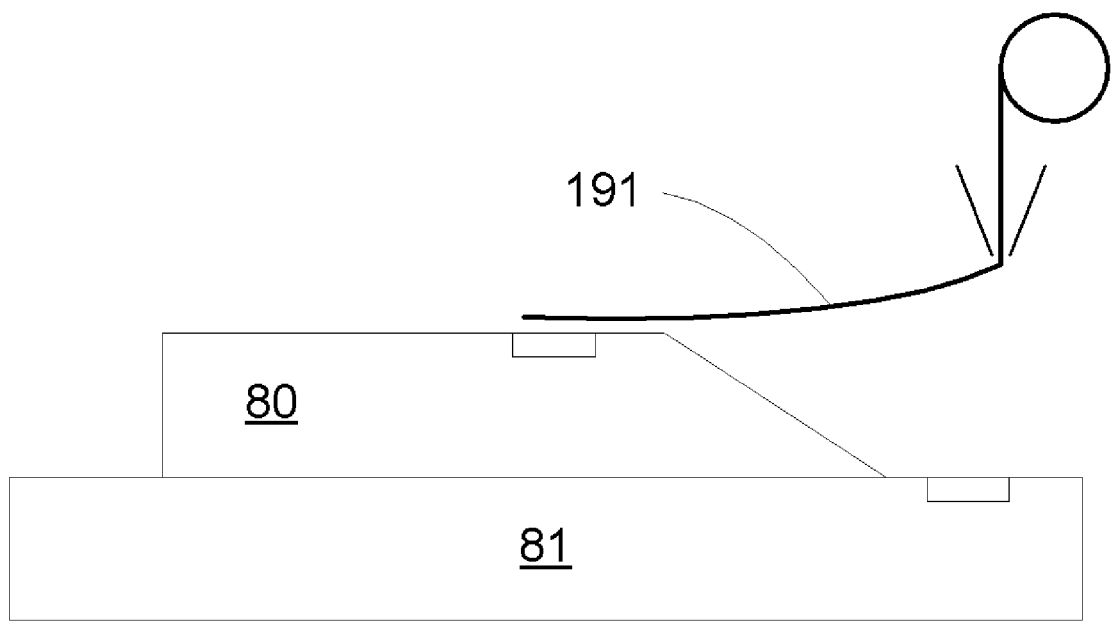
Figure 13C:
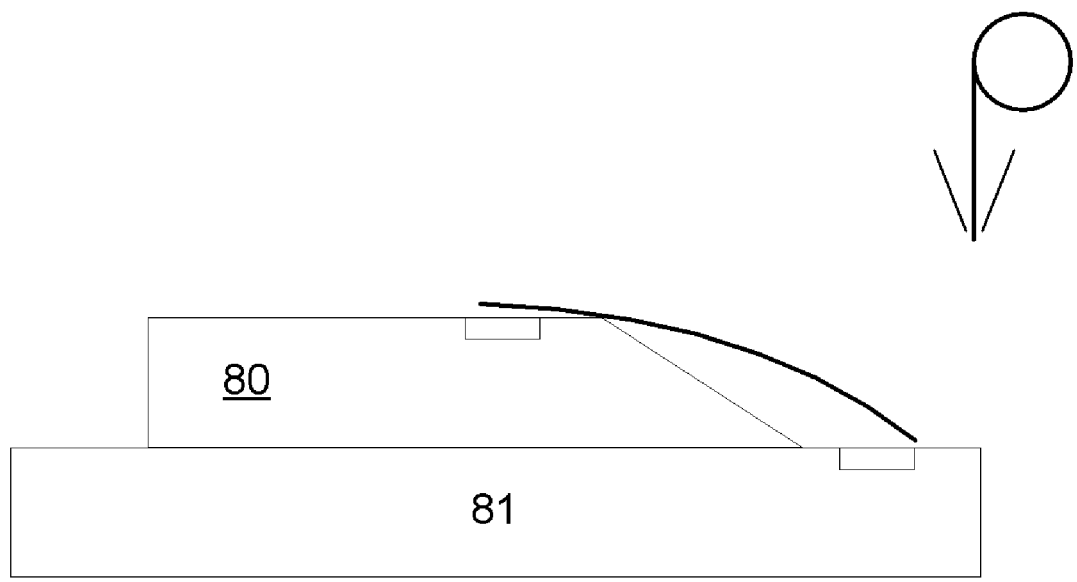
Figure 13D:
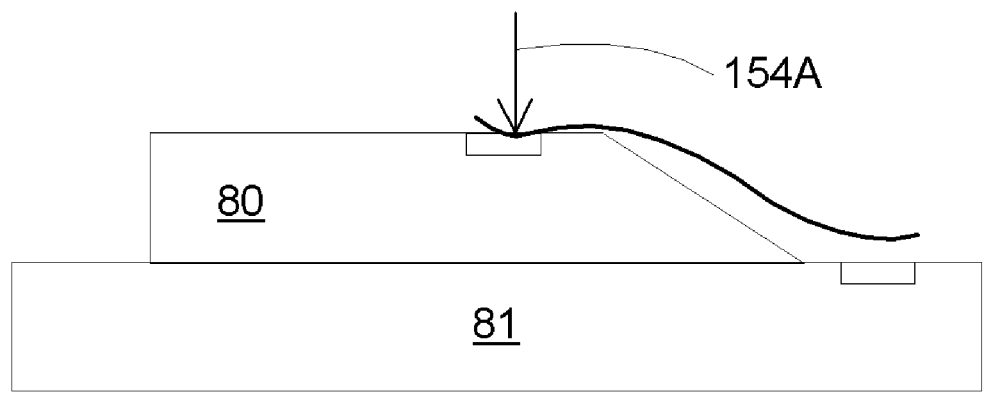
Figure 13E:
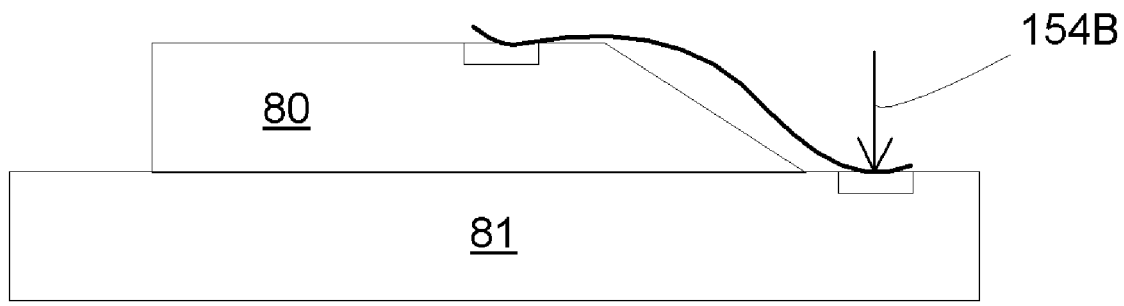
Figure 15A:
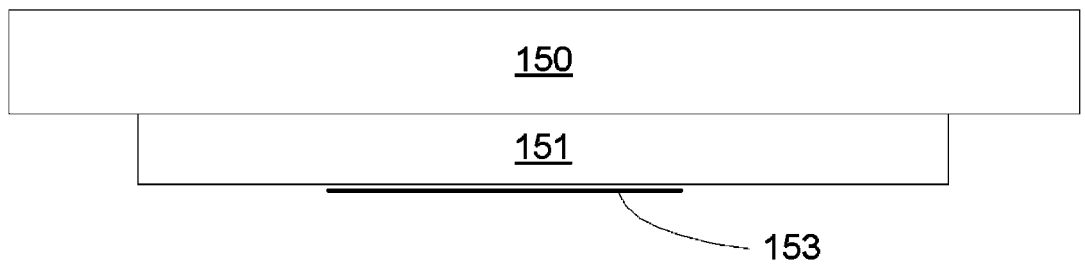
FIGS. 15A-15E illustrate an exemplary printing process for interconnect wires.
Figure 15B:
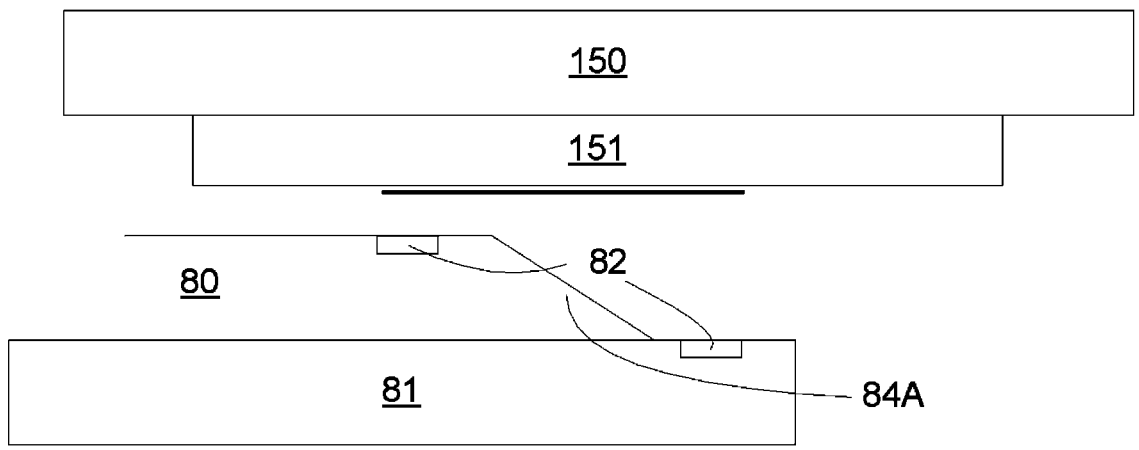
Figure 15C:
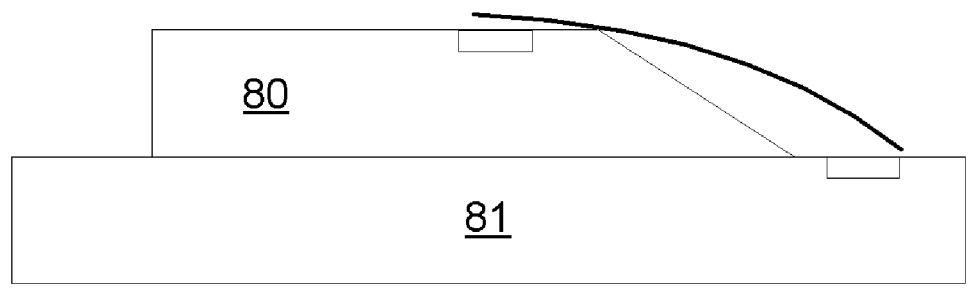
Figure 15D:
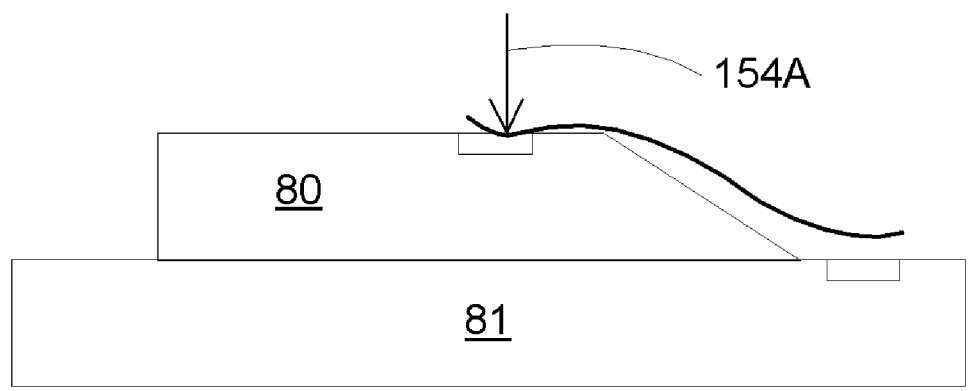
Figure 15E:
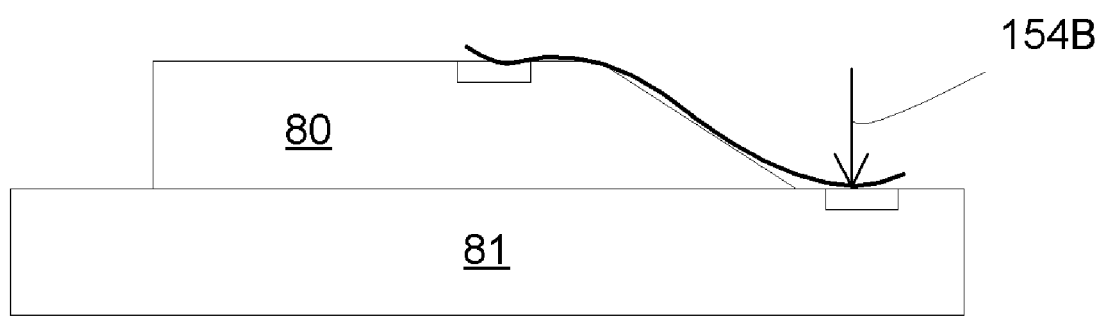

FIG. 12B illustrates another exemplary flowchart for the bonding of multiple interconnect wires to the corresponding bond pads. Operation 135 places a plurality of interconnect wires onto the corresponding bond pads. An optional forcing element can be used. Operation 136 bonds the interconnect wires to the corresponding bond pads, for example, by ultrasonic bonding or laser bonding. Depending on the bonding process, the adjacent bond pads may or may not be electrically connected. An optional separation process between the adjacent bond pads can be performed to separate the electrical connections between adjacent bond pads. The separation process can be a laser ablation cutting along the length of the interconnect wires, in the spaces between the adjacent bond pads.

The present multiple wire bonding process can be performed after the chips are positioned in place, for example, by a stacked configuration, a partial stacked configuration, a co-planar configuration, or a partial co-planar configuration. Alternatively, the present multiple wire bonding process can be performed on a single chip, forming connections to the adjacent bond pads of a chip, and leaving the other ends of the connections to be connected at a later time.

Suitable materials for the wires include all good conductors, preferably with superior ductility as well as high conductivity and amenable to making good welded connections. Preferred choices would include Ag, Cu, Al, Ag, and Sn, as well as alloys of these materials. The wires may be coated with other alloys for weldability. Metal filaments of a few µm diameter are commercially available, as well as means of handling them.

In an embodiment, the present invention discloses systems and methods for interconnecting bond pads between integrated components, comprising placing and bonding multiple interconnect wires on corresponding bond pads of an integrated component, and then electrically separating the adjacent bond pads. The components can be assembled in an at least partially stacked configuration or an at least partially coplanar configuration. In an aspect, at least one of the components has a beveled slope. Also placing the multiple interconnect wires can comprise printing the multiple interconnect wires, including simultaneously printing the multiple interconnect wires. In an aspect, bonding the multiple interconnect wires to the bond pads comprises one of laser welding and applying a conductive adhesive. Further, electrically separating the adjacent bond pads comprises laser ablating between the adjacent bond pads.

In an embodiment, the present invention discloses systems and methods for interconnecting bond pads between integrated components, comprising first applying a conductive adhesive line along multiple bond pads of a integrated component, then placing and bonding multiple interconnect wires on the conductive adhesive line corresponding to the bond pads before laser ablating between the adjacent bond pads to separate the interconnect wires. In an aspect, applying a conductive adhesive line comprises printing a conductive adhesive line. Further, the method can comprise curing the conductive adhesive line, and pushing the interconnect wires onto the bond pads. The components can be assembled in an at least partially stacked configuration or an at least partially coplanar configuration. In an aspect, at least one of the components has a beveled slope. Also placing the multiple interconnect wires can comprise printing the multiple interconnect wires, including simultaneously printing the multiple interconnect wires. In an aspect, bonding the multiple interconnect wires to the bond pads comprises one of laser welding and applying a conductive adhesive. Further, electrically separating the adjacent bond pads comprises laser ablating between the adjacent bond pads.

In an aspect, a conductive adhesive line is also applied along the bond pads of the another integrated component, then the multiple interconnect wires are bonded to the bond pads of the another component, before being laser ablated between the adjacent bond pads.

In an embodiment, the present invention discloses systems and methods for interconnecting bond pads between integrated components, comprising first placing multiple interconnect wires on the corresponding bond pads and laser welding the multiple interconnect wires to the bond pads before laser ablating between the adjacent bond pads to separate the interconnect wires. In an aspect, laser welding comprises laser ablating along the adjacent bond pads. The same laser can be used for welding and ablating. Further, the method can comprise pushing the interconnect wires onto the bond pads to facilitate laser welding. The components can be assembled in an at least partially stacked configuration or an at least partially coplanar configuration. In an aspect, at least one of the components has a beveled slope. Also placing the multiple interconnect wires can comprise printing the multiple interconnect wires, including simultaneously printing the multiple interconnect wires. In an aspect, the other ends of the multiple interconnect wires are bonded to the other integrated component, either by a conductive adhesive line or by laser welding. Laser ablation between the adjacent bond pads of the other component can be performed for separating the wires at the other integrated component.

In an embodiment, the present invention discloses a denser wire bonding process using equipment which is already commercially available, while providing a means to make denser connections than that equipment can make. In an aspect, the present invention uses a commercial wirebonder to directly deposit wires with smaller diameter. The present invention recognizes that the currently available wirebonders are limited to relatively large wire sizes because of the bonding process and not because of the ability to feed smaller filaments of wire. Thus, the present invention discloses a separate bonding assembly, such as a laser cutting and/or a laser welding, for the smaller wires of a wirebonder. In an aspect, the mechanisms of a wirebonder (capillary, feeding mechanics, and positioning technology) may be used to extrude the desired length of wire over the desired location, and then a separate laser is used to cut the wire and allow it to fall into position. The laser (or a different laser) is then used to weld the two ends of the wire.

FIG. 13 illustrate an exemplary process flow for the combination of wirebonder and laser cutting/welding. FIG. 13A illustrates a top chip 80 positioned on a bottom chip 81 with the bond pads 82 facing upward. Chip 80 has a gradual slope 84A, for example, to help in positioning and bonding the interconnect wire. Other configurations can be used, for example, co-planar chips, or partially co-planer or partially stacked chip, or top chip with vertical edges. A wirebonder 190 is positioned and aligned on the bond pads, using smaller wire 191. FIG. 13B shows the wire 191 extruded and the wirebonder 190 traveled along the direction of the bond pads. After a desired length is reached, a laser cut is performed and the wire falls on the chips, in the direction connecting the bond pads (FIG. 13C). A laser welds the top bond 154A (FIG. 13D) and the bottom bond 154B (FIG. 13E). Optional forcing elements can be used to facilitate the bonding.

FIG. 14 illustrates an exemplary process flow for the combination of wirebonder and laser cutting/welding. Operation 230 extrudes correct lengths of interconnect wires over desired locations of the bond pads. A wirebonder can be used to provide the wire extrusion with the diameter of the interconnect wires suitable for high density interconnect. Operation 231 cuts the wires with a laser, and operation 232 welds the ends of the interconnect wires to the bond pads. A laser can be used to weld the bonds.

In an embodiment, the present invention discloses a method for interconnecting bond pads between integrated components, comprising extruding an interconnect wire over a desired location of bond pads, and laser cutting a correct length of the interconnect wire for falling on the corresponding bond pads. The method can further comprise pushing the interconnect wire onto the bond pad, and laser welding the interconnect wire to the bond pads. A same laser can be used for cutting and welding. One of the integrated components can have a beveled slope edge. In an aspect, extruding the interconnect wire comprises a mechanical feeder, or a wirebonder wire feeder mechanism.

In an embodiment, the present invention discloses a printing process to print interconnect wires, over sharp edges of the chip, or over gradual sloped edges. In an aspect, narrow wires can be formed and laid down on a substrate which has been precoated with a thermally decomposable adhesive, for example, the thermally decomposable adhesive disclosed in U.S. Pat. No. 6,946,178 and U.S. Pat. No. 7,141,348. The wires can then be cut, using for example a laser, into sections which are the correct length to form the interconnects. The substrate can then be used as a printing plate to place the sections of wire in the appropriate places so that each end of the wire is placed over a contact pad, one end on the upper chip and one on the lower. A laser is used to weld the end on the upper chip to its contact pad. A forcing element may then be used to push the wire down into contact with the pin. Suitable forcing elements include rollers, pins and compressed air. Then, the laser is used to weld the second contact. If several contacts need to be made, all of the contacts along one side of a die can be pushed into place by the same forcing element at once. Only a small pressure is needed, since the element does not need to cause bonding, but only provide proximity so that welding can be carried out. If the welding process forms a liquid of at least one of the components (and somewhat softens the metal of the wire close to the joint), then contact is facilitated by surface tension and gravity. In an aspect, the pressure forcing element may be replaced by the use of a laser-formed ramp, as described in connection with the aerosol-written lines. If the slope is chosen correctly, the wire will lie on the chip with each end supported by a bond pad, ready for welding.

In an embodiment, the wires on the thermally decomposable adhesive can be metal lines, which are formed by deposition of metal films onto the thermally decomposable adhesive followed by patterning into lines. This method could make narrower lines and make available a broader choice of materials. Alternatively, a commercial wirebonder may also be used to form the desired lengths of metal wire. A wirebonder uses an electrical pulse to cut a thin wire, which is fed through a narrow diameter nozzle, at the desired point. The wirebonder provides the wires at the desired lengths on the thermally decomposable adhesive, which then uses the thermally decomposable polymer transfer printing process and its associated printing tool to accomplish the alignment and placement of the wires. Only a part of the conventional wirebonding tool is used to provide proper wire lengths, approximately aligned in the desired direction.

FIG. 15 illustrate an exemplary printing process for interconnect wires. FIG. 15A shows a printhead 150 comprising a thermally decomposable layer 151 where a plurality of interconnect wires 153 are attached. Thermally decomposable layer 151 can comprise an adhesive polymer which attaches to the wires 153. The thermally decomposable adhesive 151 can lose the adhesion under high temperature and/or light, and release the wires 153. In FIG. 15B, the printhead 150 is brought to the proper place, with the wire 153 aligned to the bond pads 82 of the top chip 80 and the bottom chip 81. Alternatively, other configurations can be employed, such as co-planar chips, or partially co-planar or partially stacked. Also, the top chip is shown with a gradual slope edge 84A to facilitate the wire bonding, but other chip edges can be used, such as vertical edges. In FIG. 15C, the decomposable layer 151 is released to place the wire 153 on the bond pads 82. The gradual slope 84A can facilitate the placement of the wire 153. Laser welding at the top bond pad 154A (FIG. 15D) and at the bottom bond pad 154B (FIG. 15E) bonds the wire 153 to the bond pads. An optional forcing element can be used to help the bonding process.

Figure 16A:
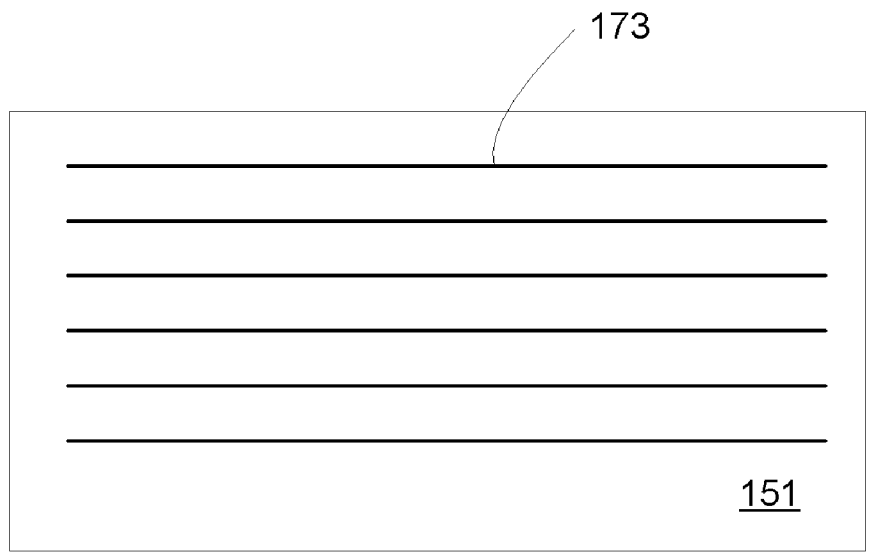
FIGS. 16A-16C illustrate an exemplary process of preparing the wires with correct lengths on the printhead coated with a thermal decomposable adhesive.
Figure 16B:
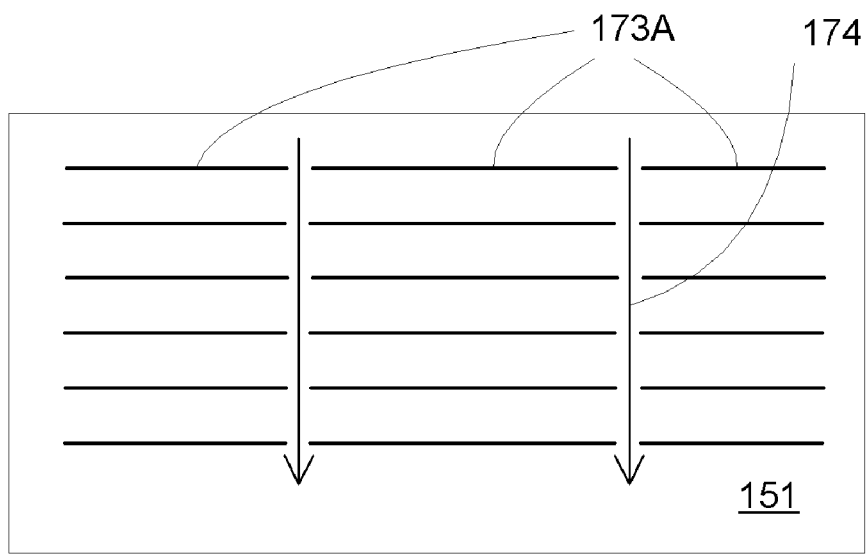
Figure 16C:
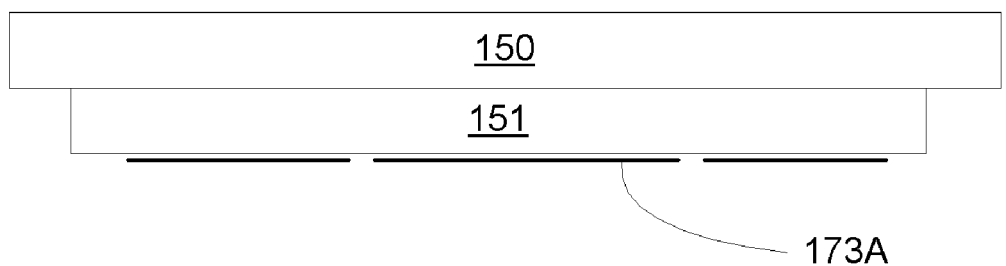
Figure 17A:
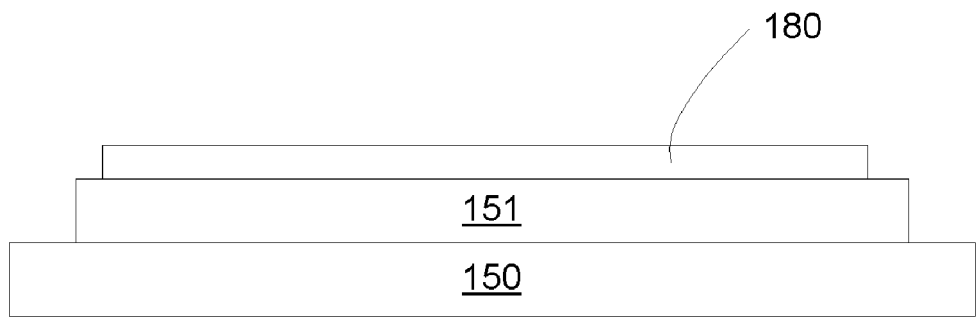
FIGS. 17A-17D illustrate another exemplary process of preparing interconnect wires with correct lengths on the printhead coated with a thermal decomposable adhesive.
Figure 17B:
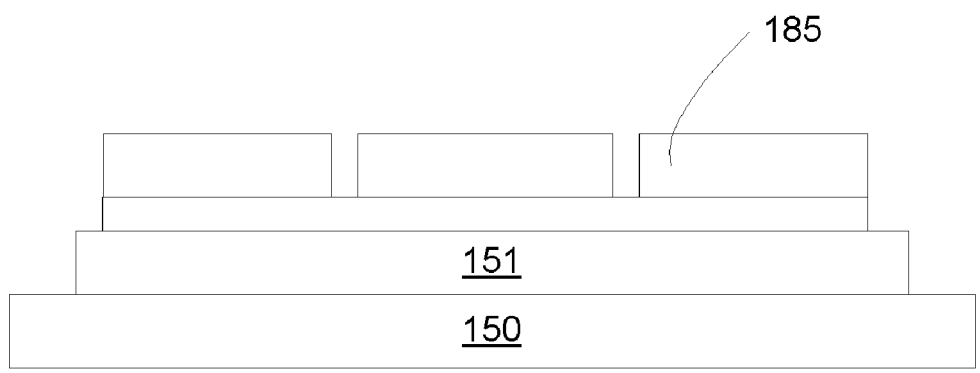
Figure 17C:
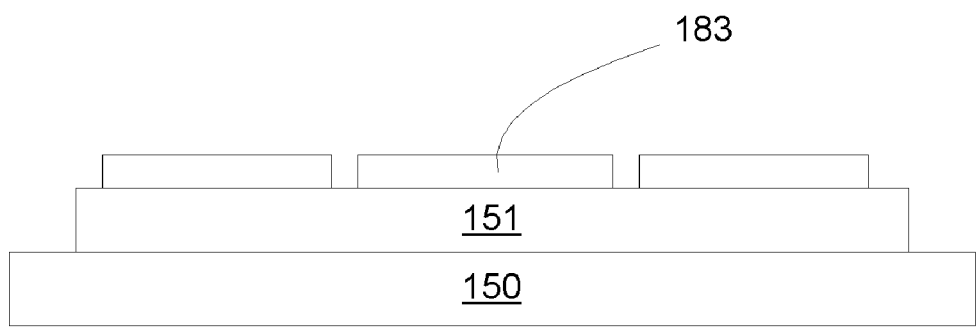
Figure 17D:
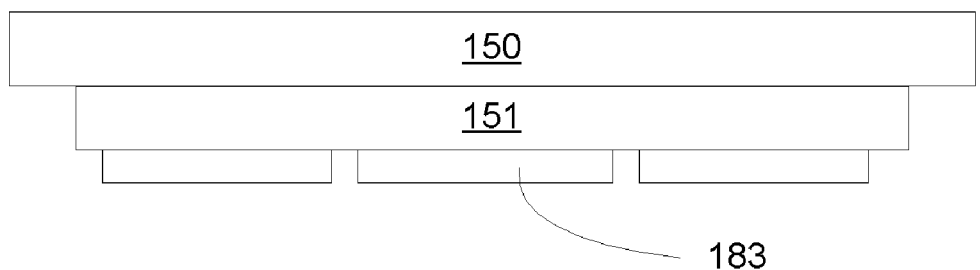
Figure 18A:
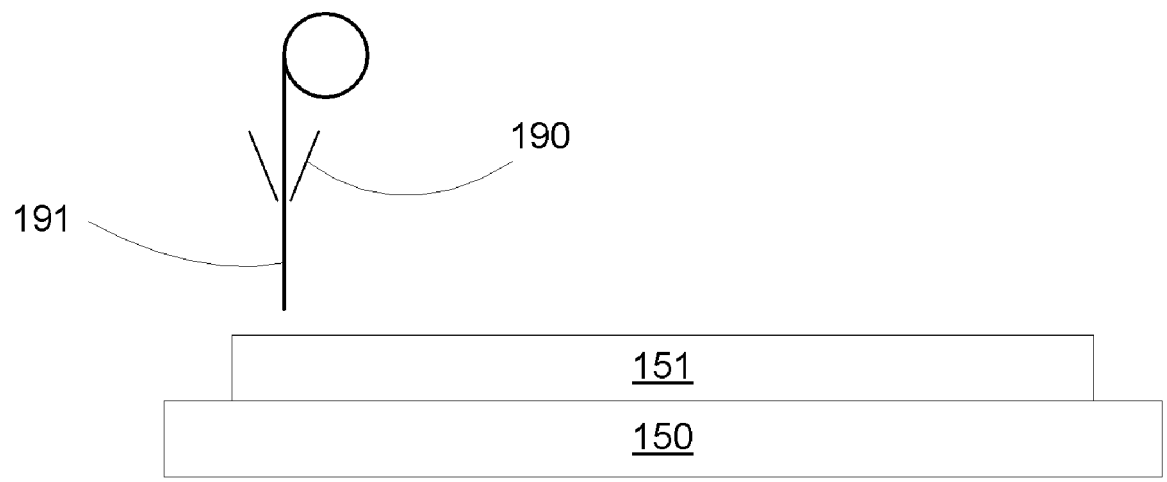
FIGS. 18A-18E illustrate another exemplary process of preparing interconnect wires with correct lengths on the printhead coated with a thermal decomposable adhesive.
Figure 18B:
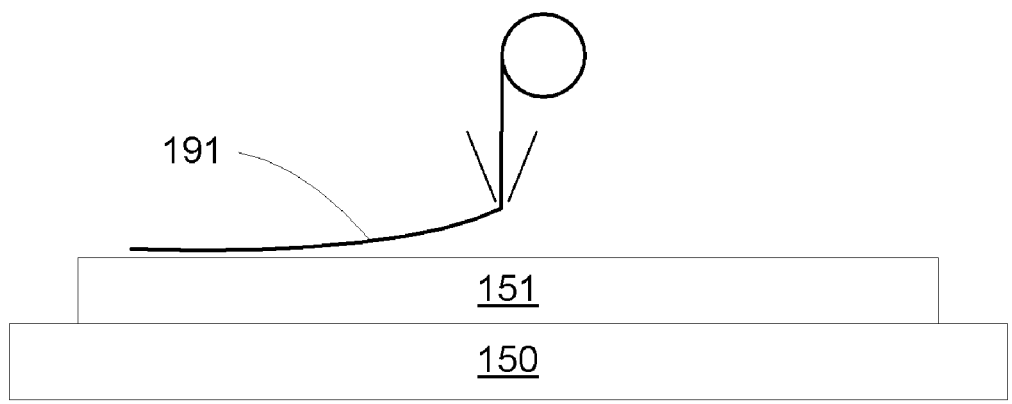
Figure 18C:
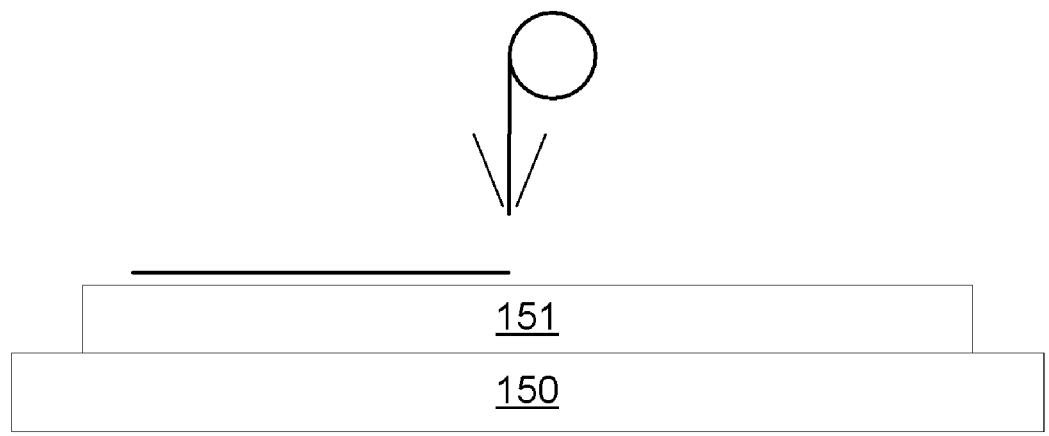
Figure 18D:
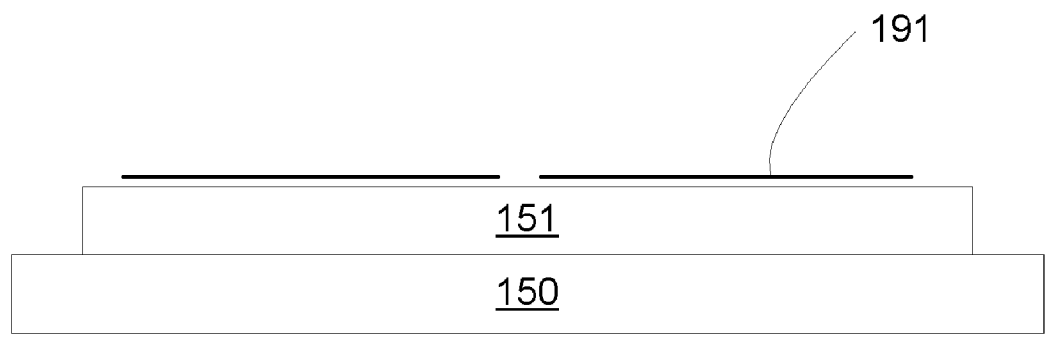
Figure 18E:
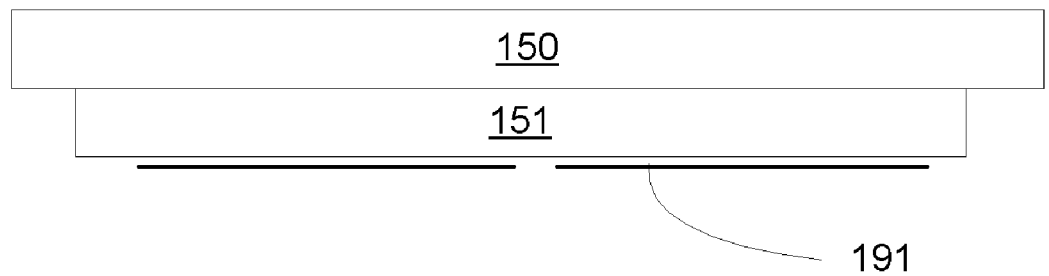

FIG. 16 illustrate an exemplary process of preparing the wires with correct lengths on the printhead 150 coated with a thermally decomposable adhesive 151. A plurality of wires is positioned on the thermally decomposable adhesive 151 on the printhead 150 (FIG. 16A), A cutting process, such as a laser cut 174, is performed to cut the wires 173 into wires with correct length 173A (FIG. 16B). FIG. 16C shows the printhead 150 having the correct length wires 173A ready for printing on the chip bond pads (FIG. 16C).

FIG. 17 illustrate another exemplary process of preparing interconnect wires with correct lengths on the printhead 150 coated with a thermally decomposable adhesive 151. A metal layer 180 is deposited on the thermally decomposable adhesive 151 (FIG. 17A), and patterned, for example, with photoresist 185 (FIG. 17B), to form metal lines 183 of correct lengths and orientations (FIG. 17C). The photoresist 185 is stripped and the printhead 150 is ready for printing the interconnect wires 183 on chips (FIG. 17D).

FIG. 18 illustrates another exemplary process of preparing interconnect wires with correct lengths on the printhead 150 coated with a thermally decomposable adhesive 151. A wirebonder 190 provides wire 191 near the thermally decomposable layer 151 (FIG. 18A). The diameter of the wire 191 is determined by the desired printing process, and can be smaller than the diameter used in a wirebonder process. After the correct length is reached (FIG. 18B), the wire is cut, for example by a laser cut process (FIG. 18C). After a plurality of wires with correct lengths are arranged on the thermally decomposable layer 151 (FIG. 18D), the printhead is ready for printing wires on the chips (FIG. 18E).

Figure 19:
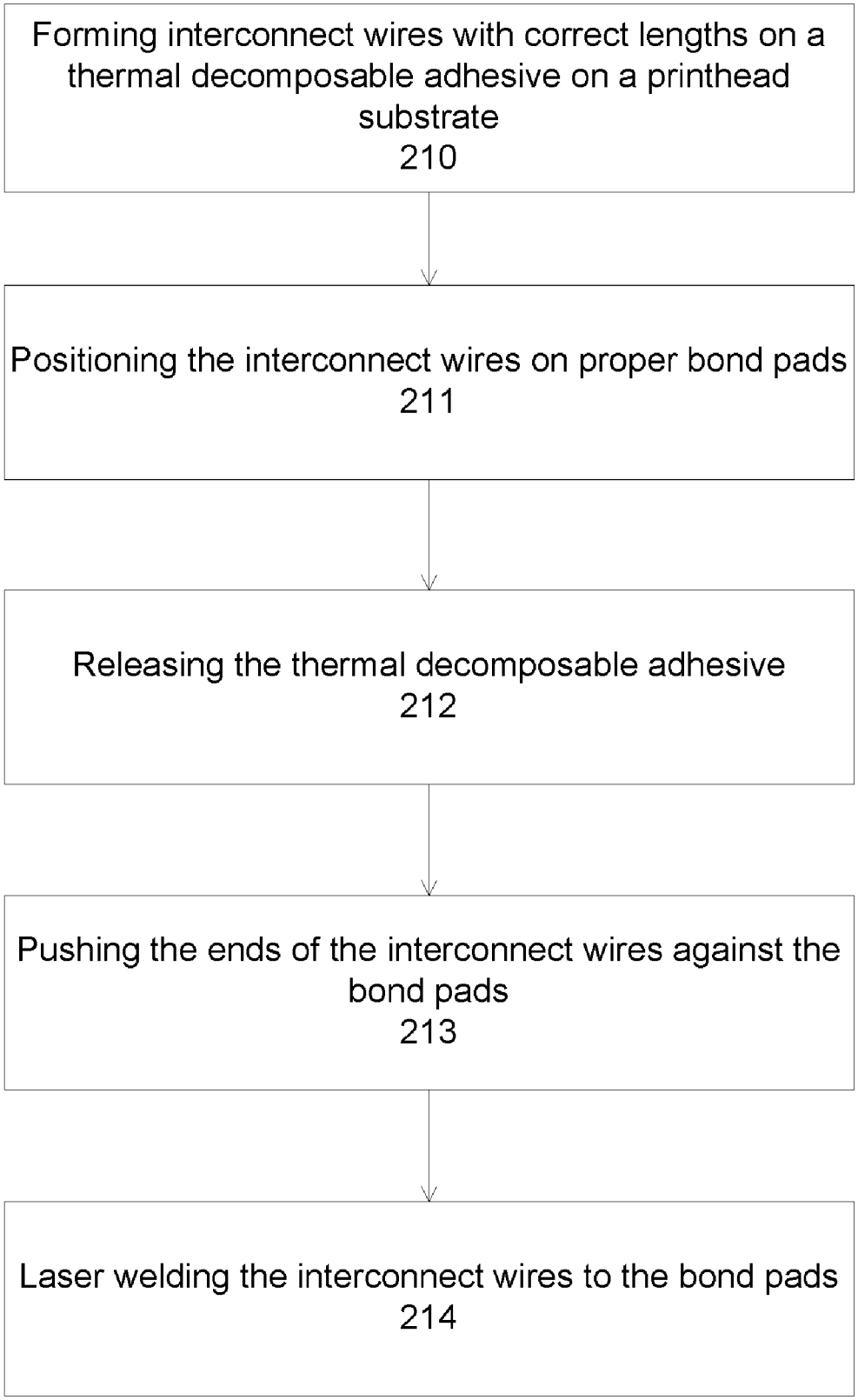
FIG. 19 illustrates an exemplary flowchart for the present printing process of interconnect wires.
Figure 21A:
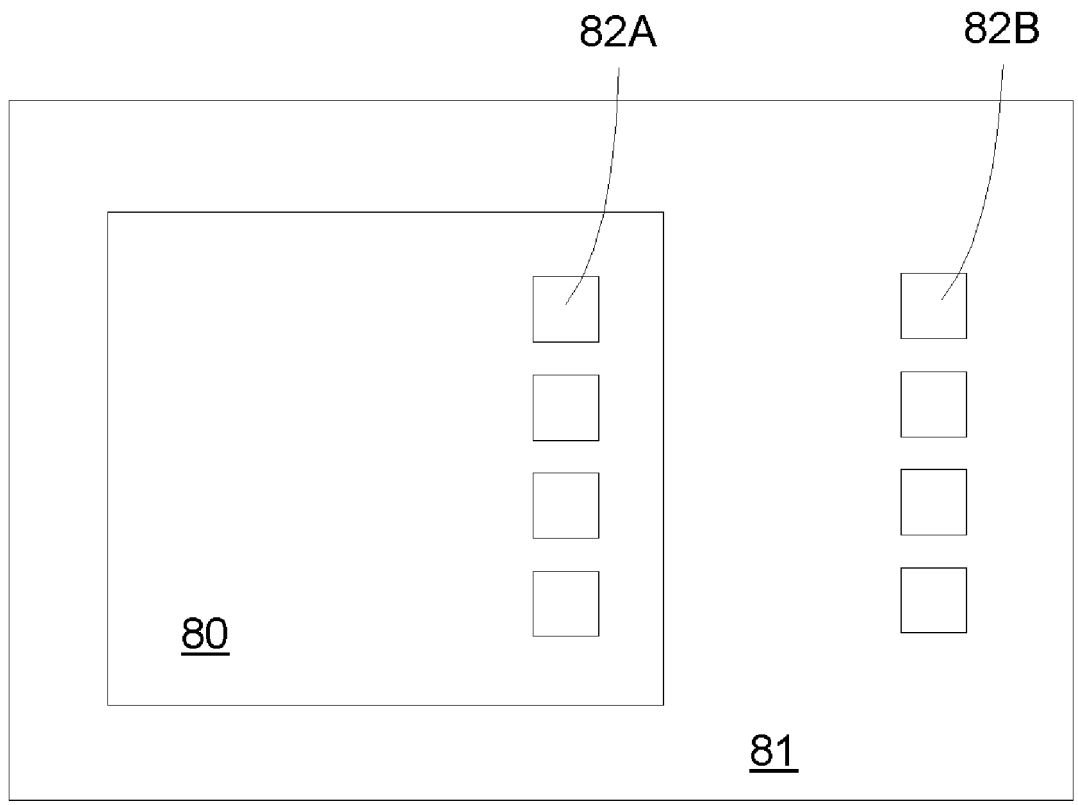
FIGS. 21A-21D illustrate an exemplary process sequence for the present ribbon interconnect with laser welding.
Figure 21B:
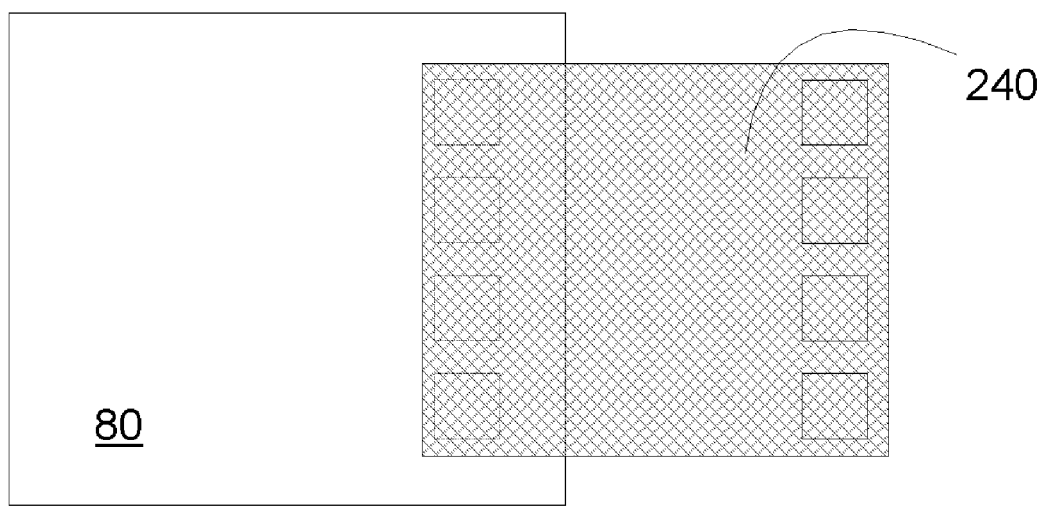
Figure 21C:
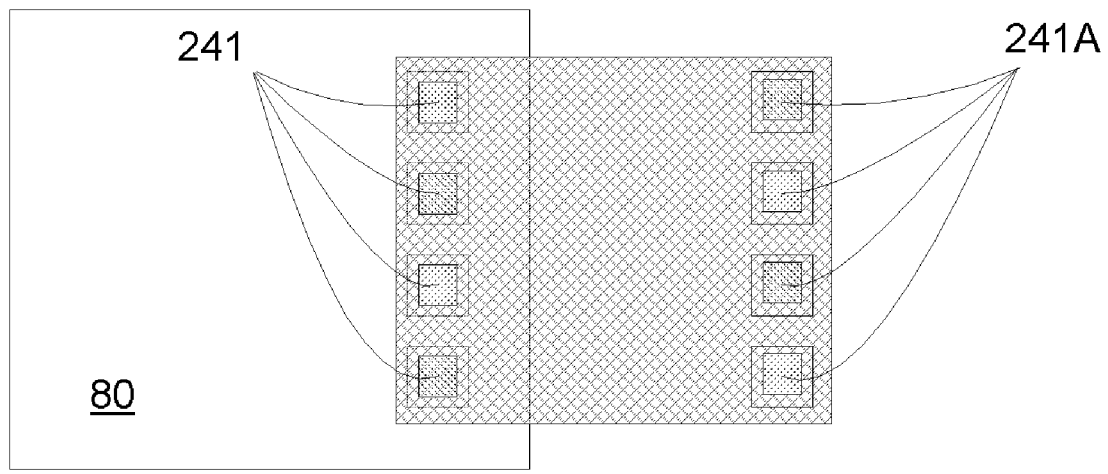
Figure 21D:
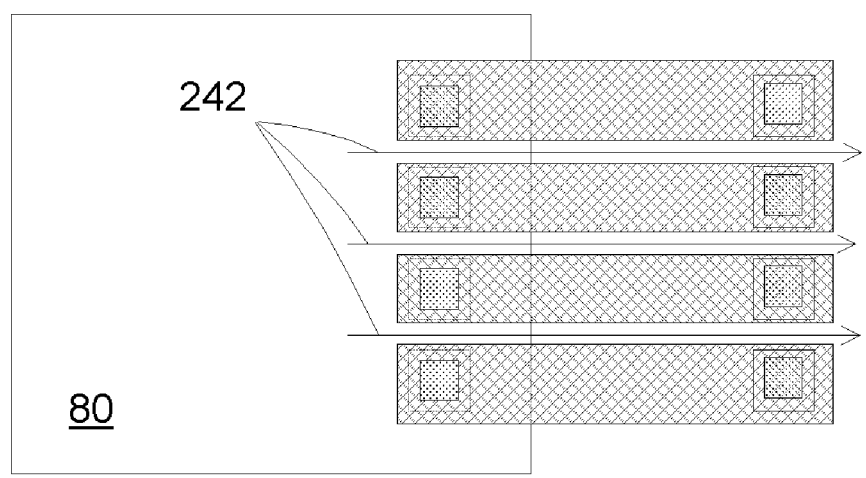
Figure 22A:
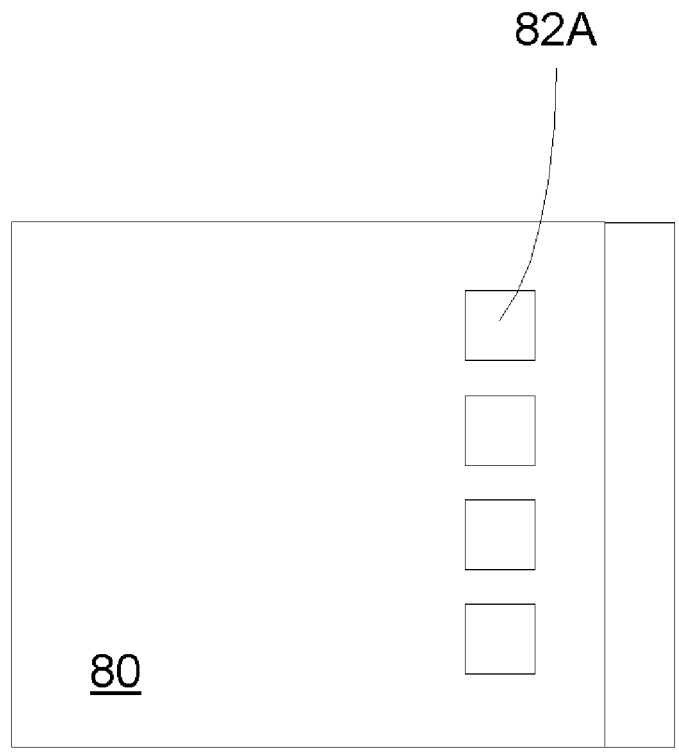
FIGS. 22A-22D illustrate another exemplary sequence, where the laser welding runs continuously to bond and connect the adjacent bond pads.
Figure 22B:
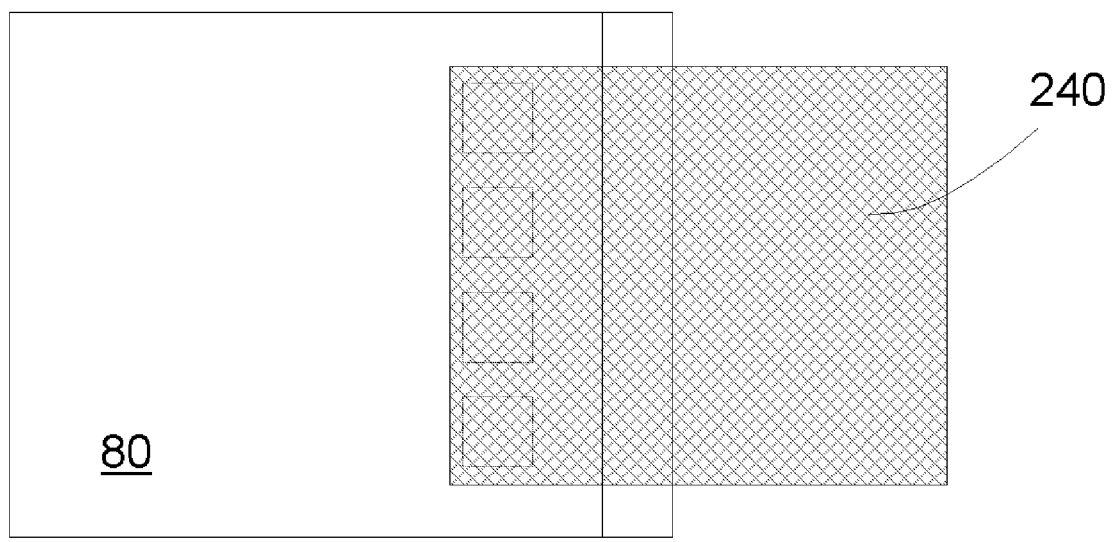
Figure 22C:
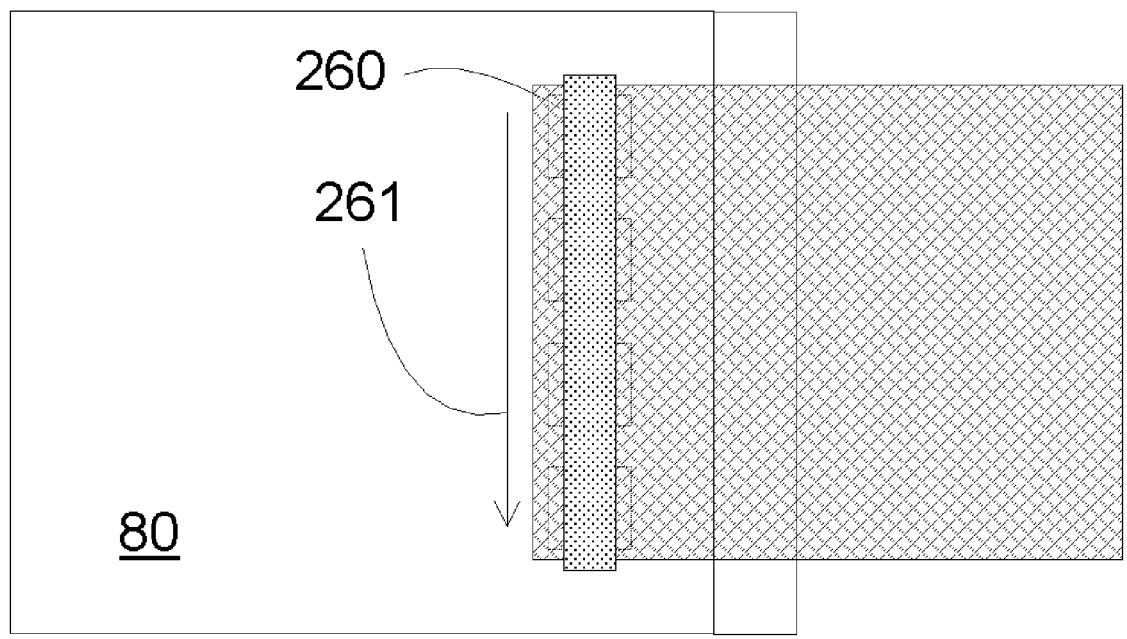
Figure 22D:
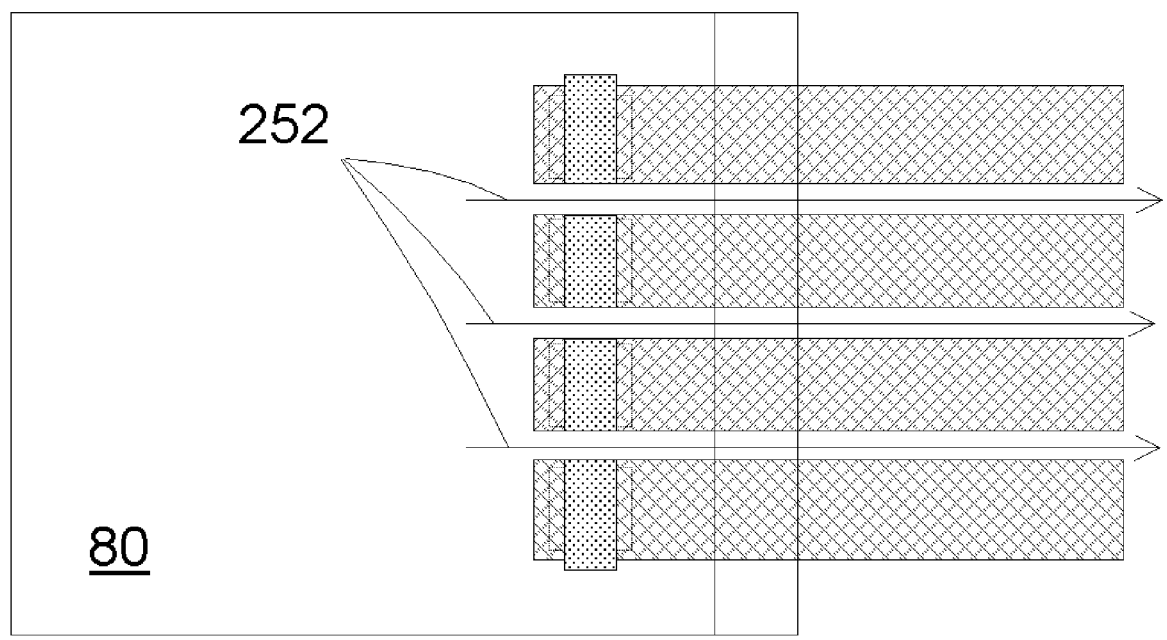
Figure 23A:
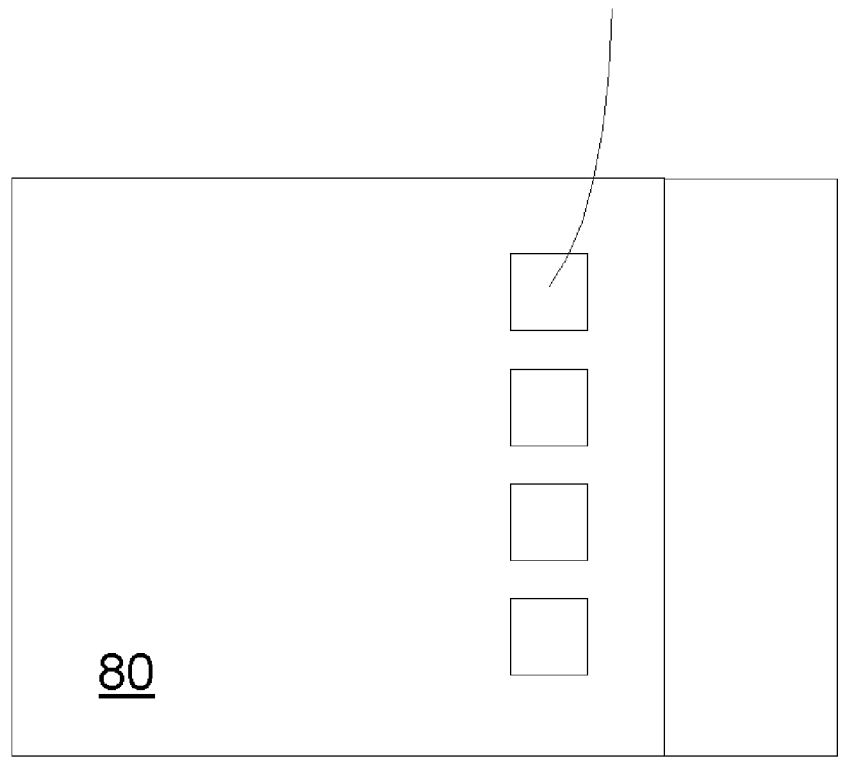
FIGS. 23A-23D illustrate an exemplary process sequence for the present ribbon interconnect with conductive adhesive.
Figure 23B:
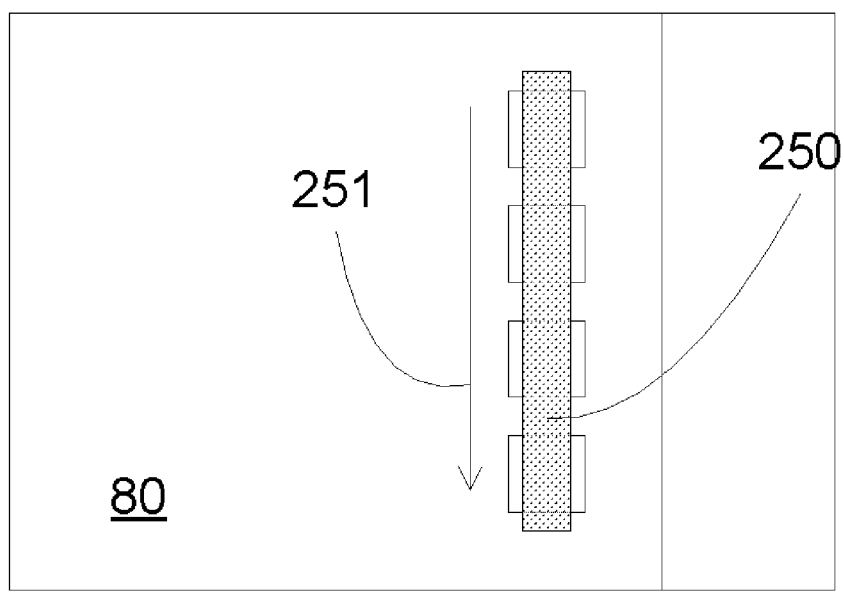
Figure 23C:
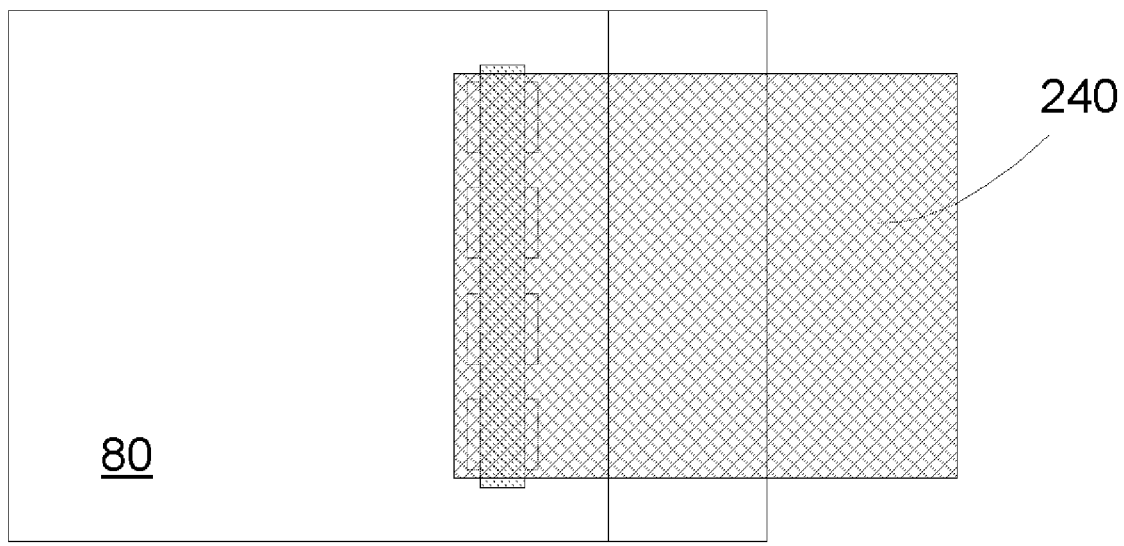
Figure 23D:
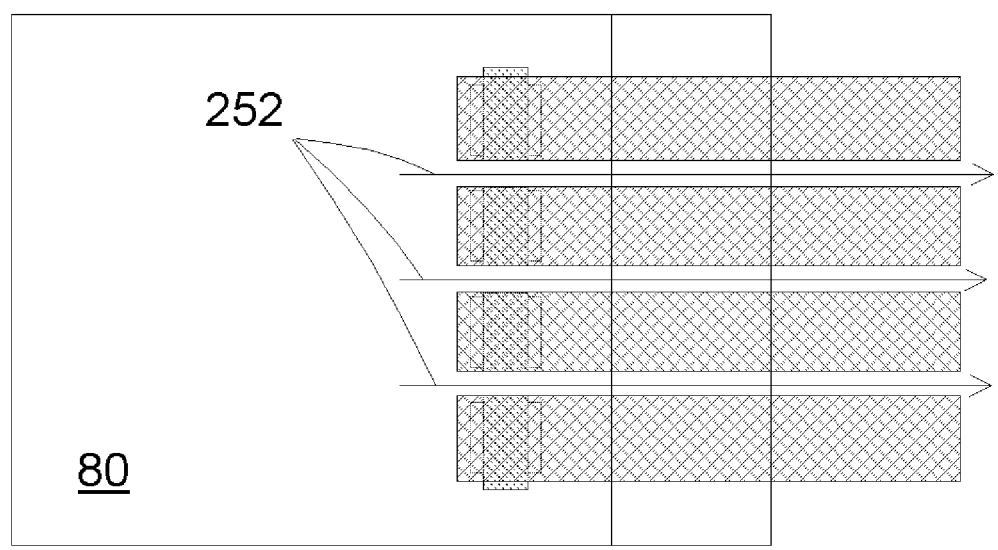

FIG. 19 illustrates an exemplary flowchart for the present printing process of interconnect wires. Operation 210 forms interconnect wires with correct lengths on a thermally decomposable adhesive on a printhead substrate. The printhead then moves to the proper locations, positioning the interconnect wires on corresponding bond pads (operation 211). The thermally decomposable adhesive is then released to allow the interconnect wires to fall on the bond pads (operation 212). The releasable adhesive can be released by heat, light or a combination thereof. An optional pushing mechanism can be performed to push the ends of the interconnect wires against the bond pads (operation 213). A welding process such as a laser welding or ultrasonic welding is then performed to weld the interconnect wires onto the bond pads (operation 214).

FIG. 20A illustrates an exemplary process of forming wires with correct lengths on the thermally decomposable layer on the printhead. After forming a plurality of interconnect wires on the thermally decomposable layer (operation 220), a laser is applied to cut the interconnect wires to the correct lengths (operation 221). FIG. 20B illustrates another exemplary process of forming wires with correct lengths on the thermally decomposable layer on the printhead. After depositing a layer of metal on the thermally decomposable layer (operation 225), a patterning process is applied to form interconnect wires with correct lengths (operation 226). The patterning process can use photolithography process, with photoresist mask and wet or dry etching steps. FIG. 20C illustrates another exemplary process of forming wires with correct lengths on the thermally decomposable layer on the printhead. After a wirebonder delivers interconnect wires on the thermally decomposable layer (operation 228), a laser is applied to cut the interconnect wires to the correct lengths (operation 229), which are then laid down on the thermally decomposable layer.

In an embodiment, the present invention discloses methods for printing interconnect wires on bond pads between integrated components, comprising forming interconnect wires on a thermally decomposable adhesive on a printhead substrate, then positioning the printhead so that the interconnect wire is located over a desired location of bond pads, and releasing the interconnect wire to fall on the corresponding bond pads. In an aspect, one of the integrated components has a beveled slope to facilitate the printing process. In addition, a pushing element can be included to help pushing the interconnect wire onto the bond pad. A laser can be included to weld the interconnect wire to the bond pads. Alternatively, a conductive adhesive can be applied on the bond pads before releasing the interconnect wire. The printhead can simultaneously release multiple interconnect wires over the corresponding bond pads. The integrated components can be positioned in an at least partially stacked configuration, or an at least partially coplanar configuration.

In an embodiment, the present invention discloses a method for forming interconnect wires on a printhead, comprising placing interconnect wires on a thermally decomposable adhesive on the printhead substrate, and then laser cutting the interconnect wires to correct lengths. In an aspect, the interconnect wires are separated by a same distance as the separation of adjacent bond pads, and multiple interconnect wires are cut to a same length for simultaneously printing on multiple bond pads. Also, a layer of thermally decomposable adhesive can be coated on the printhead substrate. Alternatively, the layer of thermally decomposable adhesive on the printhead substrate is transferred to the printhead substrate. The thermally decomposable adhesive is releasable by at least one of heat and light.

In an embodiment, the present invention discloses a method for forming interconnect wires on a printhead, comprising depositing a conductive layer on a thermally decomposable adhesive on the printhead substrate, and then patterning the conductive layer to form interconnect wires with correct lengths. In an aspect, patterning the conductive layer comprises a photolithography process. The interconnect wires are separated by a same distance as the separation of adjacent bond pads, and multiple interconnect wires are cut to a same length for simultaneously printing on multiple bond pads. Also, a layer of thermally decomposable adhesive can be coated on the printhead substrate. Alternatively, the layer of thermally decomposable adhesive on the printhead substrate is transferred to the printhead substrate. The thermally decomposable adhesive is releasable by at least one of heat and light.

In an embodiment, the present invention discloses a method for forming interconnect wires on a printhead, comprising extruding an interconnect wire on a thermally decomposable adhesive on the printhead substrate, and then laser cutting a correct length of the interconnect wire to fall on the thermally decomposable adhesive. In an aspect, extruding the interconnect wire comprises a mechanical feeder or a wirebonder wire feeder mechanism. The interconnect wires are separated by a same distance as the separation of adjacent bond pads, and multiple interconnect wires are cut to a same length for simultaneously printing on multiple bond pads. Also, a layer of thermally decomposable adhesive can be coated on the printhead substrate. Alternatively, the layer of thermally decomposable adhesive on the printhead substrate is transferred to the printhead substrate. The thermally decomposable adhesive is releasable by at least one of heat and light.

In an embodiment, the present invention discloses a printhead for printing interconnect wires, comprising a thermally decomposable adhesive on a printhead substrate, a plurality of interconnect wires patterned to the correct lengths disposed on the thermally decomposable adhesive, and a release mechanism for releasing the thermally decomposable adhesive. The interconnect wires are separated by a same distance as the separation of adjacent bond pads, and multiple interconnect wires are cut to a same length for simultaneously printing on multiple bond pads. The thermally decomposable adhesive is releasable by at least one of heat and light. In an aspect, the interconnect wires is placed on the thermally decomposable adhesive and laser cut to the correct lengths. Alternatively, the interconnect wire is patterned to the correct lengths from a deposited conductive layer on the thermal decomposable adhesive.

In an embodiment, the present invention discloses a higher density (smaller pad pitch) interconnect wire bonding process, where the connection may be made by a metal ribbon instead of wire; i.e., a wire which is substantially wider than its thickness. This ribbon is bonded simultaneously to the pads along one side of a die, using either conventional ultrasonic bonding or laser welding, or a combination thereof. The other end is similarly bonded to the pads on the lower die. A laser is then used to ablatively cut along the length of the ribbon, thereby separating it into individual parallel wires. An advantage of this technique would be higher throughput, since the tool only has to perform one alignment operation to get the ribbon into the proper place for bonding many pads. Subsequently all of the bonds may be formed in a single ultrasonic welding operation, or they may be formed by a laser which addresses each pad in sequence but does not need mechanical motion to do so (apart from the motion of a beam steering unit). The resulting wires may be encapsulated for protection and stability by applying a droplet of curable adhesive. The width of the wires formed in this way is limited only by the resolution of laser cutting, which can readily be a few µm.

In a preferred embodiment, the ribbon described previously may also be placed using the thermally decomposable polymer printing process. The ribbon may optionally be treated by a droplet of nonconductive or conductive adhesive to help hold it in place until welding is finished. The placement of the ribbon may also be facilitated by using a laser to form a slope at the edge of the die (similarly to the ramps that have been described, but uniformly across the length or width of the die).

FIG. 21 illustrate an exemplary process sequence for the present ribbon interconnect with laser welding. FIG. 21A shows a chip 80 positioned on top of a chip 81 with the bond pads 82A aligned with the bond pads 82B. This figure shows a stacked configuration where chip 80 is stacked on top of chip 81, but other chip configurations can be used, such as co-planar, partially co-planar, or partially stacked. In addition, this figure shows chip 80 having vertical edges, but other structures can be used, such as a chip having one or more gradual sloped edges. Further, this figure shows a configuration for bonding chips 80 and 81, but the present ribbon interconnect process can be used to bond to bond pads in one chip, with the other end of the ribbon interconnect to be configured at a later time, for similar or different bonding processes or purposes. A ribbon interconnect 240 is positioned on the bond pads, connecting the bond pads of both chips (FIG. 21B). Then a bonding process, such as ultrasonic welding or laser welding, can be used to bond the ribbon interconnect to the bond pads. FIG. 21C shows a laser welding process, welding the ribbon interconnect 240 to the individual bond pads 241 and 241A of chips 80 and 81. After the bonding process, the ribbon interconnect is separated into individual interconnect wires, for example, by a laser cutting process 242 along the length of the ribbon interconnect and between the adjacent bond pads.

FIG. 22 illustrate another exemplary sequence, where the laser welding runs continuously to bond and connect the adjacent bond pads. FIG. 22A shows a chip 80 having bond pads 82A in the vicinity of a gradual slope edge. Ribbon interconnect 240 is placed on the bond pads (FIG. 22B), and a continuous welding process bonds all the bond pads to the ribbon interconnect. For example, a laser beam travels in the direct 261 along the adjacent bond pads, welding the ribbon interconnect to the bond pads 260 (FIG. 22C). A separation process, such as a laser cutting 252, separates the ribbon interconnect into individual wires (FIG. 22D).

FIG. 23 illustrate an exemplary process sequence for the present ribbon interconnect with conductive adhesive. FIG. 23A shows a chip 80 having bond pads 82A in the vicinity of a gradual slope edge. A line 250 of conductive adhesive is placed on the bond pads, for example, by a printing process along the adjacent bond pads 251 (FIG. 23B). Ribbon interconnect 240 is placed on the adhesive (FIG. 23C) to bond the with the bond pads. An optional curing process can be performed. A separation process, such as a laser cutting 252, separates the ribbon interconnect into individual wires (FIG. 23D).

FIG. 24 illustrates an exemplary flowchart for the present ribbon interconnect. Operation 270 positions a ribbon interconnect on a plurality of bond pads. After the ribbon interconnect bonds with the bond pads, operation 271 separates the ribbon interconnect into individual interconnect wires. The bonding process can be ultrasonic welding or laser welding. The bonding process can be simultaneous bonding, bonding multiple bond pads together. The bonding process can be sequential bonding, bonding individual bond pads separately. The separation process is preferably a laser cutting process, providing the desired high density interconnection. In an aspect, each individual wire connects to a bond pad, forming electrical connection between two bond pads. Other configurations can be used, such as an interconnect wire can be split with one end connected to two connected bond pads and the other end connected to two separate bond pads.

Figure 25A:
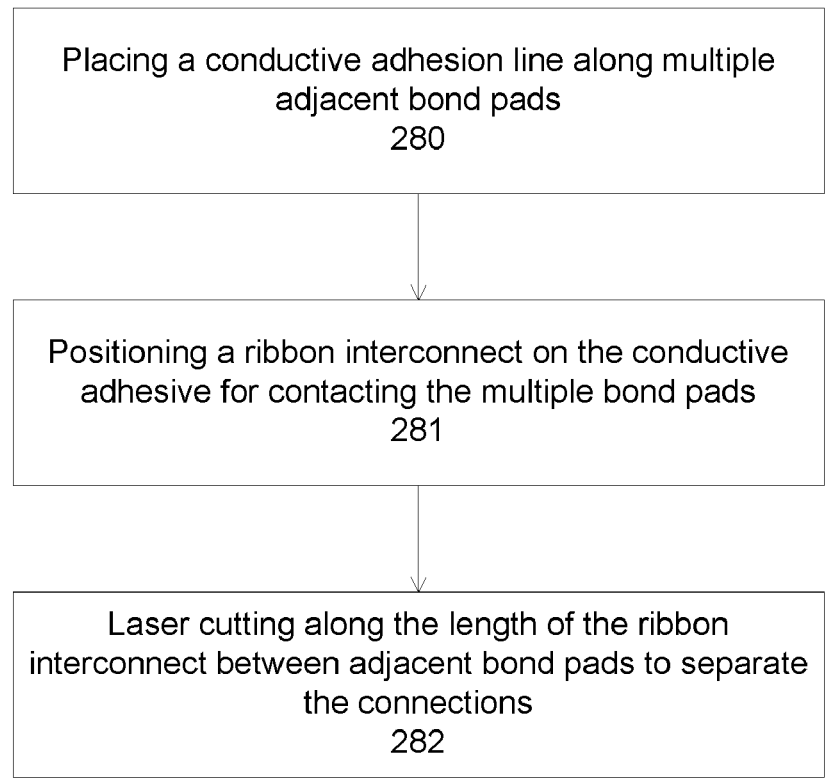
FIG. 25A-25B illustrate various exemplary flowcharts for the present ribbon interconnect.

FIG. 25A illustrates an exemplary flowchart for the present ribbon interconnect using conductive adhesive. Operation 280 places a conductive adhesive line along multiple adjacent bond pads, for example, by a printing process, with optional curing. Operation 281 positions a ribbon interconnect on the conductive adhesive for contacting the multiple bond pads. After the ribbon interconnect bonds with the multiple bond pads, operation 282 separates the ribbon interconnect into individual interconnect wires, for example, by a laser cutting process along the length of the ribbon interconnect between the adjacent bond pads.

Figure 25B:
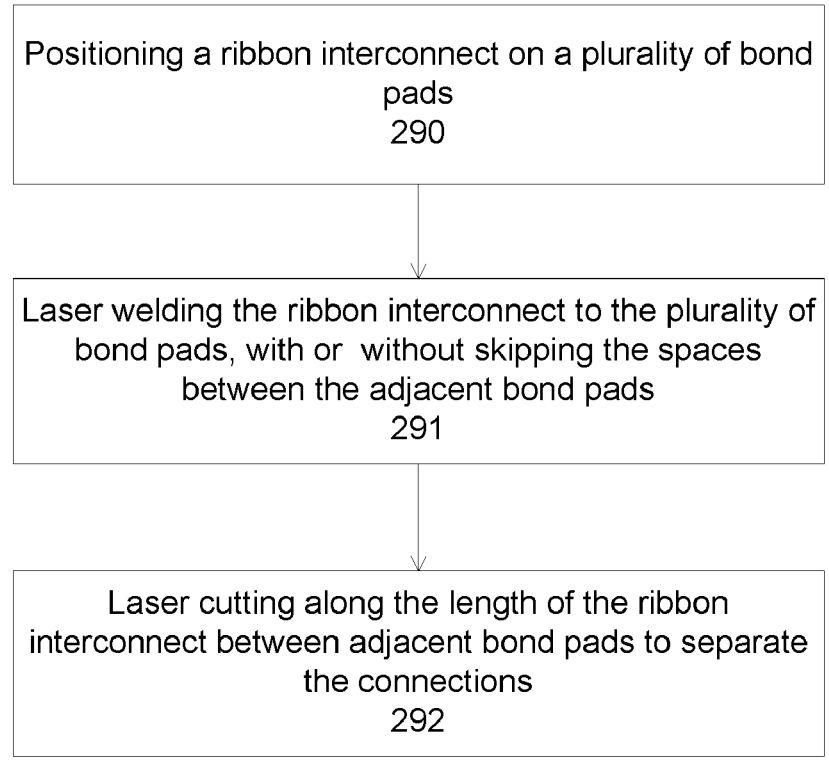

FIG. 25B illustrates an exemplary flowchart for the present ribbon interconnect using laser welding. Operation 290 positions a ribbon interconnect on a plurality of bond pads. Operation 291 bonds the ribbon interconnect to the multiple adjacent bond pads, with or without skipping the spaces between the adjacent bond pads. The bonding process can be an ultrasonic welding, or a laser welding process, traveling along the adjacent bond pads by a moving laser assembly or a mirror assembly. The laser welding process preferably runs along with adjacent bond pads without skipping, but an optional shutter can be used to skip the welding of the spaces between adjacent bond pads. After the ribbon interconnect bonds with the multiple bond pads, operation 292 separates the ribbon interconnect into individual interconnect wires, for example, by a laser cutting process along the length of the ribbon interconnect between the adjacent bond pads.

In the foregoing variations in which both dice are face up, it will be desirable to have the upper chip bonded to the lower one for reliability, so that undesirable thermomechanical stresses are not placed on the I/O connections. A variety of nonconducting adhesives known in the industry as die-attach adhesives, as well as many other adhesives, may be used in a very thin film to bond the two chips durably together. These adhesives would be advantageously applied by inkjet printing or other droplet dispensing technique prior to the deposition of the thin upper die.

In an embodiment, the present invention discloses systems and methods for interconnecting bond pads between integrated components utilizing ribbon interconnects, comprising positioning a ribbon interconnect over a plurality of bond pads, and separating the ribbon interconnect into multiple interconnect wires, with at least one interconnect wire disposed on a corresponding bond pad. In an aspect, separating the ribbon interconnect comprises laser ablating the ribbon interconnect, and separating the ribbon interconnect into multiple individual interconnect wires, with each interconnect wire disposed on a corresponding bond pad. An integrated component can have a beveled slope for facilitating wire placement. Positioning the ribbon interconnect can comprise printing the ribbon interconnect. In an aspect, the method further comprises bonding the ribbon interconnect to the corresponding bond pads, such as one of laser welding, ultrasonic welding, and applying a conductive adhesive. The conductive adhesive line can be applied along the bond pads before positioning the ribbon interconnect. Alternatively, the ribbon interconnect can be welded after positioning the ribbon interconnect on the bond pads. In an aspect, a same laser is used for welding and separating. In an aspect, the integrated component is positioned in the vicinity of another integrated component in an at least partially stacked configuration, or in an at least partially coplanar configuration. At the other end of the ribbon interconnect, a conductive adhesive line can be applied or the ribbon interconnect can be welded to the bond pads of the another component.

In an embodiment, the present invention discloses a method for interconnecting bond pads between integrated components, comprising applying a conductive adhesive line along multiple bond pads of an integrated component before positioning and bonding a ribbon interconnect on the conductive adhesive line over the multiple bond pads. The ribbon interconnect is then cut by laser ablation into multiple interconnect wires, with at least one interconnect wire connecting on a corresponding bond pad. In an aspect, applying a conductive adhesive line comprises printing a conductive adhesive line. In addition, the conductive adhesive line can be cured. A pushing element can push the ribbon interconnect onto the bond pads. In an aspect, separating the ribbon interconnect separates the ribbon interconnect into multiple individual interconnect wires, with each interconnect wire bonded on a corresponding bond pad.

In an embodiment, the present invention discloses a method for interconnecting bond pads between integrated components, comprising positioning a ribbon interconnect over a plurality of bond pads, then laser welding the ribbon interconnect to the bond pads, and laser ablating the ribbon interconnect into multiple interconnect wires, with at least one interconnect wire bonded on a corresponding bond pad. In an aspect, the laser welding runs continuously along the adjacent bond pads. Also, a same laser can be used for welding and ablating.

In an embodiment, the present invention discloses an integrated component comprising a plurality of interconnect wires bonded to the corresponding bond pads, with the interconnect wires cut from a ribbon interconnect into individual wires. In as aspect, the interconnect wires are bonded to the corresponding bond pads by laser welding. Alternatively, the interconnect wires are bonded to the corresponding bond pads by a conductive adhesion line.

In an embodiment, the present invention discloses a chip assembly comprising two integrated components connected by a ribbon interconnect having been separated by a laser ablation process. The two integrated components are located in the vicinity of each other, such as positioned in an at least partially stacked configuration or in an at least partially coplanar configuration.

In an embodiment, the present invention discloses improvements for face to face bonding between two chips. In an embodiment, the present invention discloses a surface treatment of the chip surface to confine the bonding to the bond pads. In an aspect, the surface of at least one die is treated in such a way that a liquid metal, such as Ga for example, will not wet or stick to it, while the metallization of the contact pads uses a metal which is wet by the liquid metal. When the second die is placed face down on this die, the thin film of liquid metal makes a thin, uniform electrical contact between the two surfaces. If the liquid metal has been mixed with suitable fine particles (for example Cu and Ni in Ga) which alloy to form a higher-melting point metal, a bond may be formed as the alloying reaction proceeds.

Figure 26A:
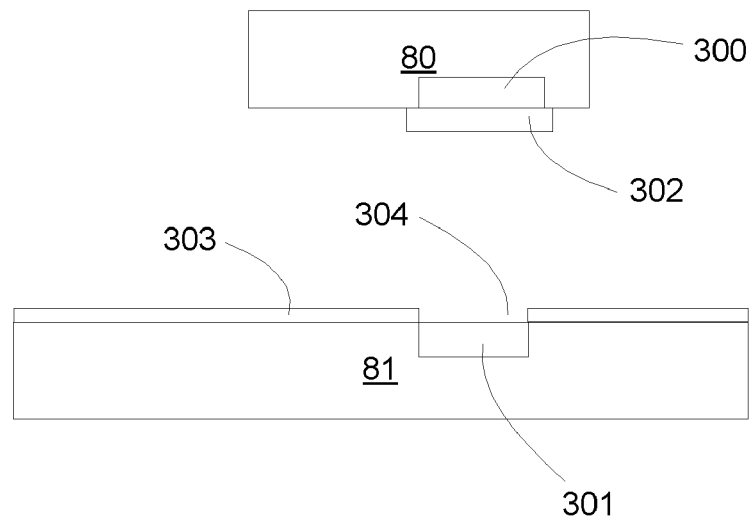
FIGS. 26A-26C illustrate an exemplary process of the present surface treatment.

FIG. 26 illustrate an exemplary process of the present surface treatment. In FIG. 26A, a top chip 80 having bond pad 300 is coated with a liquid metal 302, and faces down toward a bottom chip 81 which has a bond pad 301. The surface of the chip 81 is treated, for example, by coating with a layer 303 that repels, non-wets or non-sticks to the liquid metal 302.

The coating layer 303 covers the surface of the chip 81, except the surface 304 of the bond pad 301. The surface 304 can also be coated with a liquid metal (not shown). The other surface of the chip 80 (the surface that is not covered by the bond pads) can also be treated, for example with the same coating 303 (not shown).

Figure 26B:
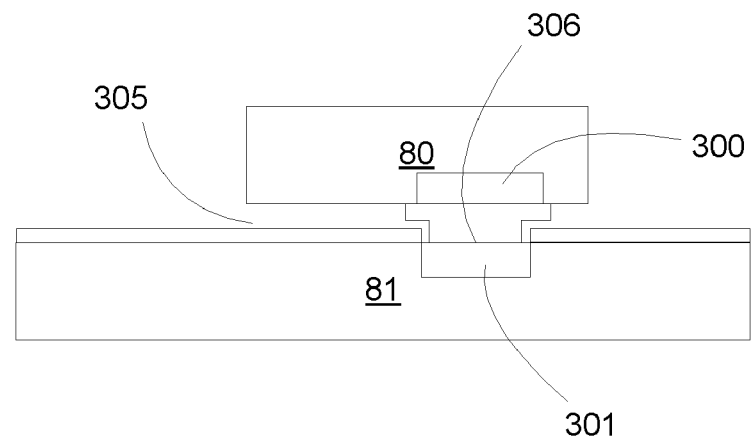
Figure 26C:
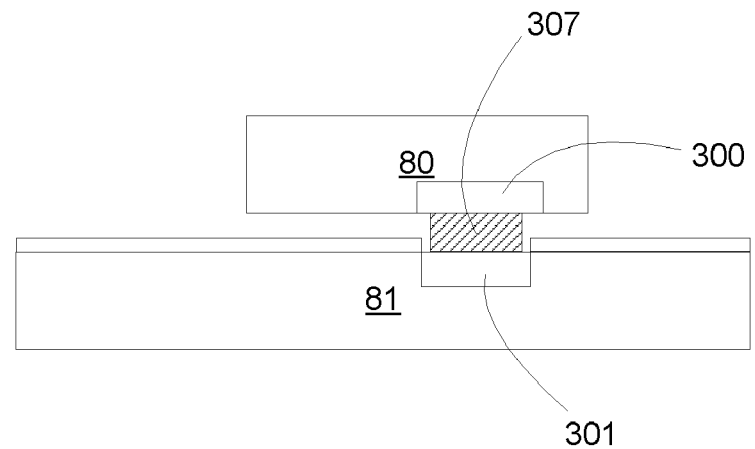

In FIG. 26B, the chips 80 and 81 are brought together to form contact between the bond pads 300 and 301. The surface treatment 303 repels the liquid metal, confining the liquid metal to the bond pads 300 and 301, contacting the surface 306 between these two bond pads. In FIG. 26C, a bond 307 is formed between the two bond pads 300 and 301 of chips 80 and 81. Thus the surface treatment helps improve the pad bonding, for example, by confining the bonding material to the bond pad surfaces.

FIG. 27 illustrates an exemplary flowchart of the present surface treatment. Operation 310 treats the surface of at least one chip (or die), except the surface of the bond pads, so that a liquid metal will not wet or stick to it. The surface of the other chip can be similarly treated. Operation 311 coats the surface of a bond pad with a liquid metal. The bond pad can belong to the chip with the surface treatment, or belong to a second chip, with or without the surface treatment. Alternatively, the surfaces of the bond pads of both chips can be coated with a liquid metal. The order of these two operations can be reverse, for example, coating the bond pads with a liquid metal before treating other surfaces. Operation 312 contacts the surfaces of the two chips together to form bonds between the bond pads. Optional curing process can be performed.

In an embodiment, the present invention discloses systems and methods for interconnecting bond pads between integrated components, comprising treating the surface of at least one integrated component, except the surface of the bond pads, so that a liquid metal will not wet or stick to it, coating a bond pad surface with the liquid metal, and then contacting the surfaces of the two integrated components so that the bond pads of the two integrated components are aligned, and wherein the liquid metal makes electrical contact between the two surfaces of the bond pads. In an aspect, the surfaces of both integrated components are treated.

In an embodiment, the contact can be formed by dispensing molten solder droplets, for example, in the same way to dispense conductive adhesive. The molten solder droplets can be dispensed by a heated printhead, or by a heated dispenser head.

In an embodiment, the present invention discloses capsules of liquid metal covered by a polymer shell to improve contact bonding process between two chips. In an embodiment, vesicles or capsules of liquid metal (e.g. Ga, with or without nanoparticles of other metals) are formed and surrounded by a polymer shell (from an emulsion process, or by self-assembly of polymer chains as surfactants). In an aspect, the polymer has a specific affinity for the contact pads. Thus a monolayer of these capsules can form at the locations of metal contact, then complementary components can be placed against this vesicle surface. After squeezing the two components, the force breaks the vesicle and allows the metal to react.

Figure 28A:
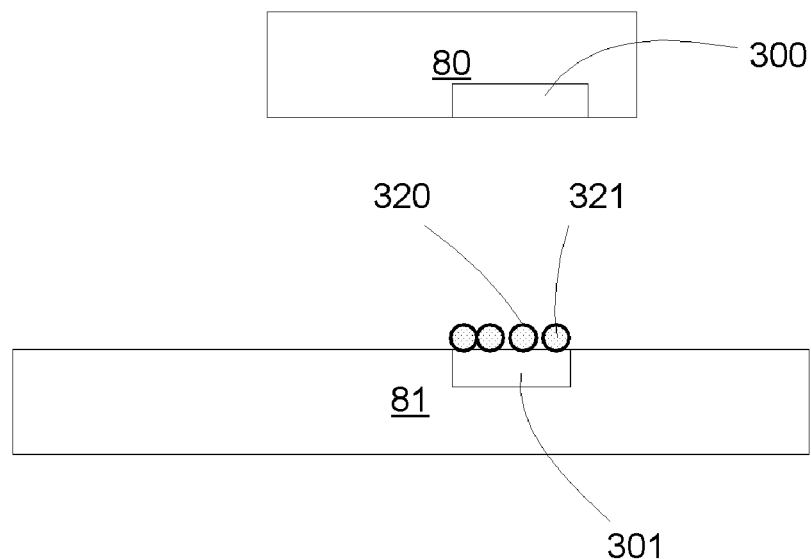
FIGS. 28A-28C illustrate an exemplary process of the present capsule contact bonding.
Figure 28B:
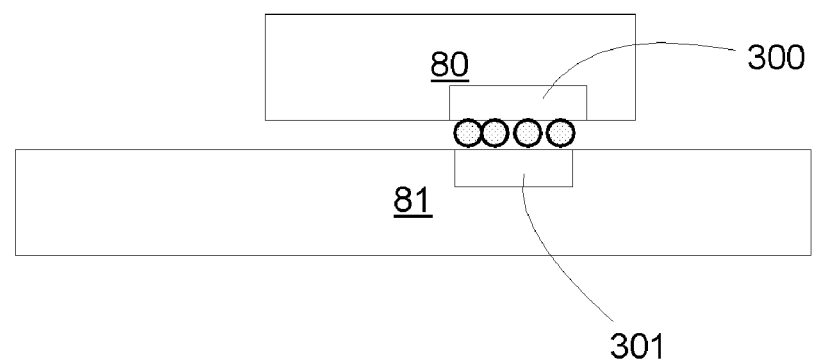
Figure 28C:
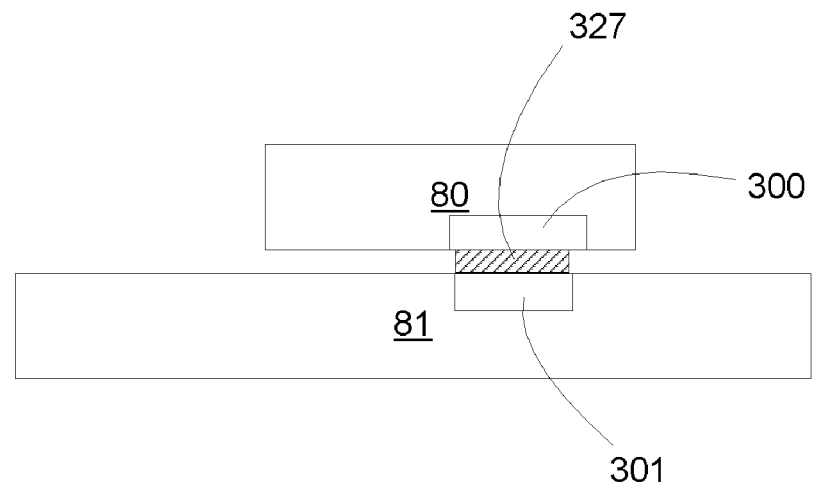

FIG. 28 illustrate an exemplary process of the present capsule contact bonding. In FIG. 28A, a top chip 80 having bond pad 300 faces down toward a bottom chip 81 which has a bond pad 301. The surface of the bond pad of chip 81 is coated with vesicles or capsules of liquid metal 321, which are covered with a polymer shell 320. The polymer preferably has an attraction to the bond pad surface. In FIG. 28B, the chips 80 and 81 are brought together to form contact between the bond pads 300 and 301. In FIG. 28C, the capsules 321 are broken, forming a bond 327 between the two bond pads 300 and 301 of chips 80 and 81.

FIG. 29 illustrates an exemplary flowchart of the present capsule contact bonding. Operation 330 prepares capsules of liquid metal, which are covered with a polymer shell having an affinity to the bond pad surface. Operation 331 coats the surface of a bond pad with the capsules of liquid metal, wherein the polymer helps in confining the capsules to the bond pad surface. The coating can be on one chip, or on both chips. Operation 332 places a complementary chip against the polymer shell surface, with the alignment of bond pads from both chips. Operation 333 squeezes the two chips together, breaking the polymer shells and allowing the liquid metal to react, forming bonds between the bond pads. An optional curing process can be performed.

This invention provides for the formation of RFID tags with stacked architectures, in which different circuit functions may be separated according to fabrication cost and electrical performance to yield tags with all of the performance appropriate to the application yet at a lower cost. While the invention has been described with reference to RFID tags, it is not limited to any electrical function; it is equally applicable to any type of circuit in which more than one die is usefully stacked on at least one other die. Particularly useful applications include wireless sensors and other types of small scale integrated systems, in which the dice are relatively small (e.g. less than a few mm), or in which is desirable to have high densities of I/O connections.

In an embodiment, the present invention discloses systems and methods for interconnecting bond pads between integrated components, comprising coating a bond pad surface of an integrated component with capsules of a liquid metal, the capsules having a polymer shell, contacting the surfaces of the two integrated components so that the bond pads of the two integrated components are aligned, and squeezing the two integrated components to break the capsules, allowing the liquid metal to make electrical contact between the two surfaces of the bond pads. In an aspect, the capsules are formed from an emulsion process, or by self-assembly of polymer chain as surfactant. Also, the polymer can have an affinity with the surface of the bond pad.

What is claimed is:

1. A method for interconnecting bond pads between integrated components, the method comprising:
    positioning a ribbon interconnect over a plurality of bond pads, the ribbon interconnect comprising a sheet of conductive material spanning across two or more adjacent bond pads of an integrated component, wherein the sheet of conductive material electrically connects the two or more adjacent bond pads;
    separating, between the two or more adjacent bond pads, the ribbon interconnect into multiple interconnect wires, at least one interconnect wire disposed on a corresponding bond pad.

2. A method as in claim 1 wherein separating the ribbon interconnect comprises laser ablating the ribbon interconnect.

3. A method as in claim 1 wherein separating the ribbon interconnect separates the ribbon interconnect into multiple individual interconnect wires, each interconnect wire disposed on a corresponding bond pad.

4. A method as in claim 1 further comprising
    forming a beveled slope of the integrated component.

5. A method as in claim 1 wherein positioning the ribbon interconnect comprises printing the ribbon interconnect.

6. A method as in claim 1 further comprising
bonding the ribbon interconnect to the corresponding bond pads.

7. A method as in claim 1 wherein bonding the ribbon interconnect to the bond pads comprises one of laser welding, ultrasonic welding, and applying a conductive adhesive.

8. A method as in claim 1 further comprising
applying a conductive adhesive line along the bond pads before positioning the ribbon interconnect.

9. A method as in claim 1 further comprising
welding the ribbon interconnect after positioning the ribbon interconnect on the bond pads.

10. A method as in claim 1 wherein a same laser is used for welding and separating.

11. A method as in claim 1 further comprising
positioning the integrated component in the vicinity of another integrated component in an at least partially stacked configuration.

12. A method as in claim 1 further comprising
positioning the integrated component in the vicinity of another integrated component an at least partially coplanar configuration.

13. A method as in claim 11 further comprising
applying a conductive adhesive line along the bond pads of the another integrated component.

14. A method as in claim 11 further comprising
welding the ribbon interconnect to the bond pads of the another component.

15. A method for interconnecting bond pads between integrated components, the method comprising:
positioning a conductive ribbon interconnect over a plurality of bond pads, wherein the ribbon interconnect is conductively connected across two or more adjacent bond pads of an integrated component;
laser welding the ribbon interconnect to the two or more adjacent bond pads; and
laser ablating the ribbon interconnect between the two or more adjacent bond pads to separate into multiple interconnect wires, at least one interconnect wire disposed on a corresponding bond pad.

16. A method as in claim 15 wherein laser welding runs continuously along the adjacent bond pads.

17. A method as in claim 15 wherein a same laser is used for welding and ablating.

18. A method as in claim 15 further comprising
pushing the ribbon interconnect onto the bond pads.

19. A method as in claim 15 wherein separating the ribbon interconnect separates the ribbon interconnect into multiple individual interconnect wires, each interconnect wire disposed on a corresponding bond pad.

20. A method as in claim 15 further comprising
forming a beveled slope of the integrated component.

21. A method as in claim 15 wherein positioning the ribbon interconnect comprises printing the ribbon interconnect.

22. A method as in claim 15 further comprising
positioning the integrated component in the vicinity of another integrated component in an at least partially stacked configuration.

23. A method as in claim 15 further comprising
positioning the integrated component in the vicinity of another integrated component in an at least partially coplanar configuration.

24. A method for interconnecting bond pads between integrated components, the method comprising:
positioning a ribbon interconnect for conductively connecting a plurality of bond pads of an integrated component;
separating the ribbon interconnect between the plurality of bond pads into multiple interconnect wires, at least one interconnect wire disposed on a corresponding bond pad.

25. A method as in claim 24 wherein separating the ribbon interconnect comprises laser ablating the ribbon interconnect.

26. A method as in claim 24 wherein separating the ribbon interconnect separates the ribbon interconnect into multiple individual interconnect wires, each interconnect wire disposed on a corresponding bond pad.

27. A method as in claim 24 further comprising
forming a beveled slope of the integrated component.

28. A method as in claim 24 wherein positioning the ribbon interconnect comprises printing the ribbon interconnect.

29. A method as in claim 24 further comprising
bonding the ribbon interconnect to the corresponding bond pads.

30. A method as in claim 24 wherein bonding the ribbon interconnect to the bond pads comprises one of laser welding, ultrasonic welding, and applying a conductive adhesive.

* * * * *